United States Patent [19]

Mimura et al.

[11] Patent Number: 5,285,078
[45] Date of Patent: Feb. 8, 1994

[54] LIGHT EMITTING ELEMENT WITH EMPLOYMENT OF POROUS SILICON AND OPTICAL DEVICE UTILIZING LIGHT EMITTING ELEMENT

[75] Inventors: Hidenori Mimura; Toshiro Futagi, both of Kawasaki; Takahiro Matsumoto, Sagamihara, all of Japan

[73] Assignee: Nippon Steel Corporation, Tokyo, Japan

[21] Appl. No.: 8,566

[22] Filed: Jan. 22, 1993

[30] Foreign Application Priority Data

| | | | |
|---|---|---|---|
| Jan. 24, 1992 | [JP] | Japan | 4-034507 |
| Mar. 27, 1992 | [JP] | Japan | 4-102045 |
| Sep. 14, 1992 | [JP] | Japan | 4-270831 |
| Sep. 14, 1992 | [JP] | Japan | 4-270832 |
| Sep. 14, 1992 | [JP] | Japan | 4-270833 |
| Sep. 14, 1992 | [JP] | Japan | 4-270834 |
| Sep. 14, 1992 | [JP] | Japan | 4-270835 |
| Sep. 14, 1992 | [JP] | Japan | 4-270836 |
| Sep. 14, 1992 | [JP] | Japan | 4-270837 |
| Oct. 16, 1992 | [JP] | Japan | 4-304838 |

[51] Int. Cl.$^5$ .......................... H01L 33/00
[52] U.S. Cl. .......................... 257/3; 257/52; 257/59; 257/96; 257/103
[58] Field of Search .......... 257/3, 2, 52, 53, 59, 257/82, 103, 94, 96

[56] References Cited

FOREIGN PATENT DOCUMENTS

62-47171  2/1987  Japan .................. 257/103

OTHER PUBLICATIONS

No Author, "Parallel Process System Realized by 3-Dimensional Shared Memory," *Electronics*, Oct. 1991, pp. 53-57.
Canham, "Silicon Quantum Wire Array Fabrication by Electrochemical and Chemical Dissolution of Wafers," *Appl. Phys. Lett.* 57(10), 3 Sep. 1990, pp. 1046-1048.
Halimaoui et al., "Electroluminescence in the Visible Range During Anodic Oxidation of Porous Silicon Films," *Appl. Phys. Lett.* 59(3), 15 Jul. 1991, pp. 304-306.
Lehmann et al., "Porous Silicon Formation: A Quantum Wire Effect," *Appl. Phys. Lett.* 58(8), 25 Feb. 1991, pp. 856-858.
Richter et al., "Current-Induced Light Emission From A Porous Silicon Device," *IEEE Electron Device Letters*, vol. 12, No. 12, Dec. '91, pp. 691-692.
Paasche et al., "Amorphous-SiC Thin-Film P-i-N Light-Emitting Diode Using Amorphous-SiN Hot-Carrier Tunneling Injection Layers," *IEEE Transactions on Electron Devices*, vol. 36, No. 12, Dec. 1989, pp. 2895-2901.
Silicon Quantum Wire Array Fabrication By Electrochemical and Chemical Dissolution Of Wafers, L. T. Canham, pp. 1046-1048, Appl. Phs. Lett. vol. 57, No. 10, Sep. 3, 1990.
Quantum Size Effects On The Optical Band Gap Of Microcrystalline Si:H, Furukawa et al., Physical Review B, vol. 38, No. 8, Sep. 15, 1988, pp. 5726-5729.
Visible Light Emission From Quantized Planar Ge Structures, Venkatasubramanian et al., Appl. Phs. Lett. 59(13), Sep. 23, 1991, pp. 1603-1605.
Photoluminescence From Si/Ge Superlattices, Montie et al., Appl. Phs. Lett. 56(4), Jan. 22, 1990, pp. 340-342.
Applied Physics Letters 57(10), 3 Sep. 1990, pp. 1046-1048, "Physics on Optical/Electronic Integrated Circuit", H. Matsueda, pp. 279-309.

*Primary Examiner*—William Mintel
*Attorney, Agent, or Firm*—Pollock, Vande Sande & Priddy

[57] ABSTRACT

A carrier injection type light emitting element with employment of a pn junction established between porous silicon and a semiconductor having a conductivity type different from that of the porous silicon, and also optical devices such as an opto-optical converting element, a light transmitting element, a photocoupling circuit element, a photocoupling element and a display apparatus, which comprise such a carrier injection type light emitting element and a semiconductor light receiving element.

38 Claims, 37 Drawing Sheets

LIGHT EMITTING ELEMENT WITH EMPLOYMENT OF POROUS SILICON AND OPTICAL DEVICE UTILIZING LIGHT EMITTING ELEMENT

BACKGROUND OF THE INVENTION

1. Field of the Invention

The present invention generally relates to a light emitting element employing porous silicon and an optical device utilizing the light emitting element. More specifically, the present invention is directed to a charge injection type light emitting element (LED) having a pn junction employing porous silicon, and also to an optical device such as an opto-optical converting element, a light transmitting element, a photocoupling circuit element, a photocoupling element and a display device, which contain, in principle, such a light emitting element.

2. Description of the Related Art

Conventionally, it is considered that since a silicon semiconductor corresponds to an indirect interband transition semiconductor, a light emitting element could not be manufactured by employing such a silicon semiconductor. As a consequence, the conventional light emitting elements with employment of the pn junction have been manufactured by the III-V group compound semiconductor, II-VI group compound semiconductor, and IV-VI group compound semiconductor. However, there are many materials to manufacture a silicon semiconductor. Silicon semiconductors having large areas can be produced at low cost, and the technique to manufacture single crystal could be established, as compared with those of the compound semiconductor. There are various merits in the silicon semiconductors that logic elements, calculation elements, drive elements, and light receiving elements and the like with high reliability can be assembled on a single substrate at a high integration degree, because of high device designing/manufacturing techniques, which could not be practically realized with the compound semiconductor. Accordingly, strong demands have been made to obtain a light emitting element with employment of silicon, especially a charge injection type light emitting element employing a pn junction, capable of being applied to a laser at a final goal. To the contrary, L. T. Canham reported in 1990 that the porous silicon fabricated by electrochemical anodizing single crystal silicon into a hydrogen fluoride solution, indicates strong photoluminescence at a room temperature (see Applied Physics Letters 57, (10), Sep. 3, 1990, pages 1046-1048). This report implies that a light emitting element may be manufactured by silicon. Thereafter, many researches have been carried out to analyze a generation mechanism of this photoluminescence. However, since no one could find such a material by which a pn junction can be formed with porous silicon at a better characteristic and a light emitting diode (LED) can be manufactured with this pn junction, a charge injection type light emitting element in a pn junction mode with this porous silicon could not be realized.

On the other hand, there are various optical devices such as an opto-optical converting element, a light transmitting element, a photocoupling circuit element, and a photocoupling element. For instance, as disclosed in a Japanese publication "Physics on Optical/Electronic Integrated Circuit" by H. Matsueda, pages 279-309, the plane type light transmitting element is known that the optical transmission unit containing the multilayer light emitting element of GaAs/AlGaAs, and also an FET functioning as a switching modulation element for modulating the light signal sent out from the optical transmission unit in response to an input electric signal are fabricated on a compound semiconductor substrate such as a GaAs substrate and an InP substrate. Also, there has been proposed in "Parallel Process System realized by 3-Dimensional Shared Memory" in Electronics, October 1981, that the light emitting element with employment of the compound semiconductor such as GaAs and the light receiving element are positioned opposite to each other on a single wafer, as the 3-dimensional photocoupling circuit element for performing the data communication among the circuit elements such as memories in the computer by utilizing the light signals.

However, even in the above-described conventional optical devices, since the expensive compound semiconductor substrate is employed, and also the light emitting element is fabricated with the compound semiconductor, the manufacturing cost becomes high and large integration becomes difficult, resulting problems. Therefore, an optical device with employment of a light emitting element made by silicon has been demanded.

Many attempts have been made in that the band structures of the silicon semiconductor are varied by utilizing the quantum effect to emit light. These silicon semiconductors capable of emitting the light have been manufactured by way of the molecular beam epitaxicy (Applied Physics Letter 56, (4), Jan. 22, 1990, pages 340-342), the plasma etching method (Applied Physics Letter 59, 1991, pages 1603-1605), and the RF sputtering method (Physical Review B 38, Sep. 15, 1988, pages 5726-5729). However, since very huge installations are required and very difficult manufacturing techniques are needed, this technique could not practically utilized.

SUMMARY OF THE INVENTION

An object of the present invention is to provide a charge injection type light emitting element having a pn junction made of silicon.

Another object of the present invention is to provide various sorts of optical devices or apparatuses such as an opto-optical converting element, a light transmission element, a photocoupling circuit element, and a photocoupling element, which employ, in principle, the above-described light emitting element.

A charge injection type light emitting element, according to the present invention, comprises a porous silicon layer having a first conductivity type, and a semiconductor layer having a second conductivity type different from the first conductivity type, and for forming a pn junction with the porous silicon layer.

In accordance with a best mode of the present invention, the semiconductor layer having the second conductivity type is an amorphous silicon carbide layer containing fine crystal.

An optical device, according to the present invention, comprises: a semiconductor substrate; a light emitting element formed on the substrate for emitting a light output in response to an input electric signal; the light emitting element containing a porous silicon layer having a first conductivity type and a semiconductor layer having a second conductivity type different from the first conductivity type, and forming a pn junction with the porous silicon layer; and a semiconductor element formed on the substrate and operationally coupled to one of the input electric signal and an optical output signal.

DESCRIPTION OF THE PREFERRED EMBODIMENTS

Figure 1A:
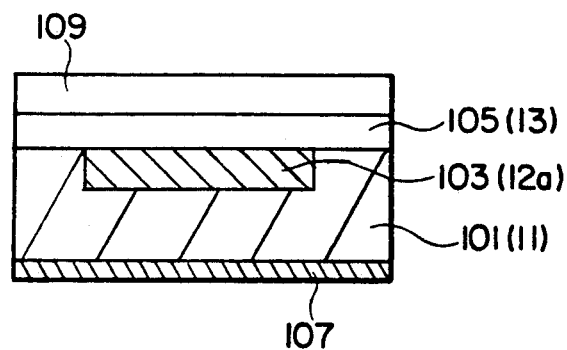
FIGS. 1A and 1B schematically represent structures of light emitting elements with employment of a p-type single crystal (monocrystal) silicon substrate and of an n-type single crystal silicon substrate, according to a first embodiment of the present invention.

Referring now to the accompanying drawings, a light emitting element according to a first preferred embodiment of the present invention will be described.

The light emitting element according to the first preferred embodiment of the present invention corresponds to a charge injection type light emitting element with employment of such a pn junction between porous silicon formed on a p-type, or n-type single crystal silicon (C-Si) substrate, and an amorphous silicon carbide layer containing fine crystal ($\mu$C-SiC) larger having a conductivity opposite to that of the above-described C-Si substrate.

To realize a charge injection type light emitting element with utilizing a pn junction, it is required to inject a hole from a p-type semiconductor into a light emitting layer and to inject an electron from an n-type semiconductor to recombine them at the light emitting layer.

The Inventors could recognize that a pn junction with a better characteristic is formed in accordance with the following manufacturing method: Porous silicon corresponding to a light emitting layer on either a p-type C-Si substrate, or an n-type C-Si substrate (plane orientation (111) and (100), and resistivity is selected from 0.05 to 50 $\Omega$cm), is processed for a time period from 30 seconds to 10 minutes by way of an electrochemical anodic oxidation method (namely, method for processing a C-Si in such a manner that the C-Si is connected to an anode and an electrode such as Pt is connected to a cathode in a water solution of ethyl alcohol and hydrogen fluoride (water solution of 48%)=0:1–10:1, and a current with density of 1 mA/cm$^2$ to 200 mA/cm$^2$ is flown therethrough). Subsequently, a $\mu$C-SiC with a wide band gap (2.0 to 2.4 eV) and high conductivity ($10^2$ to $10^1$ S/cm) functioning as a p-type semiconductor, or an n-type semiconductor, is deposited on the porous silicon.

To manufacture such a pn junction with a better characteristic, capable of emitting light like an LED (light emitting diode), not only the method of manufacturing the porous silicon (resistivity of substrate, method of electrochemical anodization and so on), but also the deposition condition of the amouphous silicon carbon film containing fine crystal must be optimized in order not to give any damages especially to the interface characteristic of the porous silicon and $\mu$C-SiC film.

With respect to these subjects, the inventors have researched extensively. As a result of this research, it was found that a porous silicon layer capable of manufacturing an LED can be formed. That is, if a p-type C-Si substrate is employed, a p-type C-Si having plane orientation of (111) and (100), or resistivity of 0.1 to 40 $\Omega$ cm is utilized. Then, porous silicon is manufactured by setting this p-type C-Si into a water solution (aqueous solution) constructed of ethyl alcohol and hydrogen fluoride (water solution of 48%)=0.1:1 to 5:1 under current density of 5 to 50 mA/cm$^2$ for electrochemical anodization time from 1 to 5 minutes. Furthermore, the resultant porous silicon is dipped into a KOH solution for several seconds or subjected to photochemical etching to remove an impurity layer on a surface of this porous silicon, so that the hole can be injected from the p-type single crystal silicon substrate into the porous silicon layer. Also, the Applicants could fine out a deposition condition of $\mu$C-SiC by forming it by way of the electron cyclotron resonance plasma CVD (ECR PCVD) method under such conditions that gass pressure is selected to be 0.001 to 0.008 Torr, a temperature of the substrate is selected to be 150°–350° C., supplied power is 200 to 350 W, and SiH$_4$:CH$_4$:PH$_3$:H$_2$=1-:1–3:0.005–0.03:100–200. This deposition conditions of the $\mu$-SiC film can be recognized in such a manner that electrons can be injected effectively from the n-type $\mu$C-SiC into the porous silicon. As a result, a charge injection type light emitting element with employment of a pn junction can be obtained.

Furthermore, the inventors found in case of an n-type C-Si substrate, a forming condition of a porous silicon layer capable of injecting an electron effectively from an n-type C-Si substrate into a porous silicon layer, is identical to the forming condition with employment of a p-type C-Si substrate except that light must be irradiated to this porous silicon layer during a formation of porous silicon. Also, the inventors found that a deposition condition of a p-type $\mu$C-SiC film, capable of injecting a hole effectively from a p-type $\mu$C-SiC into porous silicon, is the same as the deposition condition of the n-type $\mu$C-SiC film if B$_2$H$_6$ is employed as an impurity gas instead of PH$_3$.

It should be understood that there are many uncertain reasons why an LED cannot be manufactured under such a condition outside the above-described LED forming condition. Nevertheless, the presently definite reasons will now be described. With respect to the resistivity, this is because when the resistivity exceeds 40 Ω cm, the resistance value of the substrate becomes high, and thus the electrons are not injected from the substrate into the porous silicon. With respect to the ratio of ethyl alcohol to hydrogen fluoride, since bubbles are produced during the electrochemical anodization if the ratio of ethyl alcohol to hydrogen fluoride becomes lower than 0.1:1, the porous silicon cannot be formed uniformly. As to the current density, when the current density exceeds 50 mA/cm$^2$, silicon starts to be gradually polished by an electric field. With respect to the gas pressure of the ECR PCVD method, damage is given to the porous silicon due to the etching effect at gas pressure below 0.001 Torr. If the gas pressure exceeds 0.005 Torr, plasma become unstable and the μC-SiC cannot be manufactured. As to the substrate temperature, the μC-SiC cannot be manufactured at the substrate temperature below 150° C., whereas the surface conditions of the porous silicon are changed at the substrate temperature higher than 350° C., so that no light emission is performed.

It should be noted that even if either p-type or n-type amorphous silicon carbide (a-SiC) is employed as the p-type or n-type μC-SiC, a light emitting element can be in principle realized. However, since both of the band gap and the conductivity of the p-type or n-type a-SiC represent lower values, for example, the conductivity of $10^{-5}$ at the band gap of 2.0 eV, as compared with the μC-SiC film, luminescence intensity of the light emitting element is lowered. In addition, even when p-type or n-type amorphous silicon containing fine crystal (μC-Si) is employed, a light emitting element can be in principle manufactured. However, since the conductivity of the μC-Si and that of a-Si are low at a band gap about 2.0 eV, as compared with the conductivity of the μC-SiC luminescence intensity of the light emitting element is lowered.

A description will now be made of a light emitting element according to the first preferred embodiment of the present invention, taking account of the above-described consideration.

Figure 2A:
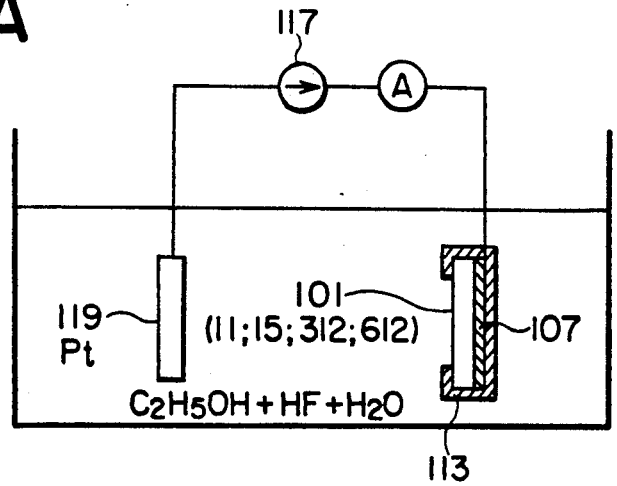
FIGS. 2A to 2C are explanatory diagrams of methods of electrochemical anodization.
Figure 2B:
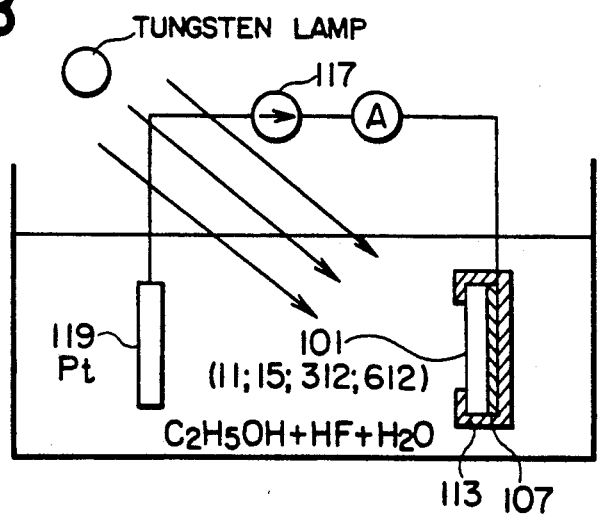
Figure 2C:
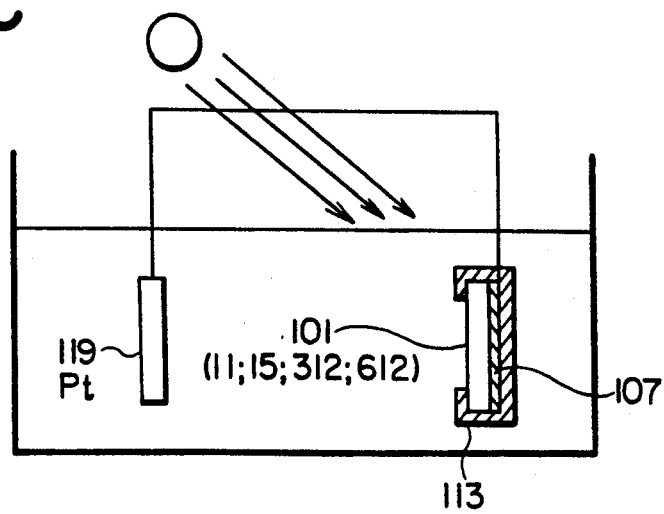

A first example is to employ a p-type C-Si substrate. FIG. 1A schematically shows a light emitting element, according to the first preferred embodiment of the present invention, with employment of the p-type silicon substrate. Either Au (gold) or Al (aluminum) is vapor-deposited on a rear plane of a p-type C-Si substrate 101 (plane orientation of (100) and resistivity of 3 to 5 Ωcm) to establish an ohmic contact. Thereafter, as shown in FIG. 2A, the resultant p-type C-Si is masked by wax 113 except for a portion which is desired to be made porous, and then dipped into a solution of ethyl alcohol and hydrogen fluoride (water solution of 48%), the ratio of which is selected to be 1:1. A constant current source 117 is employed, a platinum electrode 119 is connected to a cathode thereof, and an electrode 107 of a single crystal substrate 101 is connected to an anode thereof. Under such a circumstance, a current density is fixed to 30 mA/cm$^2$ and an anode formation is carried out for approximately 3 minutes. Subsequently, the resultant p-type single crystal substrate is dipped in the KOH solution for 3 seconds to etch out an impurity layer formed on the surface of the porous silicon. This etching may be substituted by a phochemical etching in which a light is projected to the silicon substrate under a condition that the constant current source 117 is removed and the platinum electrode 119 and the electrode 107 is short-circuited as shown in FIG. 2C. Next, the wax coated on the surface is removed by using an organic solvent and cleaned by pure water. Subsequently, the resultant p-type C-Si substrate is conducted into an electronic cyclotron resonance plasma CVD apparatus and an amorphous silicon carbon film having a thickness of 150Å and containing n-type fine crystal is deposited. A deposition condition is as follows: A gas pressure is selected to be 0.005 Torr, supplied power is selected to be 300 W, SiH$_4$:CH$_4$:PH$_3$:H$_2$ = 1:2:0.01:200, and a substrate temperature is selected to be 300° C. Then, an indium tin oxide (ITO) corresponding to a transparent electrode is deposit with a thickness of 600 Å.

Figure 3:
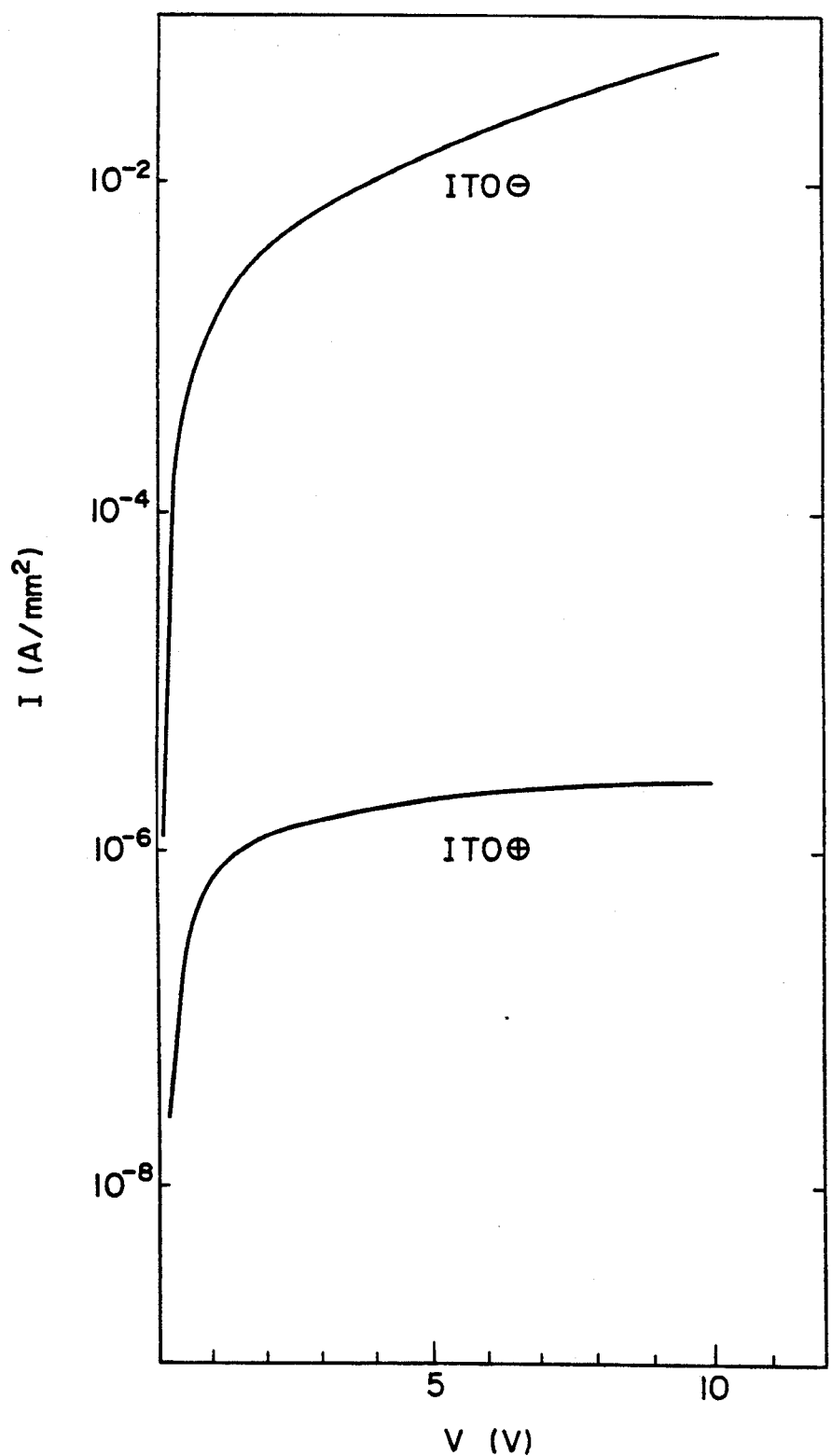
FIG. 3 is a graphic representation of a voltage-to-current characteristic of the light emitting element with employment of the p-type single crystal silicon substrate shown in FIG. 1.

In FIG. 3, there is represented a voltage-to-current characteristic of the light emitting element which has been manufactured in accordance with the above-described manufacturing process. It can be seen from this characteristic that a better rectification characteristic can be accomplished. A forward direction is defined when a negative voltage is applied to the ITO electrode side and a reverse direction is defined when a positive voltage is applied to this ITO electrode side. As a consequence, a pn junction with a better characteristic is formed among the p-type C-Si substrate, the porous silicon and the n-type μC-SiC. It can be seen that the holes are injected effectively from the p-type C-Si into the porous silicon, and also the electrons are injected effectively from the n-type μC-SiC into the porous silicon.

Figure 5A:
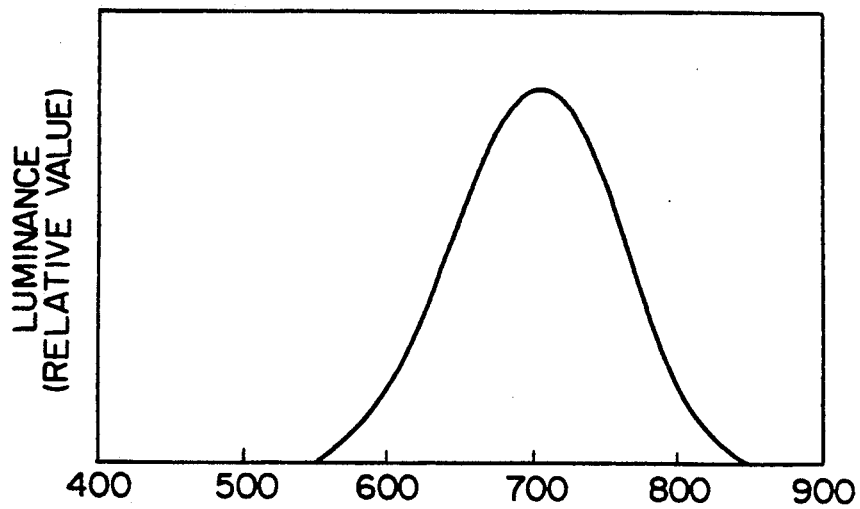
FIG. 5A is a graphic representation of an emission spectrum of the light emitting element with employment of the p-type single crystal silicon substrate, shown in FIG. 1, when a negative voltage of 10 V is applied to an ITO electrode thereof.

FIG. 5A represents an electroluminescence spectrum in case that a negative voltage of 10 V is applied to the ITO electrode side. The spectrum is approximately from 600 to 800 nm.

Figure 1B:
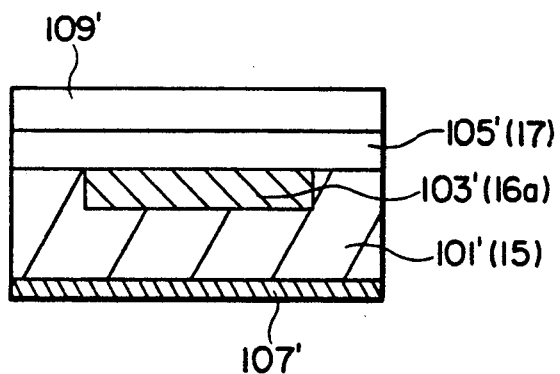

Then, another example is to employ an n-type C-Si substrate. FIG. 1B schematically shows a light emitting element, according to the first preferred embodiment of the present invention, employing the n-type C-Si substrate. Either Au (gold) 107' or Al (aluminum) is vapor-deposited on a rear plane of an n-type C-Si substrate 101' (plane orientation of (100) and resistivity of 3 to 5 Ωcm) to establish an ohmic contact. Thereafter, as shown in FIG. 2B, the resultant n-type C-Si is masked by wax 113 except for a portion which is desired to be made porous, and then dipped into a solution of ethyl alcohol and hydrogen fluoride (water solution of 48%), the ratio of which is selected to be 1:1. A constant current source 117 is employed, a platinum electrode is connected to a cathode thereof, and an electrode 117' of an n-type C-Si 101' is connected to an anode thereof. Under such a circumstance, a current density is fixed to 30 mA/cm$^2$ and electrochemical anodization is carried out for approximately 3 minutes. In this case, as shown in FIG. 2B, tungsten lamp light is irradiated to a plane where porous silicon will be fabricated by electrochemical anodization. Subsequently, the resultant n-type C-Si substrate is dipped in the KOH solution for 3 seconds to etch out an impurity layer formed on the surface of the porous silicon. This etching may be substituted by the photochemical etching as mentioned before with reference to FIG. 2C. Next, the wax coated on the surface is removed by using an organic solvent and cleaned by pure water. Subsequently, the resultant n-type C-Si substrate is transferred into an ECR PCVD apparatus and a p-type μC-SiC is deposited with a thickness of 150 Å. A deposition condition is as follows: A gas pressure is selected to be 0.05 Torr, supplied power is selected to be 300 W, $SiH_4:CH_4:B_2H_6:H_2=1:1-3:0.005-0.03;100-200$, and a substrate temperature is selected to be 300° C. Then, an ITO electrode having a thickness of 600 Å is deposited by utilizing an electron beam vapor deposition apparatus.

Figure 4:
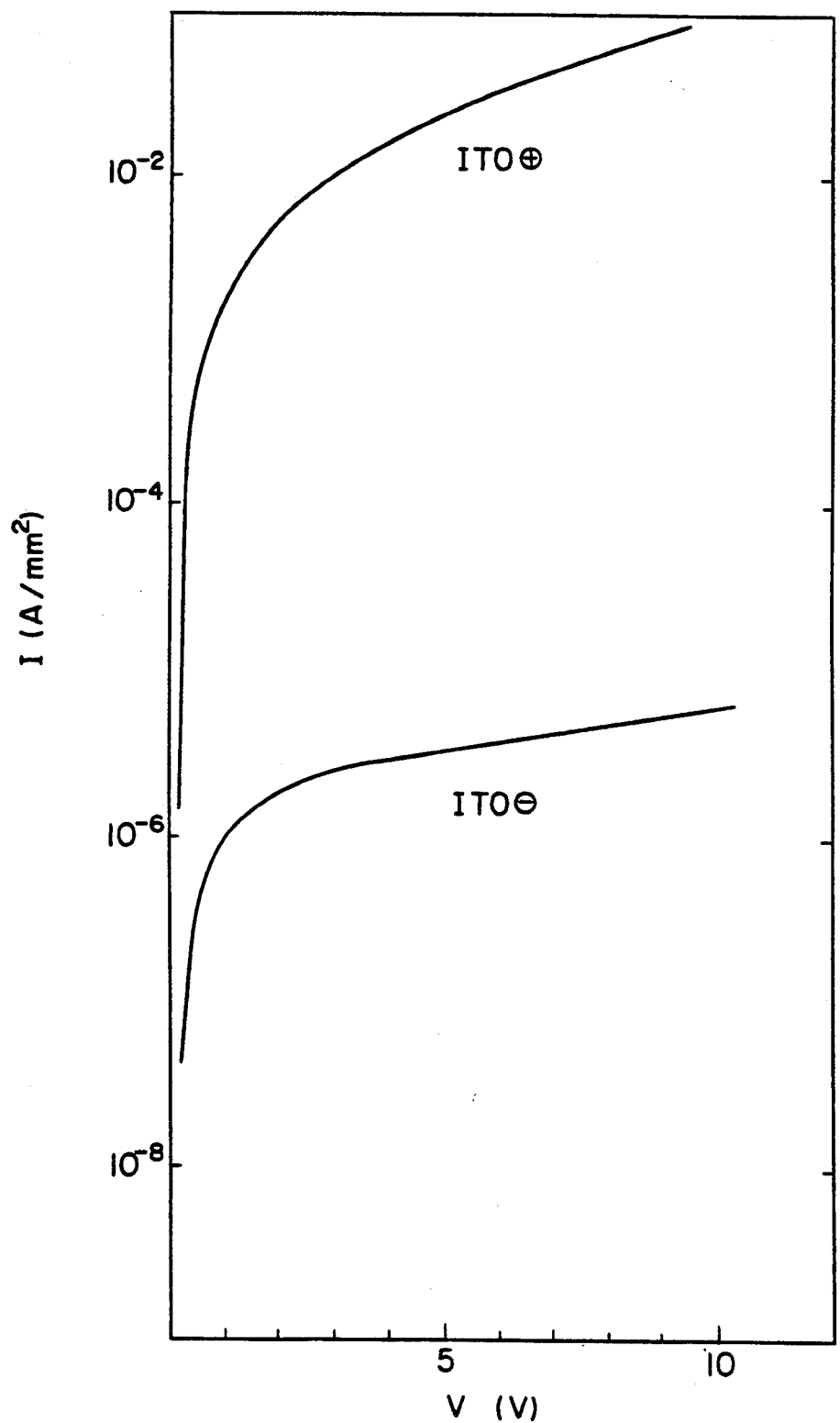
FIG. 4 is a graphic representation of a voltage-to-current characteristic of the light emitting element with employment of the n-type single crystal silicon substrate shown in FIG. 1.

In FIG. 4, there is represented a voltage-to-current characteristic of the light emitting element which has been manufactured in accordance with the above-described manufacturing process. It can be seen from this characteristic that a better rectification characteristic can be accomplished. A forward direction is defined when a positive voltage is applied to the ITO electrode side and a reverse direction is defined when a negative voltage is applied to the ITO electrode side. As a consequence, pn junction with a better characteristic is formed among the n-type C-Si substrate, the porous silicon and the p-type $\mu$C-SiC. It can be seen that the electrons are injected effectively from the n-type C-Si into the porous silicon, and also the holes are injected effectively from the p-type $\mu$C-SiC.

Figure 5B:
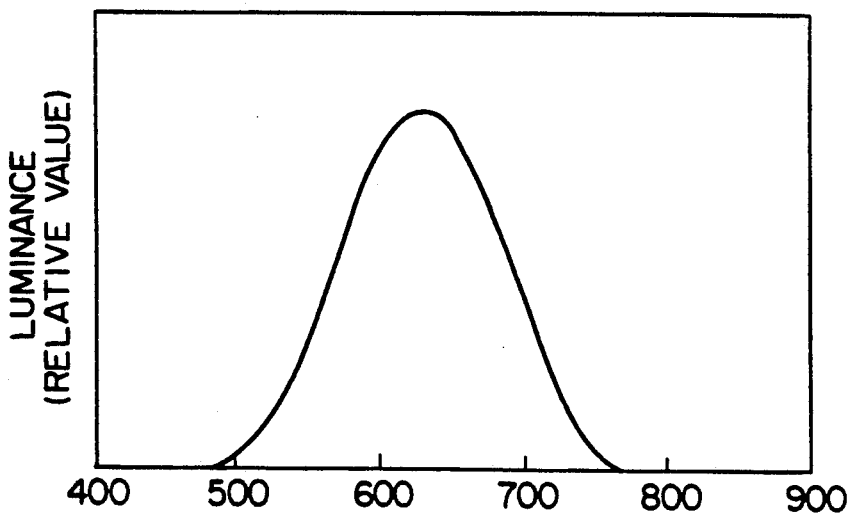
FIG. 5B is a graphic representation of an emission spectrum of the light emitting element with employment of the n-type single crystal silicon substrate, indicated in FIG. 1, when a positive voltage of 10 V is applied to an ITO electrode thereof.

FIG. 5B represents an electroluminescence spectrum in case that a positive voltage of 10 V is applied to the ITO electrode side. The spectrum is approximately from 500 to 750 nm.

As previously described, it can be realized such a pn-junction type charge injection mode light emitting element with employment of porous silicon, which could not be realized by the conventional manufacturing method. LED (light emitting diode) according to the first preferred embodiment can be manufactured by the low-temperature process below than 300° C. As a result, there are many merits, if the LED of this preferred embodiment would be manufactured with covering the element portions by a wax or the like after logic elements, calculating elements, driving elements, light receiving elements and the like have been manufactured, because the logic, calculating, driving, and light receiving elements can be assembled into the light emitting element in a monolithic state without destroying the logic, calculating, driving and light receiving elements.

A method for increasing a light emitting efficiency of the porous silicon which has been formed by way of the above-explained electrochemical anodization will be discussed next. This may be accomplished by performing light annealing, in which the light with energy greater than a band gap is irradiated onto the above-described porous silicon, otherwise by executing thermal annealing with a heating process.

Figure 6:
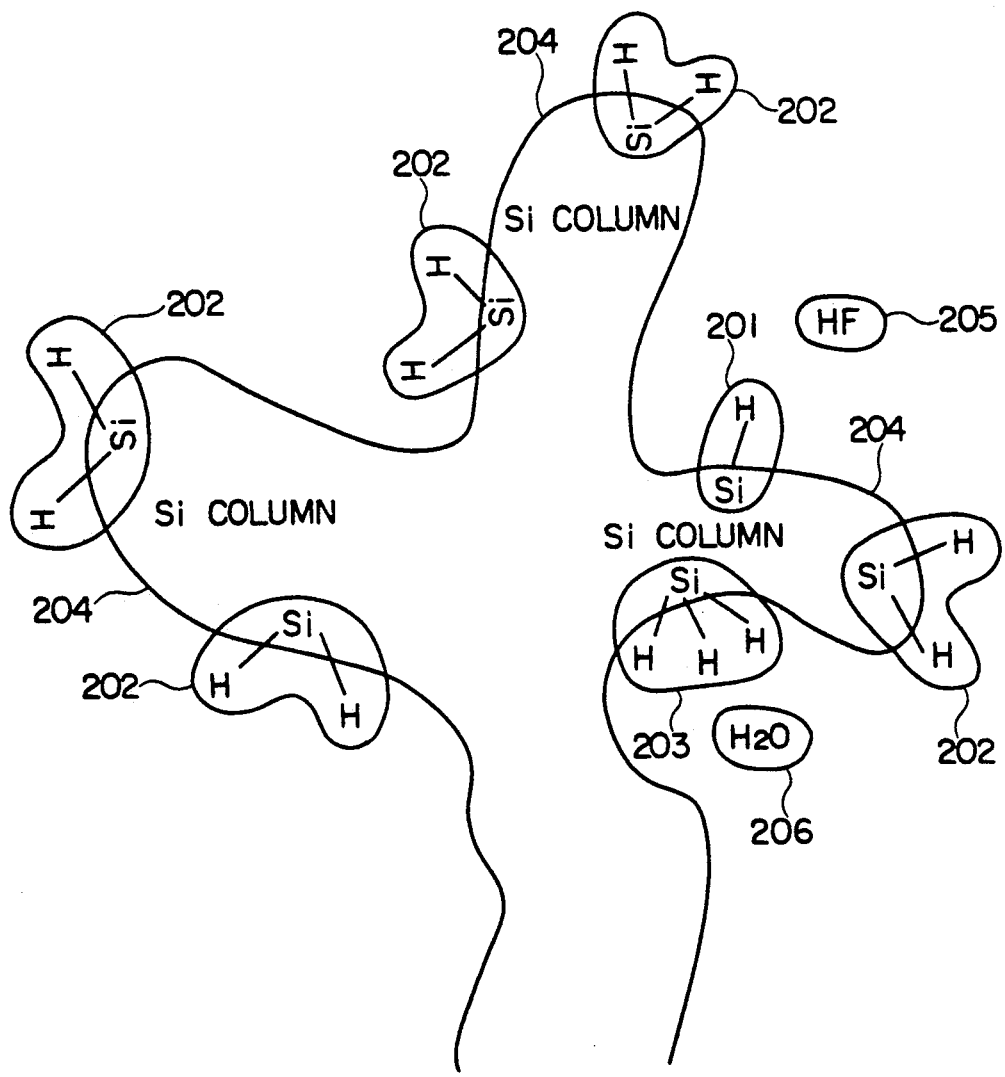
FIG. 6 schematically illustrates a tree type column structure of porous silicon.

Porous silicon owns a tree type column structure, as shown in FIG. 6, the diameter of which is from 1 nm to 10 nm. A surface of this tree type column structure is terminated by hydrogen. Si terminated by this hydrogen owns any one of structures defined by $SiH$ 201, $SiH_2$ 202 and $SiH_3$ 203. A stable structure is $SiH_2$ 202. $SiH_2$ 203 of this surface surrounds an outer side of Si column 204, and forms a higher potential wall than that of the inside Si column 204. Electrons and holes produced inside the Si column 204 are strongly confined by this high potential wall, and therefore can be recombined with each other at a high efficiency.

Figure 7:
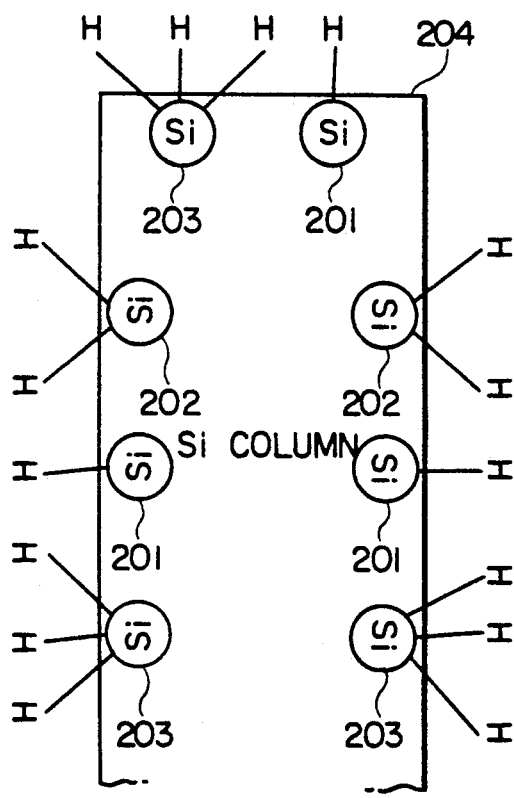
FIG. 7 schematically shows such a condition that $SiH$, $SiH_2$ and $SiH_3$ are attached to the silicon column.

To the contrary, actually, $SiH_2$ 202 components are not formed on the surfaces of the Si columns 204 in a uniform state As illustrated in FIG. 7, the components of $SiH$ 201 and $SH_3$ 203 are similarly terminated at their surfaces. These substance may disturb uniformity of the potential wall and may weaken the confinement of the electrons and the holes. (Practically, these electrons and holes are not confined, but penetrate through these substances, namely escape). As a consequence, the quantum efficiency of photoluminescence of the conventional porous silicon manufactured by the conventional method is on the order of 10%.

Accordingly, if these components of $SiH$ 201 and $SiH_3$ 203 would be changed into the component of $SiH_2$ 202 by utilizing a certain method, the potential wall could be formed in a uniform state, so that the electrons and holes could be strongly confined within the column 204. Therefore, it represents a very high quantum efficiency.

This state change may be achieved by applying either light or heat annealing to porous silicon.

Figure 8:
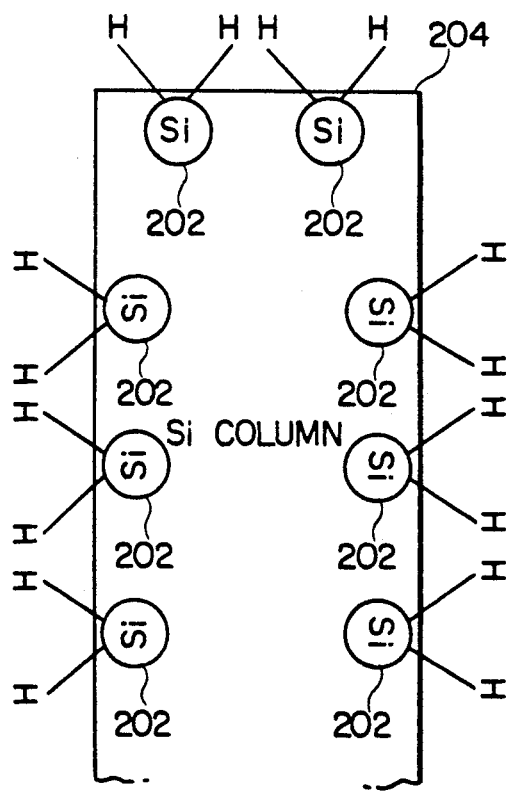
FIG. 8 schematically indicates such a condition that $SiH_2$ is uniformly attached to the silicon column of porous silicon, which has been processed by either a photo annealing process, or a thermal annealing process.

In other words, the structures of hydrogen terminated at their surfaces are rearranged by applying either light energy, or heat energy to porous silicon to increase the surface energy of this porous silicon and $SiH_2$ 202 can be formed on the surfaces in a uniform state as shown in FIG. 8. This $SiH_2$ 202 may form a surface potential wall, the energy level of which is very uniform. As a result, electrons and holes are strongly confined within the potential, and the probability of radiation recombination is increased.

On the other hand, there are many components of HF 205 and $H_2O$ 206 corresponding to residual components during the manufacturing stages within the porous portion of this porous silicon. This HF 205 solves silicon oxide which has been produced by attachments of holes generated by the light radiation annealing process. That is to say, the holes produced by the light radiation annealing process are transported near the surfaces to oxidize Si-atom of the surfaces, and since HF 205 remaining within the porous silicon may solve the silicon oxide, the diameter of the Si column 204 becomes narrower than that of the original Si column 204. As described above, since the diameter of this Si column 204 is made narrow, the ratio of recombination between the electrons and the holes, which are confined within this Si column 204 becomes large, resulting in an increase of the quantum efficiency.

It should be noted that the $H_2O$ 206 components remaining inside the porous silicon may cause a great problem when a charge injection type light emitting element is fabricated. However, when the annealing process is carried out by way of either light excitation, or thermal excitation, those residual products are vaporized, so that an inside of porous silicon can be kept very clean.

A concrete process will now be described. First, an electrochemical anodization process is executed by way of the methods, as previously explained with reference to FIGS. 2A and 2B, to manufacture a porous silicon layer. This porous silicon has such a structure as shown in FIG. 6.

If light having energy higher than the band gap of such a porous silicon is irradiated to this porous silicon with this structure, hydrogen terminated at the surfaces of the Si column 204 is rearrangement due to the light annealing effect, and then $SiH_2$ 202 may cover the entire surface of the Si column 204.

As described above, the potential wall formed by uniform $SiH_2$ 202 bonds is fabricated on the surface by performing the light annealing process, both of the electrons and holes are strongly confined within the Si column 204, as represented in FIG. 8, so that the probability of radiation recombination becomes very high. As the light source having the energy higher than the band gap of the porous silicon, there are an Ar+laser, an excimer laser, a tungsten lamp light source, and a halogen lamp light source, which emit ultraviolet light for example, taking account of such a fact that the band gap of porous silicon is on the order of 2.0 to 2.5 eV.

Since the effect of the light annealing process may be expressed as a product by light irradiation intensity and light irradiation time, the light irradiation is continued in such a manner that the porous silicon is not destroyed, as detecting the photoluminescence intensity of porous silicon with a photodetector.

At this time, the etching of silicon oxide by the residual HF 205 and the evaporation of the residual $H_2O$ 206 occur at the same time. These effects may increase the quantum efficiency of the photoluminescence of the porous silicon as represented in the above-described operations.

Figure 9:
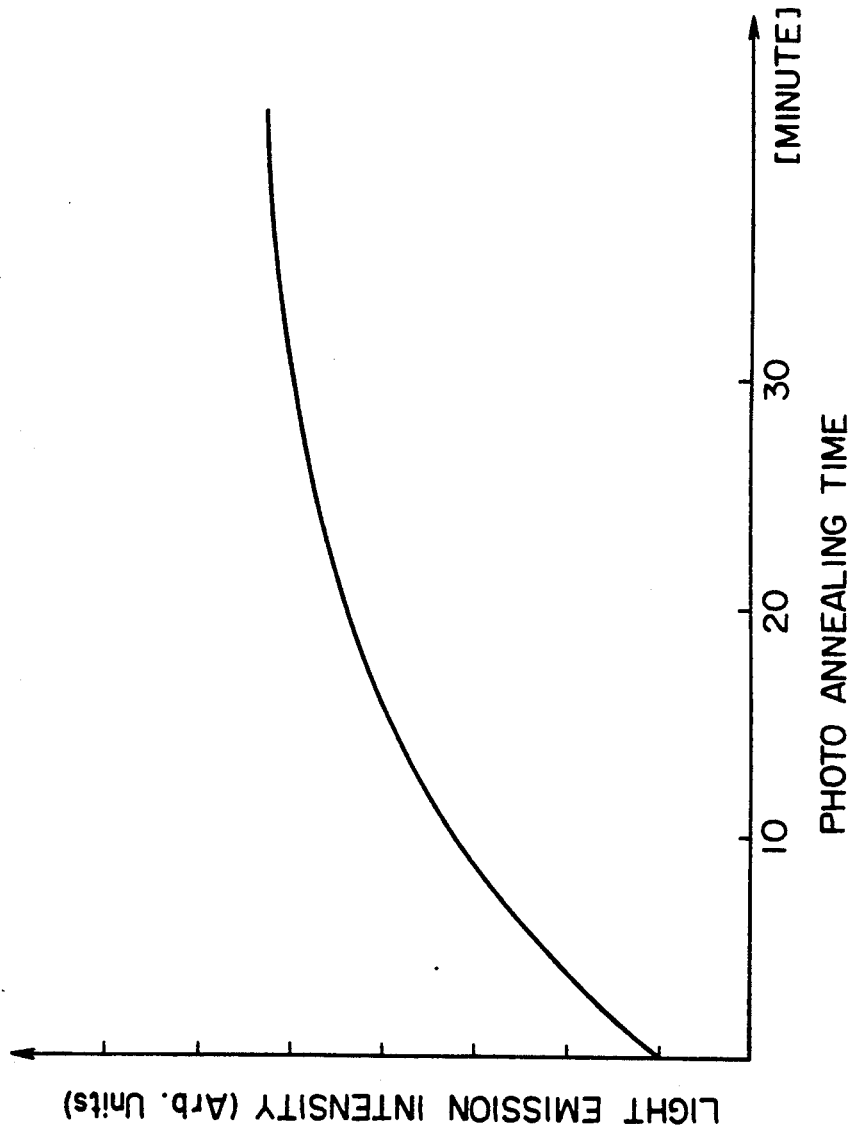
FIG. 9 is a graphic representation of a relationship between the photo annealing process time and the emission efficiency of the porous silicon.

FIG. 9 represents such a condition that the quantum efficiency of the photoluminescence of porous silicon is increased in accordance with time lapse by the light annealing process with employment of the Ar+ laser. As apparent from this drawing, it is possible to increase the quantum efficiency 5 times by performing the annealing process which the Ar+ laser for approximately 30 minutes.

On the other hand, in case of a thermal annealing process, the thermal annealing process must be carried out at temperatures between 50° C. and 400° C. in order that the bond of $SiH_2$ 202 are formed over the entire surface. Although the annealing process may be performed even in vacuum and atmosphere, a care should be taken to oxidization of a sample when the annealing process is carried out in atmosphere.

Thermal annealing time may be optimized by performing such a manner that photoluminescence, intensity of the porous silicon is monitored, and then the thermal annealing process is performed until an increase of the photoluminescence intensity is saturated.

Figure 10:
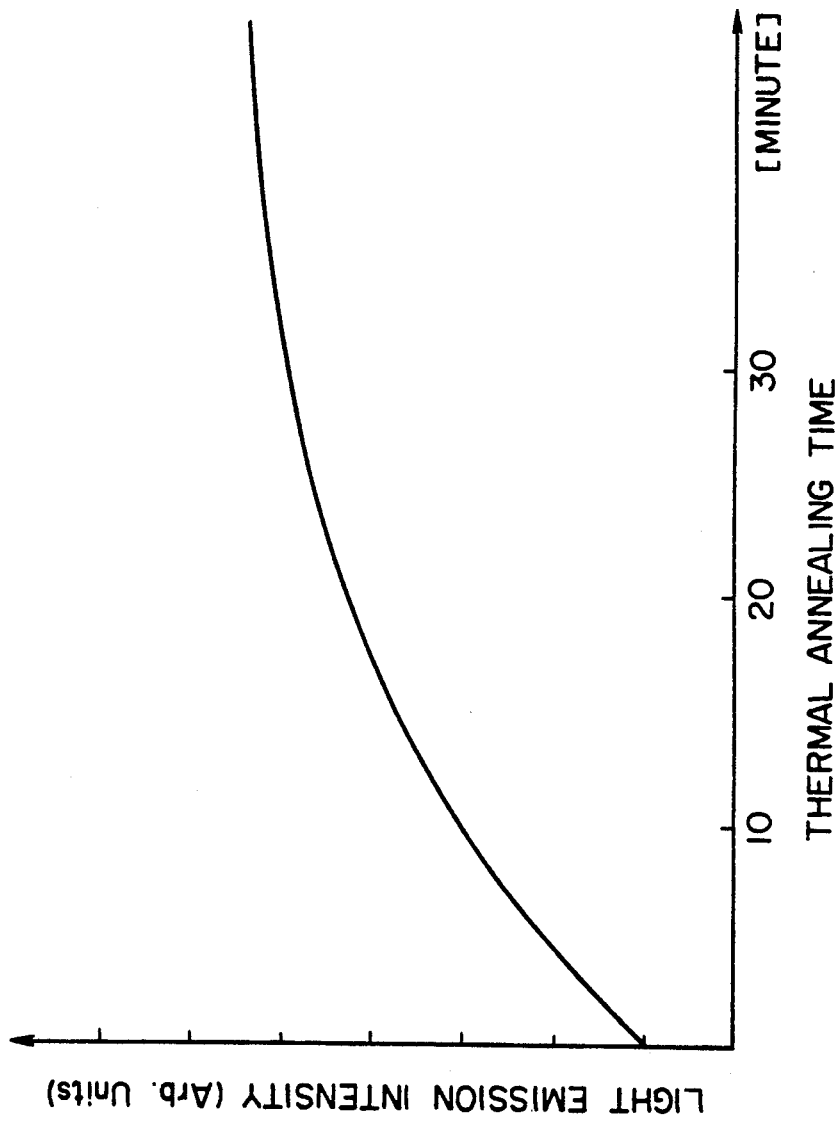
FIG. 10 is a graphic representation of a relationship between the thermal annealing process time and the emission efficiency of the porous silicon.

FIG. 10 represent such a condition that a quantum efficiency of the photoluminescence of porous silicon is increased in the atmosphere by performing a thermal annealing process. At this time, it is possible to increase the quantum efficiency 5 times by carrying out the thermal annealing process at the temperature of 250° C. and for about 30 minutes.

Since the quantum efficiency of the porous silicon can be greatly increased by way of the above-explained process, a III-V group semiconductor and a II-VI group semiconductor employed in a light emitting element in the latest opto-electronics field may be substituted by the above-described porous silicon. This porous silicon may be widely applied to, for instance, opto-communication, self-emission display, and opto-integrated circuit. As a consequence, there are great possibilities to advance the latest opto-electronics technology inherently having such problems as stability, reliability and high integration.

Then, a light emitting element with employment of a porous silicon layer, according to a second preferred embodiment of the present invention, will now be described.

The light emitting element according to the second preferred embodiment has such a structure that the porous silicon layer is sandwiched by a p-type semiconductor and an n-type semiconductor, the band gaps of which are high than, or equal to 2.2 eV.

The inventors could find out that a pn junction with a better characteristic is obtained by performing the following manufacturing steps: p-type or n-type $\mu$C-SiC with a wide band gap (2.2 eV to 2.4 eV) and high conductivity ($10^{-2}$ to $10^1$ S/cm), which functions as a semiconductor is deposited on either a p-type C-Si substrate, or an n-type C-Si substrate (resistivity 0.5 to 100 $\Omega$cm). Thereafter, this C-Si is etched away until the thickness of the C-Si becomes 5 to 10 $\mu$m. Then, the entire portion of this C-Si is converted to porous silicon, by way of the electrochemical anodization. In the electrochemical anodization, the C-Si is connected to an anode, an electrode of Pt or the like is connected to a cathode, a current of 1 mA/$cm^2$ to 200 mA/$cm^2$ is supplied to flow from the anode to cathode in a water solution of 0:1 to 10:1=ethyl alcohol:hydrogen fluoride (water solution of 48%). Subsequently, a $\mu$C-SiC film functioning as an n-type semiconductor, or a p-type semiconductor having a wide band gap (2.2 eV to 2.4 eV) and high conductivity ($10^{-2}$ to $10^1$ S/cm), is deposited on the porous silicon layer.

To manufacture such a pn junction with a better characteristic, capable of emitting light, not only the method for manufacturing the porous silicon (resistivity of substrate, method of electrochemical anodization, and other items) must be optimized, but also the deposition condition of the $\mu$C-SiC must be optimized in order not to give any damages especially to the interface characteristics of the porous silicon and the $\mu$C-SiC layers.

With respect to these subjects, the inventors have researched extensively. As a result of this research, we could fine out such a fact that a pn junction from which the following LED (light emitting diode) can be formed can be obtained. That is to say, when a p-type C-Si substrate (resistivity of 0.5 to 100 $\Omega$m) is employed, p-type $\mu$C-SiC deposited on the substrate. Next, this C-Si is etched away until the thickness of the C-Si becomes 5-10 $\mu$m. All of this C-Si portion is processed to obtain a porous silicon layer in a water solution of ethyl alcohol and hydrogen fluoride (water solution of 48%), the ratio of which is selected to be 0.1:1 to 5:1, under current density of 5 to 50 mA/$cm^2$. Furthermore, the resultant porous silicon layer is processed by way of the photo-chemical etching process, or dipped for several seconds to several minutes in a KOH solution, so that an impurity layer deposited on a surface of the porous silicon layer is removed. Subsequently, amorphous silicon carbon containing n-type fine crystal is deposited, thereby forming the above-described pn junction in which holes can be injected effectively from the p-type $\mu$C-SiC to the porous silicon layer, and also electrons can be injected effectively from the n-type $\mu$C-SiC to the porous silicon.

Also, the inventors could find out such a deposition condition of a $\mu$C-SiC by forming it by way of the ECR PCVD method under such conditions that gas pressure is selected to be 0.001 to 0.008 Torr, a temperature of the substrate is selected to be 150° C. to 350° C., supplied power is 200 to 350 W, and $SiH_4:CH_4:PH_3:H_2=1:1$ to 3:0.005 to 0.03:100 to 200. This deposition condition of the $\mu$C-SiC film can be recognized in such a manner that electrons can be injected effectively from the n-type $\mu$C-SiC film into the porous silicon. Furthermore, the inventors could find out the following deposition condition of a p-type $\mu$C-SiC film by manufacturing such a p-type $\mu$C-SiC film under conditions in the ECR PCVD method that gas pressure is selected to be 0.001 to 0.008 Torr, a substrate temperature is selected to be 150° to 350° C., supplied power is selected to be 200 to 350 W, and ratios of $SiH_4:CH_4:B_2H_6:H_2 = 1:1$ to $3:0.005$ to $0.03:100$ to $200$. As a result, holes can be injected effectively from the p-type μC-SiC film into the porous silicon layer. Accordingly, a charge injection type light emitting element with employment of the pn junction can be realized.

Furthermore, the inventors could find out that in case of an n-type C-Si crystal silicon substrate, a forming condition of a porous silicon layer capable of injecting an electron effectively from an n-type C-Si substrate into a porous silicon layer, is identical to the forming condition with employment of a p-type C-Si substrate except that light must be irradiated to this porous silicon layer during a formation of porous silicon.

It should be understood that there are many uncertain reasons why a light emitting element cannot be manufactured under such a condition outside the above-described light emitting element forming condition. Nevertheless, the presently definite reasons will now be described. With respect to the ratio of ethyl alcohol to hydrogen fluoride, since bubbles are produced during the electrochemical anodization if the ratio of ethyl alcohol to hydrogen fluoride becomes lower than $0.1 = 1$, the porous silicon cannot be formed uniformly. As to the current density, when the current density exceeds 50 mA/cm$^2$, silicon starts to be gradually polished by an electric field. With respect to the gas pressure of the ECR PCVD method, damage is given to the porous silicon located under layer due to the etching effect at gas pressure below 0.008 Torr. If the gas pressure exceeds 0.005 Torr, plasma becomes unstable and the μC-SiC cannot be manufactured. As to the substrate temperature, the amorphous silicon carbon containing the fine crystal cannot be manufactured at the substrate temperature below 150° C., whereas the surface conditions of the porous silicon are changed at the substrate temperature higher than 350° C., so that no light emission is performed.

It should be noted that even if either p-type or n-type a-SiC is employed instead of the p-type or n-type μC-SiC, a light emitting element can be in principle realized. However, since both of the band gap and the conductivity of the p-type or n-type a-SiC represent lower values, for example, the conduitivity of $10^{-5}$ at the band gap of 2.0 eV, as compared with the μC-SiC film, luminescence intensity of the light emitting element is lowered. In addition, even when p-type or n-type μC-Si is employed, or p-type or n-type a-Si is employed, a light emitting element can be in principle manufactured. However, since the conductivity of the μC-Si and that of the a-Si are low at band gaps about 2.0 eV as compared with the conductivity of the a-SiC, luminescence intensity of the light emitting element is lowered.

Referring now to the accompanying drawings, the light emitting element according to the second preferred embodiment of the present invention will be described more in detail.

Figure 11:
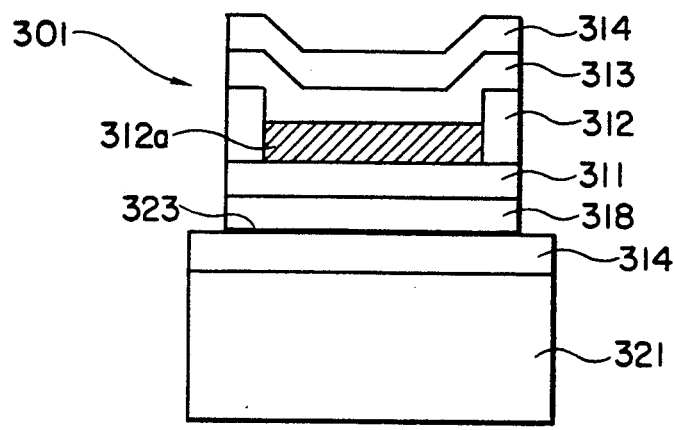
FIG. 11 schematically shows a structure of a light emitting element with employment of a p-type silicon substrate mounted on a glass substrate, according to a second embodiment of the present invention.

FIG. 11 schematically shows a structure of a light emitting element, according to this preferred embodiment, mounted on a glass substrate. The light emitting element 301 shown in FIG. 11 is fabricated by p-type μC-SiC 311, a porous silicon layer 312a, an n-type μC-SiC layer 313, and an indium tin oxide (ITO) 314 corresponding to a transparent electrode. Also, a metal 318 is formed on a bottom plane of μC-SC 311. The light emitting element 301 is adhered on a glass substrate 321, on which ITO 314 has been formed, by employing a conductive adversive agent 323, for instance, silver paste.

Figure 12A:
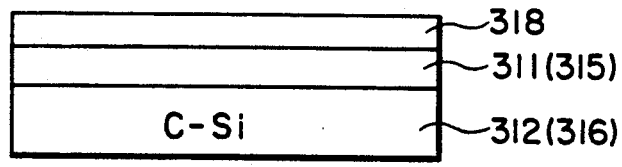
FIGS. 12A to 12C indicate structures of the light emitting element of FIG. 11 in the respective manufacturing steps.
Figure 12B:
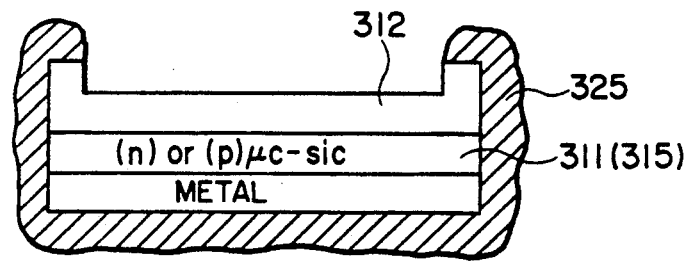

Then, a description will now be made of a method for manufacturing the light emitting element 301 shown in FIG. 11. As represented in FIG. 12A, a p-type μC-SiC 311 is deposited on an upper surface of the p-type C-Si substrate 312, both surfaces of which have been mirror-polished, by way of the ECR PCVD method. A deposition condition is given as follows: Microwave power is selected from 200 W to 300 W; a substrate temperature is selected to be 150° to 300° C.; pressure is selected from 2.5 to 8 m Torr; and a gas ratio of $Si:CH_4:B_2H_6:H_2 = 1:1$ to $3:0.005$ to $0.03:100$ to $200$. A thickness of the layer is selected to be 10 to 30 nm. Thereafter, a metal 318 having a thickness of 10 to 1000 nm is deposited on an upper surface of the p-type μC-SiC 311. Next, as shown in FIG. 12B, while the surfaces of the metal and the side surfaces are covered with an anti-HF wax 325, the resultant C-Si is etched away until the thickness of the C-Si 312 becomes 5 to 10 μm. The C-Si substrate 312 covered with this wax is dipped into water solution 326 made of hydrogen fluoride; ethyl alcohol:water = 1:2:1, as shown in FIG. 2A. A constant current source 117 is employed, a Pt electrode is connected to a cathode side thereof, and the C-Si substrate 312 is connected to an anode side thereof. While a constant current of 10 to 30 mA/cm$^2$ is flown, an etching process is continued until all of C-Si 312 become porous silicon. In this case, since the p-type C-Si substrate is employed, the electrochemical anodization may be performed in dark or in light. The time required for the electrochemical anodization depends upon the thickness of C-Si 312. Normally, when the thickness of C-Si 312 is 5 μm, the electrochemical anodization time becomes 5 minutes approximately.

Figure 12C:
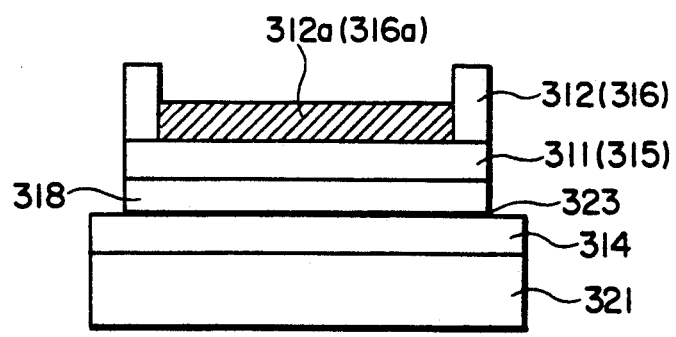

Subsequently, as shown in FIG. 2C, the constant current source 117 is disconnected, and the Pt electrode is shortcircuited with the C-Si substrate 312. Light is irradiated to this p-type C-Si substrate, and then the surface of the porous silicon layer is slightly etched (photochemical etching process). This etching process may be substituted by such a process for dipping the substrate into a solution of $H_2O:KOH = 100:1$ to 3 for several seconds to several minuted. Thereafter, the wax is removed away, cleaned by water, and then dried. As shown in FIG. 12C, the resultant substrate is adhered on the gass substrate 321 by a conductive adversive agent 323 such as silver paste, on which ITO 314 has been previously coated.

Furthermore, n-type μC-SiC 313 is deposited by the ECR CVD method in such a manner that a thickness of this layer becomes 10 to 30 nm. It should be noted that a deposition condition of this case is the same as that of the previous ECR PCVD method except that PH$_8$ is used in place of B$_2$H$_6$. Finally, an ITO 314 having a thickness of 40 to 70 nm is deposited on the n-type μC-SiC layer 313 to be used as an upper electrode, so that the light emitting element 301 can be obtained, as illustrated in FIG. 11.

Figure 13:
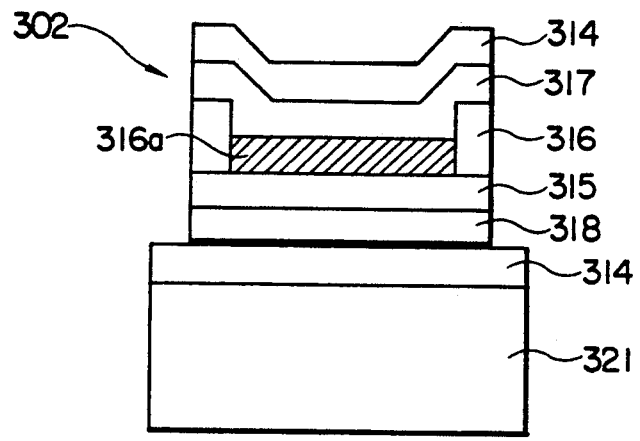
FIG. 13 schematically illustrates a structure of a light emitting element with employment of an n-type silicon substrate mounted on a glass substrate, according to a second embodiment of the present invention.

FIG. 13 schematically represents a structure of a light emitting element with employment of an n-type C-Si substrate, according to the second preferred embodiment, mounted on a glass substrate. The light emitting element 302 shown in FIG. 13 is fabricated by an n-type μC-SiC 315, a porous silicon layer 316a, a p-type μC-SiC layer 317, and an indium tin oxide (ITO) 314 corresponding to a transparent electrode. Also, a metal 318 is formed on a bottom plane of μC-SiC 315. The light emitting element 302 is adhered on a glass substrate 321, on which ITO 314 has been formed, by employing a conductive adversive agent 323, for instance, silver paste.

Then, a description will now be made of a method for manufacturing the light emitting element 302 shown in FIG. 13. It should be noted that since the method for manufacturing the light emitting element 302 shown in FIG. 13 is the substantially same as the method for manufacturing the light emitting element 301 shown in FIG. 11, the drawings from FIGS. 12A to 12C will be also utilized for explaining the method for manufacturing the light emitting element 302. Numerals with blanks will be attached by constructive elements of the light emitting element 302 different from those of the light emitting element 301. As represented in FIG. 12A, an n-type μC-SiC 315 is deposited on an upper surface of the n-type C-Si substrate 316, both surfaces of which have been mirror-polished, by way of the ECR PCVD method. A deposition condition is given as follows: Microwave power is selected from 200 W to 300 W; a substrate temperature is selected to be 150° to 300° C.; pressure is selected from 2.5 to 8 m Torr; and a gas ratio of Si:CH$_4$:PH$_3$:H$_2$=1:1 to 3:0.005 to 0.03 ; 100 to 200. A thickness of the layer is selected to be 10 to 30 nm. Thereafter, a metal 318 having a thickness of 10 to 1000 nm is deposited on an upper surface of the n-type μC-SiC 315. Next, as shown in FIG. 12B, while the surfaces of the metal and the side surfaces are covered with an anti-HF wax 325, the resultant C-Si is etched away until the thickness of the C-Si layer 316 becomes 5 to 10 μm. The C-Si substrate 316 covered with this wax is dipped into water solution 326 made of hydrogen fluoride:ethanol:water=1:2:1, as shown in FIG. 2A. A constant current source 117 is employed, a Pt electrode is connected to a cathode side thereof, and the C-Si substrate 316 is connected to an anode side thereof. While a constant current of 10 to 30 mA/cm$^2$ flows, an etching process is continued until all of C-Si 316 become porous silicon. In this case, since the n-type C-Si substrate is employed, the electrochemical anodization must be carried out, while irradiating light from a halogen lamp or the like. The time required for the electrochemical anodization depends upon the thickness of C-Si 316. Normally, when the thickness of C-Si 316 is 5 μm, the electrochemical anodization time becomes 5 minutes approximately.

Next, similar to the previous case of the light emitting element 301, the surface of the porous silicon layer is slightly etched, the wax is removed away, and then dried. The resultant substrate is adhered on the glass substrate 321 by a conductive adversive agent 323 such as silver paste.

Furthermore, an p-type μC-SiC layer 317 is deposited by the ECR PCVD method in such a manner that a thickness of this layer becomes 10 to 30 nm. It should be noted that a deposition condition of this case is the same as that of the previous ECR PCVD method except that B$_2$H$_6$ is used instead of PH$_3$. Finally, an ITO 314 having a thickness of 40 to 70 nm is deposited on the μC-SiC layer 317 to be used as an upper electrode, so that the light emitting element 302 can be obtained, as illustrated in FIG. 13.

When an estimation is made by the transmittance measurement about an energy band gap of porous silicon in which a pn junction is formed and from which visible light can be emitted, it is higher than approximately 2 eV. As a consequence, to form a light emitting element with high electroluminescence intensity, the pn junction must be manufactured with the semiconductor having an energy gap (namely, higher than 2 eV) wider than that of porous silicon, in which carriers can be injected effectively into porous silicon functioning as the light emitting layer. In other words, if a sandwich structure of a light emitting element is constructed of p-type Si/porous Si/n-type Si, electroluminescence intensity is not so high. At least one of them must have the energy band gap of 2 eV, or higher than 2 eV. Preferably, the energy band gaps of both the p-type semiconductor and the n-type semiconductor are higher than, or equal to 2.2 eV. This is because an energy barrier is produced between the p-type and n-type semiconductors corresponding to the carrier injection layers, and porous silicon corresponding to the light emitting layer, as viewed from the porous silicon to the p-type semiconductor, or from the porous silicon to the n-type semiconductor. Thus, if the barrier would be formed from the porous silicon to the p-type semiconductor, or from the porous silicon to the n-type semiconductor, the holes injected from the p-type semiconductor into the porous silicon, or the electrons injected from the n-type semiconductor into the porous silicon are not entered into either the n-type semiconductor layer or the p-type semiconductor layer, but are firmly recombined with each other at the porous silicon layer. As a result, the light emitting element can emit light exectively.

In accordance with the above-explained second preferred embodiment of the present invention, the light emitting element is so arranged that the porous silicon layer whose band gap is 2.0 eV is sandwiched by the μC-SiC whose band gap is selected from 2.2 eV to 2.4 eV. Then, when the bias voltage is applied to this light emitting element, both the electrons and the holes can be easily injected into the porous silicon layer corresponding to the light emitting layer, as compared with the conventioned light emitting element and recombined reliably in the porous silicon layer. As a result, although the conventional light emitting element requires the bias voltage of 10 to 15 V, the light emitting element according to the second preferred embodiment requires only the bias voltage of 5 to 12 V corresponding to the drive voltage of the normal logic element, in order to achieve sufficient electroluminescence intensity. As described above, since sufficient electroluminescence intensity can be achieved with the same voltage as the normal drive voltage of the integrated circuit in accordance with the light emitting element of this preferred embodiment, this light emitting element is suitable as light sources for opto-communications, self-emission type displays, and opto-integrated circuit.

As previously explained, in accordance with this second preferred embodiment, the light emitting element is so arranged that the porous silicon layer is sandwiched by the p-type semiconductor and the n-type semiconductor, whose band gaps are higher than 2.2 eV. Thus, since the electrons and holes are entered into the light emitting layer at the lower bias voltage than that of the conventional light emitting element, the light emitting element of the second preferred embodiment can emit light at the lower drive voltage than that of the conventional light emitting element. Moreover, it is possible to provide such a light emitting element that electroluminescence intensity thereof is improved.

The light emitting element according to the second preferred embodiment may be manufactured by the low-temperature process below than 300° C. If after logic circuits, calculation circuits, drive circuits, and light emitting elements have been formed, these element portions are covered with a wax or the like and the light emitting element of this second preferred embodiment is manufactured, the light emitting element can be assembled in the monolithic form with the logic circuits, calculation circuits, drive circuits and light receiving elements without electrically destroying these logic circuits, calculation circuits, drive circuits and light receiving elements. Consequently, especially, this light emitting element is suitable for light sources of optocommunications, self-emission type displays, and optointegrated circuits.

A light emitting element according to a third preferred embodiment of the present invention will now be explained.

The light emitting element of this third preferred embodiment is comprised of p-type, or n-type C-Si whose resistivity is 0.001 to 40 $\Omega$cm;

an epitaxial layer having the same conductivity type as that of the C-Si, in which C-Si having higher resistivity than that of the first-mentioned C-Si is epitaxial-grown on the first-mentioned C-Si;

a porous silicon layer formed at the epitaxial layer; and an $\mu$C-SiC layer with a conductivity type opposite to that of the C-Si formed on the porous silicon layer.

The stronger, photoluminescence of a porous silicon layer becomes, the higher, resistivity of a substrate becomes. However, since if a substrate having high resistivity is employed in the conventional light emitting element, an applied voltage to the junction is lowered due to a high resistance of this substrate, a carrier is difficult to be injected from the substrate into a porous silicon layer. As a result, although photoluminescence by the porous silicon layer is improved, the intensity of the injected electroluminescence is not increased.

To the contrary, according to the light emitting element of the third preferred embodiment, the porous silicon layer is fabricated on the epitaxial layer in which the C-Si having the higher resistivity than that of the C-Si employed as the substrate, has been epitaxial-grown, while maintaining the resistivity of the C-Si used as the substrate at a low level, so that lowering of the applied voltage to the junction may be suppressed as small as possible. As a consequence, the carrier can be easily entered into the porous silicon layer. Moreover, since the porous silicon layer can be made of the C-Si with the high resistivity, the resultant photoluminescence by the porous silicon layer becomes strong.

In principle, even when a-SiC would be employed instead of a $\mu$C-SiC film, a light emitting element could be formed. However, since the resistivity of the a-SiC because higher than that of the $\mu$C-SiC, the luminescence intending may be lowered.

Referring now to the accompanying drawings, the light emitting element according to the third preferred embodiment will now be described.

Figure 14:
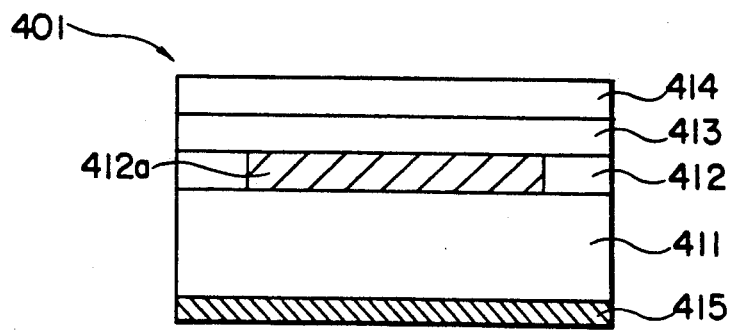
FIG. 14 schematically shows a structure of a light emitting element with employment of a p-type silicon substrate, according to a third embodiment of the present invention.

FIG. 14 schematically shows a structure of a light emitting element with employment of a p-type C-Si substrate, according to the third preferred embodiment of the present invention. In FIG. 14, a light emitting element 401 includes a p-type C-Si substrate 411; an epitaxial layer 412 formed by epitaxially growing C-Si on the C-Si 411; a porous silicon layer 412a formed on the epitaxial layer 412; an n-type $\mu$C-SiC layer 413 formed on the porous silicon layer 412a; an indium tin oxide (ITO) 414 formed on the n-type $\mu$C-SiC layer 413, corresponding to a transparent electrode; and also an Au (gold), or Al (aluminum) electrode 415 formed on a lower surface of the C-Si substrate 411.

Figure 15A:
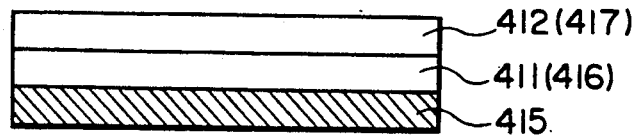
FIGS. 15A and 15B are explanatory diagrams for showing the manufacturing steps of the light emitting element shown in FIG. 14.
Figure 15B:
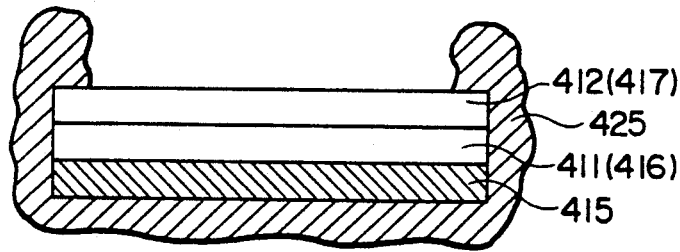

Then, a description will now be made of a method for manufacturing the light emitting element 401 indicated in FIG. 14. A wafer is employed which has the epitaxial layer 412 in which p-type C-Si with resistivity of 10 to 100 $\Omega$cm has been epitaxially grown on the p-type C-Si 411 having a resistivity of 0.05 $\Omega$cm. The thickness of the epitaxial layer is from 5 to 10 $\mu$m. First, as represented in FIG. 15A, an ohmic contact is made by depositing either the Au electrode, or Al electrode 415 at the side of the C-Si 411 of the wafer having the resistivity of 0.05 $\Omega$cm. Thereafter, as indicated in FIG. 15B, the p-type C-Si substrate 411 which has been masked by an anti-hydrogen fluoride wax 425 except for a portion desired to become porous, is processed by way of the electrochemical anodization, as previously explayed with reference to FIG. 2A, until all of the epitaxial layer 412 becomes the porous silicon layer completely.

Next, as represented in FIG. 2C, the constant current source 117 is disconnected. While the pt electrode and the C-Si substrate 411 are dipped into the solution, the platinum electrode is shortcircuited with the C-Si substrate 411, to which light is irradiated, and then the surface of the porous silicon layer 412a is slightly etched away. This etching process may be substituted by a process to dip a sample into a solution of $H_2O$:$KOH$=100:1 to 3 for several seconds to several minutes. Thereafter, the wax is removed from the p-type C-Si substrate which will then be washed and dried.

Furthermore, the n-type $\mu$C-SiC 413 is deposited by way of the ECR PCVD method. It should be noted that the deposition conditions of this case are given as follows Microwave power is selected from 200 W to 300 W; substrate temperatures are selected from 150° C. to 300° C.; pressure is selected from 2.5 to 8 m Torr; and gas ratio of Si:$CH_4$:$PH_3$:$H_2$=1:1 to 3; 0.005 to 0.003:100 to 200. A film thickness is selected from 10 nm to 30 nm. Finally, the ITO 414 having the thickness of 40 to 70 nm is deposited on the n-type $\mu$C-SiC layer 413 by employing the electron beam vapor deposition apparatus to form the upper electrode, so that the light emitting element 401 shown in FIG. 14 can be obtained.

Then, a description will now be made of another light emitting element, according to the third preferred embodiment, with employment of an n-type C-Si substrate.

Figure 16:
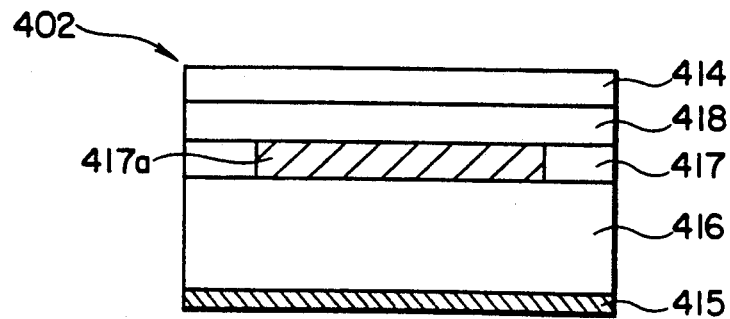
FIG. 16 schematically represents a structure of a light emitting element with employment of an n-type silicon substrate, according to a third embodiment of the present invention.

FIG. 16 schematically shows a structure of a light emitting element with employment of an n-type C-Si substrate, according to the third preferred embodiment of the present invention. In FIG. 16, a light emitting element 402 includes a n-type C-Si substrate 416; an epitaxial layer 417 formed by epitaxially growing C-Si on the C-Si substrate 416; a porous silicon layer 417a formed on the epitaxial layer 417; a p-type $\mu$C-SiC layer 418 formed on the porous silicon layer 417a; an indium tin oxide (ITO) 414 formed on the p-type $\mu$C-SiC layer 418, corresponding to a transparent electrode; and also an Au (gold), or Al (aluminum) electrode 415 formed on a lower surface of the S-Ci substrate 416.

Then, a description will now be made of a method for manufacturing the light emitting element 402 indicated in FIG. 16. It should be noted that since the method for manufacturing the light emitting element 402 is the substantially same as that of the light emitting element 401, the drawings of FIGS. 15A and 15B are employed so as to explain the method for manufacturing the light emitting element 402, and reference numerals with blanks will be given to constructive portions different from those of the light emitting element 401. A wafer is employed which has the epitaxial layer 417 in which n-type C-Si with resistivity of 10 to 100 Ωcm has been epitaxially grown on the n-type C-Si 416 having resistivity of 0.05 Ωcm. The thickness of the epitaxial layer is from 5 to 10 μm. First, as represented in FIG. 15A, an ohmic contact is made by depositing either the Au electrode, or Al electrode 415 at the side of the C-Si 416 of the wafer having the resistivity of 0.05 Ωcm. Thereafter, as indicated in FIG. 15B, the n-type C-Si substrate 416 which has been masked by an anti-hydrogen fluoride wax 425 except for a portion desired to become porous, is processed by way of the electrochemical anodizationg method, as previously explayed with reference to FIG. 2A, until all of the epitaxial layer 417 becomes the porous silicon layer completely.

Next, in a similar manner to that of the light emitting element 401, the surface of the porous silicon layer is slightly etched away. Thereafter, the wax is removed from the n-type C-Si substrate which will then be washed and dried.

Furthermore, the p-type μC-SiC layer 418 is deposited with a thickness of 10 to 30 nm by way of the ECR PCVD method. It should be noted that the deposition conditions of this case are similar to those of the previous deposition conditions, if $B_2H_6$ is employed instead of $PH_3$ as the impurity gas. Finally, the ITO 414 having the thickness of 40 to 70 nm is deposited on the p-type μC-SiC layer 418 to form the upper electrode, so that the light emitting element 402 shown in FIG. 16 can be obtained.

In accordance with the third preferred embodiment, since the single crystal silicon substrate with the resistivity of 0.05 Ωcm is employed, lowering of the applied voltage to the junction due to the resisturity of the substrate is very small. As the bias voltage is applied to the junction between the C-Si substrate and the porous silicon layer without any loss, the many carriers are injected effectively into the porous silicon layer. Also, since the resistivity of the epitaxial layer is high, e.g., 10 to 100 Ωcm, when the porous silicon layer is fabricated with employment of this epitaxial layer, the resistivity of the porous silicon layer according to the second preferred embodiment becomes high, as compared with that of the conventional porous silicon layer, and photoluminescence by this porous silicon layer is strengthen. As a result, according to the light emitting element of this third preferred embodiment, the electroluminescence intensity becomes high, and also the threshold voltage for the light emission is lowered. As a consequence, it is possible to achieve sufficient electroluminescence intensity by the same drive voltage as that used in the normal integrated circuit.

As previously explained, the light emitting element according to the third preferred embodiment is so constructed of p-type or n-type single crystal silicon whose resistivity is 0.001 to 40 Ωcm; an epitaxial layer having the same conductivity type as that of the C-Si, in which C-Si having higher resistivity than that of the first-mentioned C-Si is epitaxial-grown on the first-mentioned C-Si; a porous silicon layer formed at the epitaxial layer; and a μC-SiC layer with a conductivity type opposite to that of the C-Si formed on the porous silicon layer. Accordingly, it is possible to provide such a light emitting element capable of emitting light at the lower bias voltage than the bias voltage of the conventional light emitting element, and also capable of improving electroluminescence intensity.

Instead of the μC-SiC described in the respective preferred embodiments, even when polycrystal diamond may be alternatively deposited, the light emitting elements could be realized. The polycrystal diamond may be manufactured by way of the ECR PCVD, plasma CVD (PLVD), thermal CVD, thermal filament CVD. Among these manufacturing methods, the simplest method is the thermal filament CVD method. The method for manufacturing the polycrystal diamond capable of forming the light emitting element in combination with the porous silicon, is a method for decomposing a mixture gas of $CH_4 + H_2 + B_2H_6$ with a heating filament. The conductivity of the poly crystal diamond greater than or equal to $10^{-5}$ S/cm is necessary for fabricating the light emitting diodes with porous silicon. Since the polycrystal diamond is normally formed at high temperatures above 700° C., the porous silicon must be annealed for more than 1 minutes within an oxidizing oven at temperatures higher than 900° C. before the polycrystal diamond is deposited.

Otherwise, instead of the μC-SiC, even when polycrystal silicon carbide (SiC) is deposited, the light emitting element may be realized. The polycrystal SiC may be manufactured by way of the thermal CVD method. A method for manufacturing poly crystal SiC capable of fabricating the light emitting element with the porous silicon, is a method for decomposing a mixture gas of $C_2H_4$ (acetylene) + $SH_4$ + TMA (tetramethyl aluminum) or propane $(C_3H_8) + SiH_4 + TMA$, or a mixture gas of $C_2H_2 + SiH_4 + N_2$ or propane $+ SiH_4 + N_2$, by the thermal CVD method. $NH_3$ can be used instead of $N_2$. The conductivity of polycrystal SiC higher than, or equal to $10^{-5}$ S/cm is required for fabricating the light emitting element with the porous silicon. Since the polycrystal SiC is normally manufactured under higher temperatures than 700° C., the porous silicon must be annealed in the oxidizing oven with the temperature above 900° C. for longer than 1 minute.

Furthermore, even when triphenylamine derivative or perylene derivative, corresponding to an organic semiconductor, is vapor-deposited, the light emitting element may be realized. This vapor deposition can be performed at a room temperature.

Various sorts of light emitting elements with employment of the porous silicon, according to preferred embodiments of the present invention, have been described.

The most emission colors of the conventional light emitting elements with employment of the porous silicon are red. Even for the short wavelengths, the emission colors are orange/red. As previously explained, if the emission colors are only red, usage of these light emitting elements is limited. Under such a circumstance, a need is made to develop a light emitting element with employment of silicon, capable of emitting light with a short wavelength.

In a light emitting element according to a fourth preferred embodiment of the present invention, light having a short wavelength can be emitted by substituting either a portion or an entire portion of hydrogen adhered onto surfaces of a large quantity of holes in porous silicon by heavy hydrogen.

α-bond excitor in Si-Si bond produced by light-exciting porous silicon can be freely moved within Si-Si bond as represented in FIG. 7. At this time, kinetic energy of the α-bond excitor is transferred to a vibrational mode of Si-H, and then be attenuated, while the energy is gradually transferred to the vibration of Si-H by this movement (namely, vibrational energy of Si-H is increased).

If the α-bond excitor formed in the bonds among Si (silicon) does not transfer the energy thereof to the vibrational mode of Si-H, confinement effects become strong, the bond energy of the exciton is increased, and then light emission is shifted to the side of higher energy. As a method for freezing Si-H vibrations, there are various methods. Namely, ① the temperature is lowered, ② H is replaced by heavy atom and so on. Considering light emission at a room temperature, the method ② is practically effective to freeze vibrations. In accordance with the present invention, hydrogen adhered to the surfaces of a large number of holes is substituted by heavy hydrogen. As a consequence, green or blue light emission is available, which is different from the red light emission of the conventional light emitting element. Therefore, the light emitting element with the pn junction by employing this porous silicon, can emit light with a short wavelength, as compared with the conventional light emitting element.

The reason why the heavy molecular weight becomes better, is as follows:

Generally speaking, a kinetic formula is expressed by:

$$m \cdot dx/dt = -kx$$

Accordingly, an angular frequency "ω" of vibration is $\omega = (k/m)^{\frac{1}{2}}$. This angular frequency is increased in proportion to $m^{-\frac{1}{2}}$. As a consequence, if mass becomes twice, energy of angular frequency "ω" becomes $\sqrt{2}^1$.

Figure 17:
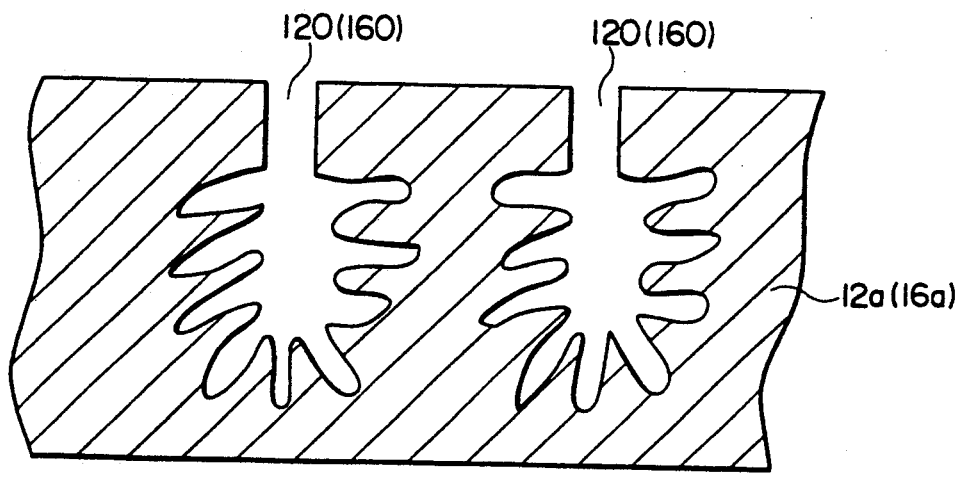
FIG. 17 is an enlarged sectional view of a portion of porous silicon employed in a light emitting element according to a fourth embodiment of the present invention.
Figure 18:
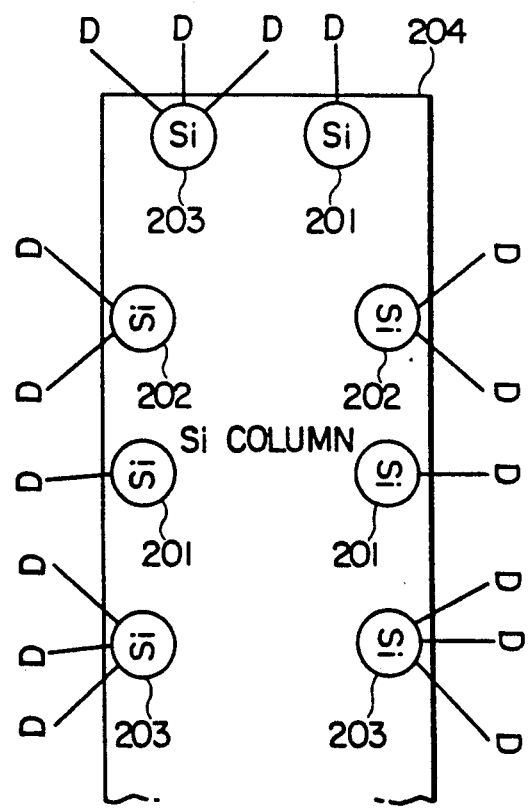
FIG. 18 indicates a coupling state between silicon and heavy hydrogen within a hole of porous silicon employed in the fourth embodiment of the present invention.

Referring now to the drawings, the porous silicon according to the fourth preferred embodiment will now be explained. FIG. 17 schematically shows an enlarged sectional view of a portion of the porous silicon according to the fourth preferred embodiment. FIG. 18 schematically represents a bond condition between heavy hydrogen and silicon with the holes of the porous silicon according to this preferred embodiment. As shown in FIG. 18, the porous silicon of this fourth preferred embodiment is characterized in that a portion or an entire portion of hydrogen adhered to surfaces within a large number of holes 120 of porous silicon is substituted by heavy hydrogen.

Then, since a structure of a light emitting element with employment of the above-described porous silicon, according to the fourth preferred embodiment of the present invention, is the same as that of the first preferred embodiment, in principle, a manufacturing method thereof will now be explained with reference to FIGS. 1A and 1B. It should be understood that blanks are attached to reference numerals of constructive elements different from those of the first preferred embodiment.

As shown in FIG. 1A, either Au (gold) or Al (aluminum) 107 is vapor-deposited on a rear plane of a p-type C-Si substrate 11 (plane orientation of (100) or (111) and resistivity of 0.1 to 20 Ωcm) to establish an ohmic contact. Thereafter, as shown in FIG. 2A, the resultant p-type C-Si is masked by a wax except for a portion which is desired to be made porous, and then dipped into a solution of ethyl alcohol hydrogen fluoride, water and heavy hydrogen, the ratio of which is selected to be 2:1:1:1. A constant current source 117 is employed, a Pt electrode is connected to a cathode thereof, and an electrode of a C-Si substrate 11 is connected to an anode thereof. Under such a circumstance, a current is flown at densities of 10 to 50 mA/cm² and electrochemical anodization is carried out. The time required for carrying out the electrochemical anodization depends upon thicknesses of the p-type C-Si substrate 11. If the normal thickness 5 μm of the substrate is employed, this electrochemical anodization time becomes approximately 5 minutes. It should be understood that when a p-type C-Si substrate is employed, the electrochemical anodization may be carried out in dark or in light. Subsequently, the resultant p-type C-Si is dipped in the KOH solution for several seconds, or processed by the photo-chemical etching process to remove an impurity layer formed on the surface of the porous silicon. Next, the wax coated on the surface is removed by using an organic solvent and cleaned by pure water. Subsequently, the resultant p-type C-Si substrate is transferred into an ECR PCVD apparatus and an n-type μC-SiC 13 having a thickness of 15 nm is deposited. A deposition condition is as follows: A gas pressure is selected to be 0.001 to 0.008 Torr, supplied power is selected to be 200 W to 300 W, $SiH_4:CH_4:PH_3:H_2 = 1:1$ to $3:0.005$ to $0.003:100$ to $200$, and a substrate temperature is selected to be 150° C. to 300° C. The, an indium tin oxide (ITO) 109 corresponding to a transparent electrode is deposited with a thickness of 400 to 700 Å by utilizing the electron beam vapor deposition apparatus.

Figure 19:
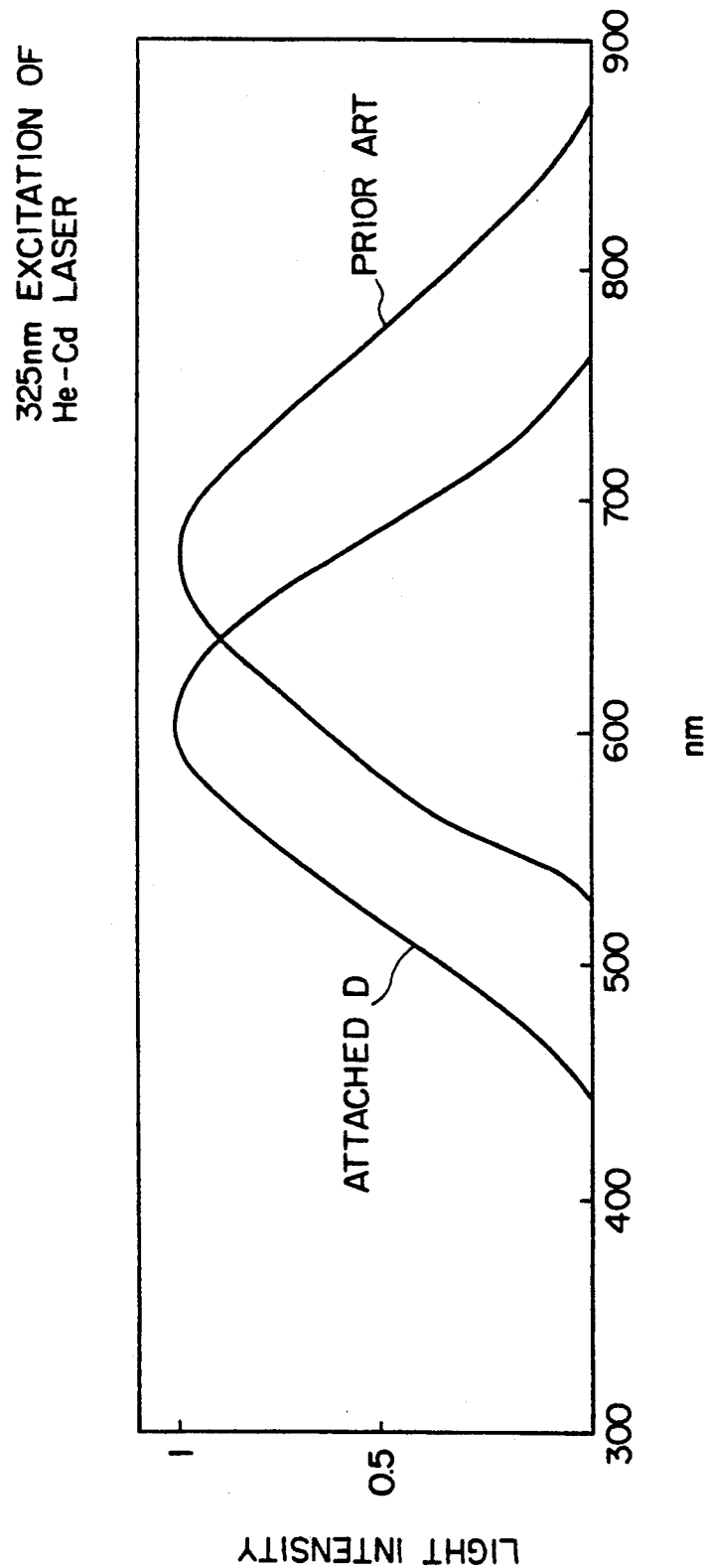
FIG. 19 is a spectrum of photoluminescence of the porous silicon shown in FIG. 17.

When the porous silicon 12a is fabricated by way of the electrochemical anodization, if the water solution of hydrogen fluoride, ethanol, and water = 1:2:1 is used to carry out this electrochemical anodization similar to the first preferred embodiment, Si dangling bonds of the wall surfaces within the holes 120 are immediately terminated by hydrogen, as represented in FIG. 7. To the contrary, if the electrochemical anodization is performed in the water solution o hydrogen fluoride, ethanol, water and heavy water = 1:2:1:1 in a similar manner to that of the fourth preferred embodiment, then a portion or an entire portion of the Si dangling bonds which are terminated by heavy hydrogen as shown in FIG. 18. Thus, the vibration is frozen by replacing hydrogen by heavy hydrogen the tight confinement of the α-bond excitor can be performed without any loss, so that light with a short wavelength can be emitted. FIG. 19 is a spectrum of photoluminescence as measurement results. As apparent from FIG. 19, in accordance with the porous silicon of this preferred embodiment, such a light emitting phenomenon with a short wavelength occurs, as compared with the wavelength of the light emitted from the conventional light emitting element. As a consequence, the light emitting element with employment of the porous silicon according to the fourth preferred embodiment, can emit light having a shorter wavelength than that of the conventional light emitting element. It should be noted that the ratio of heavy water during the above-explained electrochemical anodization may be selected to be greater than, or equal to 1. Also, since DF is not commercially available, heavy water has been employed in the above electrochemical anodization. To the contrary, if DF or TF is available, then either DF or TF may be employed instead of HF in the electrochemical anodization.

Then, a description will now be made of porous silicon, a fourth preferred embodiment, with employment of an n-type C-Si substrate.

As represented in FIG. 18, the porous silicon of this preferred embodiment is manufactured by substituting a portion or an entire portion of hydrogen adhered to surfaces with a large number of holes of porous silicon 204 by heavy hydrogen.

As shown in FIG. 1B, either Au (gold) or Al (aluminum) 107' is vapor-deposited on a rear plane of a n-type C-Si substrate 15 (plane orientation of (100) or (111) and resistivity of 0.1 to 20 Ωcm) to establish an ohmic contact. Thereafter, as shown in FIG. 2A, the resultant n-type C-Si is masked by a wax except for a portion which is desired to be made porous, and then dipped into a solution of ethyl alcohol and hydrogen fluoride; water; heavy water, the ratio of which is selected to be 2:1:1:1. A constant current source 117 is employed, a Pt electrode is connected to a cathode thereof, and an electrode of a C-Si 15 is connected to an anode thereof. Under such a circumstance, a current is flown at densities of 10 to 50 mA/cm$^2$ and an electrochemical anodization is carried out. The time required for carrying out the electrochemical anodization depends upon thicknesses of the n-type C-Si substrate 15. If the normal thickness 5 μm of the substrate is employed, this electrochemical anodization time becomes approximately 5 minutes. It should be noted that when an n-type C-Si substrate is employed, light such as light emitted from a tangustem lamp must be irradiated to this n-type C-Si substrate .so as to carry out the electrochemical anodization. Subsequently, the resultant n-type C-Si substrate is dipped in the KOH solution for several seconds, or processed by the photo-chemical etching process to remove an impurity layer formed on the surface of the porous silicon. Next, the wax coated on the surface is removed by using an organic solvent and cleaned by pure water. Subsequently, the resultant n-type C-Si substrate is transferred into an ECR PCVD apparatus and an p-type μC-SiC film 17 having a thickness of 15 nm is deposited. A deposition condition is as follows: A gas pressure is selected to be 0.001 to 0.008 Torr, supplied power is selected to be 200 to 300 W, $SiH_4:CH_4:B_2H_6:H_2 = 1:1$ to 3:0.005 to 0.003:100 to 200, and a substrate temperature is selected to be 150° to 300° C. Then, an indium tin oxide (ITO) 109' corresponding to a transparent electrode is deposited with a thickness of 40 to 70 nm by utilizing the electron beam vapor deposition apparatus.

In accordance with the fourth preferred embodiment, the porous silicon with employment of the n-type C-Si substrate 15 can emit light having a further shorter wavelength than that of the p-type C-Si substrate 11.

According to the fourth preferred embodiment, since a portion or an entire portion of hydrogen attached to the surfaces of a large quantity of holes is substituted by heavy hydrogen, it is possible to provide both of porous silicon and a light emitting element with employment of this porous silicon, capable of emitting light with wavelengths shorter that those of the conventional light emitting elements.

Then, a description will now be made of an opto-optical converting element as one embodiment of an optical device with employment of the light emitting element according to the present invention. The opto-optical converting element according to this embodiment is fabricated in such a manner that a light emitting element formed by sandwiching porous silicon between a p-type semiconductor and an n-type semiconductor and a light receiving element are vertically stacked on a C-Si substrate.

To realize a carrier injection type light emitting element with employment of a pn junction, the inventors could find out such a fact that the pn junction with better characteristics could be manufactured by the following method. That is, porous silicon corresponding to a light emitting layer is formed on a p-type C-Si or an n-type C-Si by way of the electrochemical anodization method. Thereafter, a μC-SiC having a wide band gap (2.0 to 2.4 eV) and also high conductivity ($10^{-2}$ to $10^1$ S/cm) as an n-type semiconductor, or a p-type semiconductor, is deposited on porous silicon. As a result, since all of the light emitting element and the light receiving element can be manufactured by silicon by forming the opto-optical converting element in such a manner that this light emitting element and the light receiving element made of silicon are stacked up along the vertical direction, the manufacturing cost thereof can be reduced and high reliability thereof can be achieved, as compared with the conventional opto-optical converting element.

Figure 20:
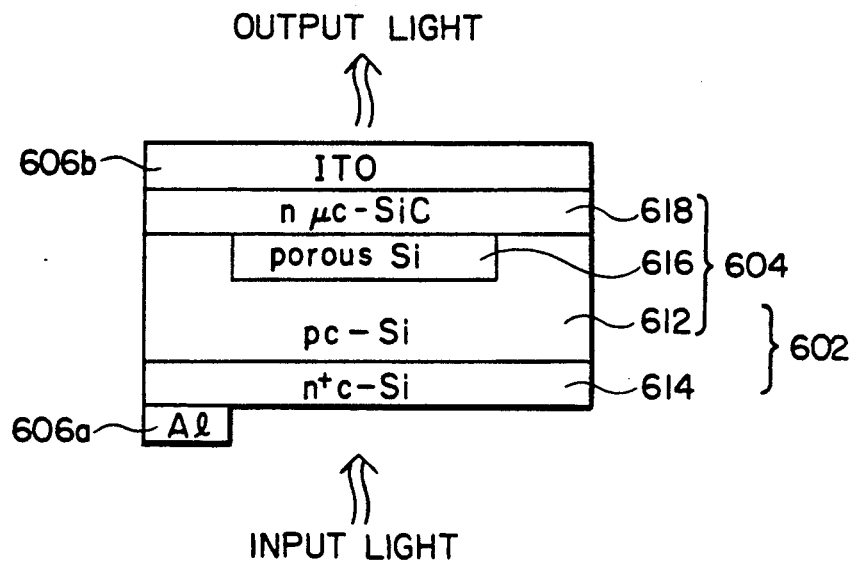
FIG. 20 schematically represents a structure of an opto-optical converting element, according to a first embodiment, with employment of the light emitting element of the present invention.
Figure 21:
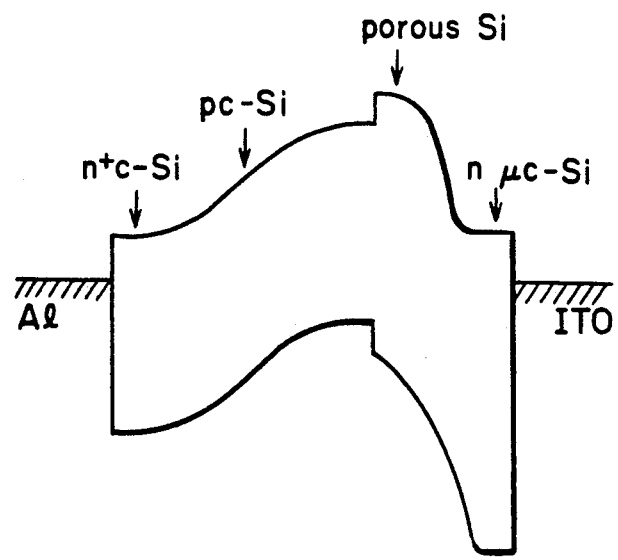
FIG. 21 schematically shows a band diagram when no bias voltage is applied to the opto-optical converting element shown in FIG. 20.
Figure 22:
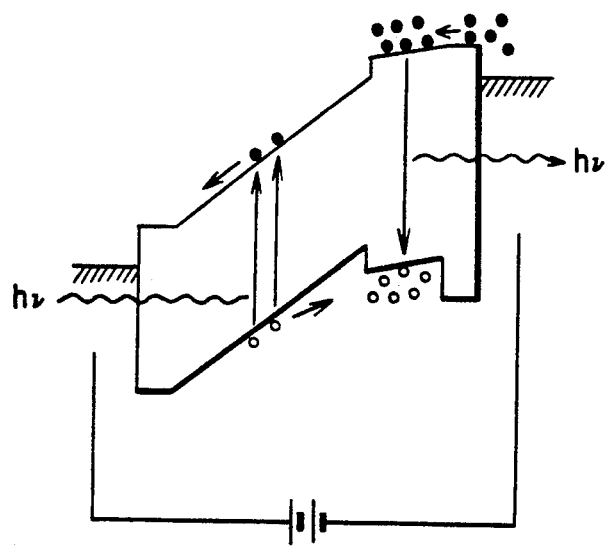
FIG. 22 schematically indicates a band diagram when a bias voltage is applied to the opto-optical converting element of FIG. 20, while illuminating light to this opto-optical converting element.

Referring now to drawings, opto-optical converting elements according to the preferred embodiments will now be explained. FIG. 20 schematically shows a structure of an opto-optical converting element according to one preferred embodiment of the present invention. FIG. 21 shows a band diagram when no bias voltage is applied to this opto-optical converting element. FIG. 22 represents a band diagram when a bias voltage is applied and light is irradiated to this opto-optical converting element.

In the opto-optical converting element shown in FIG. 20, a photodiode 602 and a light emitting element 604 are integrated along the vertical direction. The photodiode 602 is fabricated by a pn junction by forming an n$^+$-type C-Si layer 614 on a rear surface of a p-type C-Si substrate 612. An electrode 616a is formed on the n$^+$-type C-Si layer 614 by an Al (aluminum) layer. Also, the light emitting element 604 is so manufactured by forming a porous silicon layer 616 on a top surface of the p-type C-Si substrate 612 and furthermore by forming an n-type μC-SiC layer 618. A transparent electrode 606b is fabricated by an ITO (indium tin oxide) film on the n-type μC-SiC 618. A band diagram when no bias voltage is applied to this opto-optical converting element is represented in FIG. 21.

A method for manufacturing the opto-optical converting element shown in FIG. 20 will now be explained.

First, the n$^+$-type C-Si layer 614 is formed on a rear surface of the p-type C-Si substrate 612 (crystal plane=(100) and resistivity is 0.1 to 40 Ωcm). This n$^+$-type C-Si layer 614 is fabricated by way of the ion implantation method or the diffusion method. Then, an ohmic contact is made by vapor-depositing aluminum (Al) on the n$^+$-type C-Si layer 614 to form the electrode 606a.

Next, the porous silicon layer 616 is formed on a surface of the p-type C-Si substrate 612 by means of the electrochemical anodization method by the apparatus shown in FIG. 2A. That is to say, first, all portions of the p-type C-Si substrate 612 except for a portion thereof which is desired to be made porous, are masked by a wax 113. A constant current source 117 is employed, and a Pt electrode is connected to a cathode side thereof, whereas an electrode 606a of the nt-type C-Si substrate 614 is connected to an anode side thereof. Subsequently, the p-type C-Si substrate 612 is dipped into a solution of ethyl alcohol and hydrogen fluoride (a water solution of 48%), the ratio of which is selected to be 0.1 to 5:1. The reason why the ratio of ethyl alcohol to hydrogen fluoride is set to 0.1 to 5:1, is that if the ratio of ethyl alcohol to hydrogen fluoride become less than 0.1, the porous silicon layer 616 cannot be manufactured in a uniform state due to bubble produced during the electrochemical anodization. Then, while the current of the constant current source 117 is fixed at 5 to 50 mA/cm$^2$, the electrochemical anodization is performed for 1 to 5 minutes. It should be noted that if the current density exceeds 50 mA/cm$^2$, the electric-field polishing phenomenon of the silicon gradually occurs. Next, the p-type C-Si substrate 612 is processed by the photo-chemical etching, or dipped into a KOH solution for several seconds to several minutes to remove an impurity layer of the surfaces of the porous silicon layer 616. The wax 113 formed on the p-type C-Si substrate 612 is removed by an organic solvent and then cleaned by using pure water.

Next, the n-type $\mu$C-SiC film 618 is deposited by the ECR PCVD method. To manufacture a pn junction with a better characteristic in light emission, it is very important to optimize not only the method for manufacturing the porous silicon layer 616, but also the deposition conditions of n-type $\mu$C-SiC film 618 without giving any damages especially to the interface characteristics between the porous silicon layer 616 and the n-type $\mu$C-SiC 618.

The inventors could fine out such deposition conditions for the n-type $\mu$C-SiC film, capable of injecting electrons effectively from the n-type $\mu$C-SiC film into the porous silicon layer. The deposition conditions for depositing the n-type $\mu$C-SiC film 618 by way of the ECR PCVD apparatus, are given as follows: Gas pressure is selected to be 0.001 to 0.008 Torr, a substrate temperature is selected to be 150° to 350° C., supplied power is selected to be 200 to 350 W, and ratios of SiH$_4$:CH$_4$:PH$_3$:H$_2$=1:1 to 3; 0.005 to 0.03:100 to 200. It should be noted, as results of research by the inventors, that a damage may be given to the porous silicon layer 618 due to the etching effect at the gass pressure below 0.001 Torr by the ECR PCVD method, whereas if the gass pressure exceeds 0.008 Torr, plasma is not stable and therefore the n-type $\mu$C-SiC film 618 cannot be manufactured. Also, at the substrate temperature below 150° C., the n-type $\mu$C-SiC film 618 cannot be manufactured, whereas the surface conditions of the porous silicon layer 616 are changed at the substrate temperature above 350° C., resulting in no light emission.

Finally, the transparent electrode 606b is formed by depositing the ITO film on the n-type $\mu$C-SiC film 618 by employing the electron beam vapor deposition apparatus, so that the opto-optical converting element as shown in FIG. 20 can be obtained.

An operation of the above-described opto-optical converting element of this embodiment will now be described.

As represented in FIG. 22, when a voltage is applied to the opto-optical converting element, the photodiode 602 is brought into a reverse bias condition and the light emitting element 604 is brought into a forward bias condition. When light is incident upon a side of the photodiode 602, pairs of electrons and holes are photo-generated at the p-type C-Si substrate 612. Then, the electrons among these carriers are moved to the n$^+$-type C-Si layer 614, whereas the holes among these carriers are moved to the porous silicon layer 616. Since the light emitting element 604 is forward-biased, the electrons are injected from the n-type $\mu$C-SiC film 618 into the porous silicon layer 616, so that the electrons are recombined with the holes at the porous silicon layer 616 and then light is irradiated. Since the energy gap of the C-Si is 1.12 eV, this opto-optical converting element can sense light having wavelengths up to 1.1 $\mu$m, namely near infrared ray. On the other hand, since the porous silicon emits orange/red light having wavelengths from 600 to 800 nm, infrared light is incident upon the opto-optical converting element of this preferred embodiment to emit visible light. It should be noted that in case that no light is incident on a side of the photodiode 602, since the junction between the n$^+$-type C-Si and the p-type C-Si substrate 612 is reverse-biased, the holes are not injected into the porous silicon layer 616, so that no light is emitted.

In accordance with the above-described embodiment, since the light emitting element is so arranged by sandwiching the porous silicon layer both the p-type C-Si and the n-type $\mu$C-SiC film, the electrons and the holes can be easily entered into the porous silicon layer functioning as the light emitting layer, and thus the pn junction with better characteristics can be obtained. As a result, since the opto-optical converting element can be entirely made of silicon by integrating this light emitting element and the light receiving element manufactured by using silicon along the vertical direction, the structure of the opto-optical converting element according to the preferred embodiment can be made simple under low manufacturing cost with high reliability, as compared with those the conventional opto-optical converting elements employing the compound semiconductor. Also there is another merit that such an opto-optical converting element having an area having a width larger than, or equal to 3 inches can be made. As a consequence, the opto-optical converting element according to this preferred embodiment is suitable to be employed as an element for an optical computer, and a wavelength converting element.

Figure 23:
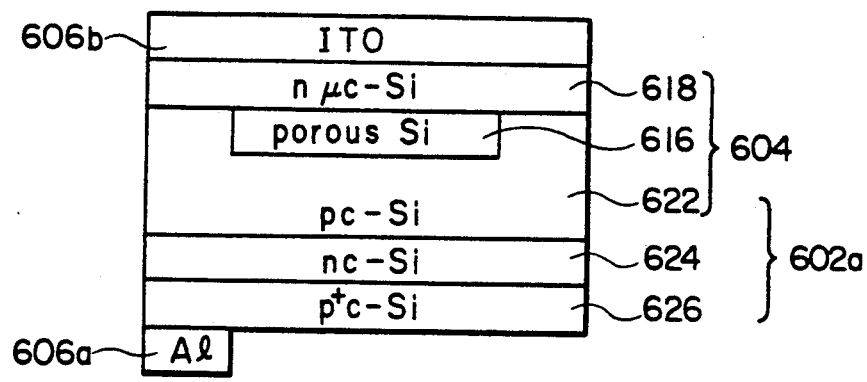
FIG. 23 schematically shows a structure of another opto-optical converting element with employment of the light emitting element of the present invention, according to another embodiment of the present invention.
Figure 24:
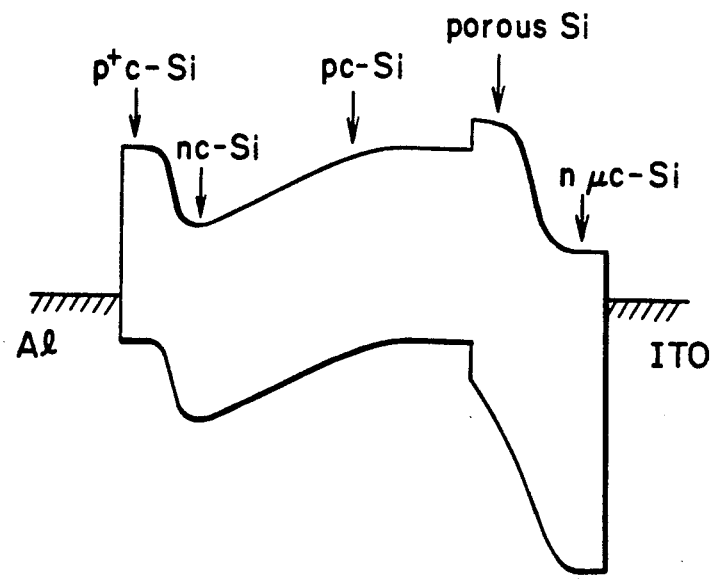
FIG. 24 schematically represents a band diagram when no bias voltage is applied to the opto-optical converting element of FIG. 23.
Figure 25:
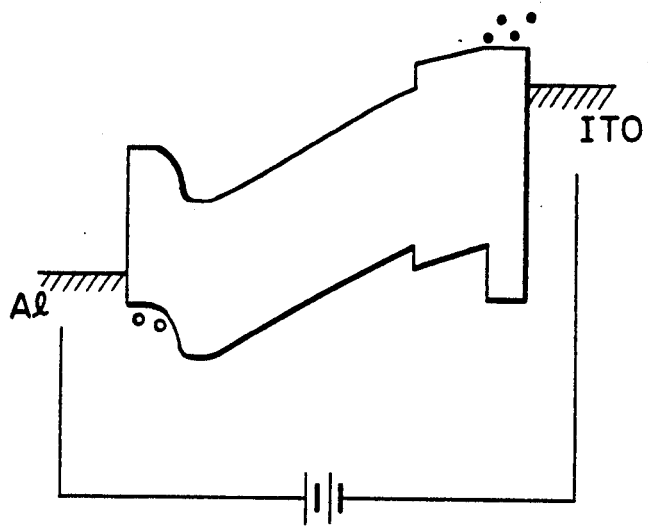
FIG. 25 schematically shows a band diagram when a bias voltage is applied to the opto-optical converting element of FIG. 23.
Figure 26:
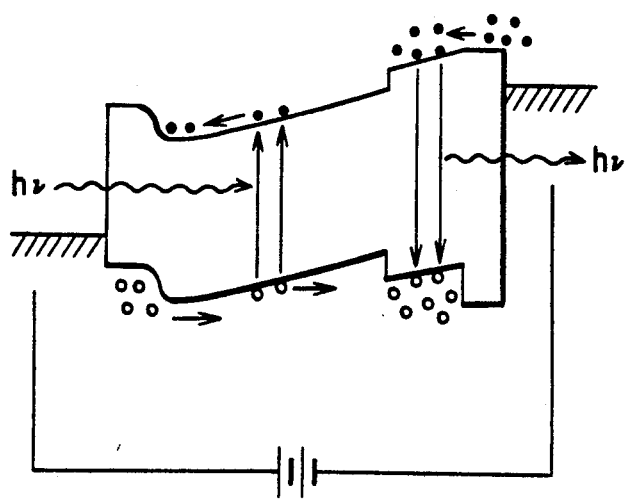
FIG. 26 schematically denotes a band diagram when a bias voltage is applied to the opto-optical converting element of FIG. 23, while illuminating light to this opto-optical converting element.

Referring now to drawings, an opto-optical converting element according to a second preferred embodiment of the present invention will now be explained. FIG. 23 schematically shows a structure of an opto-optical converting element according to the second preferred embodiment of the present invention. FIG. 24 shows a band diagram when no bias voltage is applied to this opto-optical converting element. FIG. 25 represents a band diagram when a bias voltage is applied to this opto-optical converting element. FIG. 26 indicates a band diagram when a bias voltage is applied to this opto-optical converting element and light is irradiated thereto.

A different point of the opto-optical converting element according to the second preferred embodiment is such that a phototransistor 602a is employed as a light receiving element. The phototransistor 602a has such a pnp structure that an n-type C-Si 624 and a p$^+$-type C-Si layer 626 are formed on a p-type C-Si 622. Other structures of this opto-optical converting element are similar to those of the first preferred embodiment. A band diagram in case that no bias voltage is applied to this opto-optical converting element is represented in FIG. 24.

When the opto-optical converting element according to the second preferred embodiment is manufactured, at first, an n-type C-Si layer 624 is epitaxially grown on a rear surface of the p-type C-Si substrate 622. Then, a p$^+$-type C-Si layer 626 is formed by either the diffusion method, or the ion implantation method on the n-type C-Si layer 624, so that a phototransistor 602a is fabricated. Also, aluminum (Al) is vapor-deposited on a part of the p+-type C-Si layer 626 to make an ohmic contact, so that an electrode 606a is formed.

Subsequently, a light emitting element 604 is formed on the surface of the p-type C-Si substrate 622. This is similar to that of the first embodiment, i.e., a porous silicon layer 616 is formed by way of the electrochemical anodization method, and also the n-type μC-SiC film 618 is formed by way of the ECR PCVD method. Finally, a transparent electrode 606b is formed by an ITO film on the n-type μC-SiC film 618, so that the opto-optical converting element shown in FIG. 23 can be obtained.

An operation of the opto-optical converting element according to the second preferred embodiment will now be explained.

First, as shown in FIG. 25, when a voltage is applied to this opto-optical converting element, the junction between the p+-type C-Si layer 626 and the n-type C-Si layer 624 of the phototransistor 602a is brought into a forward bias condition, whereas the junction between the n-type C-Si layer 624 and the p-type C-Si substrate 622 is brought into a reverse bias condition. The light emitting element 604 is brought into a forward bias condition. At this time, since the voltage is mainly applied between the n-type C-Si layer 624 and the p-type C-Si substrate 622 in the phototransistor 602a, the holes of the p+-type C-Si layer 626 are not injected into the p-type C-Si substrate 622.

As represented in FIG. 26, when light is incident upon a side of the phototransistor 602, this light is absorbed by the p-type C-Si substrate 622, so that pairs of the electrons and the holes are produced. The electrons among these carries are moved to n-type C-Si layer 624 and remain in this layer. As a consequence, the junction between the p+-type C-Si layer 626 and the n-type C-Si layer 624 is brought into the more forward bias conditions, and then a barrier between the p+-type C-Si layer 626 and the n-type C-Si layer 624 with respect to the holes becomes small. Accordingly, the holes of the p+-type C-Si layer 624 and the p-type C-Si layer 622, are move to the porous silicon layer 616 together with the holes generated in the p-type C-Si substrate 622. Since the electrons are injected from the n-type μC-SiC film 618 into the porous silicon layer 616, the electrons are recombined with the holes at the porous silicon layer 616 and then visible light is emitted.

In accordance with the opto-optical converting element according to the second preferred embodiment, although the response speed thereof is slower than that of the opto-optical converting element with employment of the photodiode, since the phototransistor is employed as the light receiving element, the received light can be amplified, so that electroluminescence intensity can be increased. Other advantages of the second opto-optical converting element are similar to those of the first opto-optical converting element.

Figure 27:
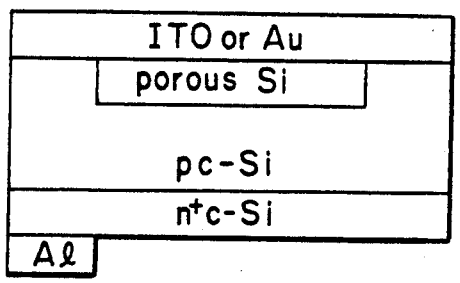
FIG. 27 schematically indicates a structure of a modification for the opto-optical converting element of FIG. 20.
Figure 28:
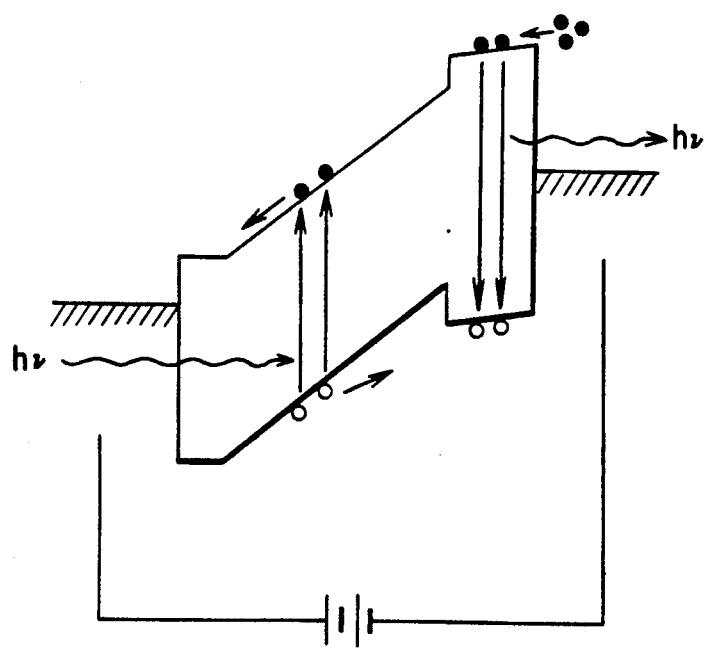
FIG. 28 schematically shows a band diagram of the opto-optical converting element of FIG. 27 when a bias voltage is applied to this opto-optical converting element, while illuminating light thereto.

In the above-described preferred embodiments, for instance, an Au layer or an ITO film may be directly formed instead of the n-type μC-SiC film and the ITO film. FIG. 27 schematically shows a structure of this opto-optical converting element. FIG. 28 shows a band diagram when a bias voltage is applied to and light is irradiated to this opto-optical converting element. In this case, similarly, although the structure of this opto-optical converting element can be made very simple, there is a drawback that electroluminescence intensity becomes low.

In accordance with the opto-optical converting elements of the present invention, as described above, since the light emitting element is so arranged by sandwiching the porous silicon layer with the p-type semiconductor and the n-type semiconductor, the electrons and the holes can be easily entered into the porous silicon layer functioning as the light emitting layer, and thus the light emitting element having the pn junction with better characteristics can be obtained. As a result, since the opto-optical converting element can be made by integrating this light emitting element and the light receiving element manufactured by using silicon along the vertical direction, the structure of the opto-optical converting element according to the preferred embodiment can be made at low manufacturing cost with high reliability, as compared with those of the conventional opto-optical converting element with employment of the compound semiconductor. Also, even if a large area is required, an opto-optical converting element with such a large area may be manufactured. As a consequence, the opto-optical converting element according to this preferred embodiment is suitable to be employed as an element for an optical computer, and a wavelength converting element.

Then, a description will now be made of a plane type optical transmission element with employment of the light emitting element according to the present invention.

Conventionally, as the plane type optical transmission element, it is known such an optical transmission element that both of an optical transmission unit formed of a multilayer structure of GaAs/AlGaAs, and an FET (field-effect transistor) functioning as a switching modulation element for modulating an optical signal transmitted from this optical transmission unit in response to an input electric signal, have been assembled on a compound semiconductor substrate such as a GaAs substrate and an InP substrate (see "physics on Optical/Electronic Integrated Circuits" written by Hideaki Matsueda, page 286).

However, the above-described conventional optical transmission element has various drawbacks, because very expensive compound semiconductor substrate is employed and the optical transmission unit is fabricated by the compound semiconductor. That is to say, a total cost of the optical transmission unit is increased, as compared with that with employment of materials belonging to silicon. Furthermore, high reliability and high integration cannot be achieved.

Since an optical transmission element according to the present invention employs the light emitting element with use of porous silicon, high reliability of this optical transmission element can be realized at low cost.

Then, optical transmission elements according to various preferred embodiment of the present invention will now be described.

An optical transmission element 701 shown in FIG. 27 is arranged by forming on a p-type C-Si substrate 702, an optical transmission unit 704 of a pn structure, employing porous silicon 703, and also a switching modulation element 705 of an FET 708, for modulating an optical signal sent out from this optical transmission unit 704 in response to an input electric signal. The optical transmission unit 704 is composed of porous silicon 703 formed at one end of the p-type C-Si substrate 702; n-type μC-SiC 706 formed on this porous silicon 703; and an indium tin oxide (ITO) 707 fabricated on this n-type μC-SiC 706. The switching modulation element 705 is constructed of the FET 708 formed on the C-Si substrate 702.

Referring now to FIGS. 30A to 30D, a manufacturing stage of the optical transmission element 701 according t this preferred embodiment of the present invention will be explained. First of all, the p-type C-Si substrate 702 for making an ohmic ccontact by vapor-depositing an Al or Au layer 702a on one surface thereof is prepared. An SiO$_2$ film 711 functioning as an insulating layer is formed on the other surface of this C-Si substrate 702 by conducting any one of the plasma CVD, sputtering, and thermal oxidizing methods.

Figure 30A:
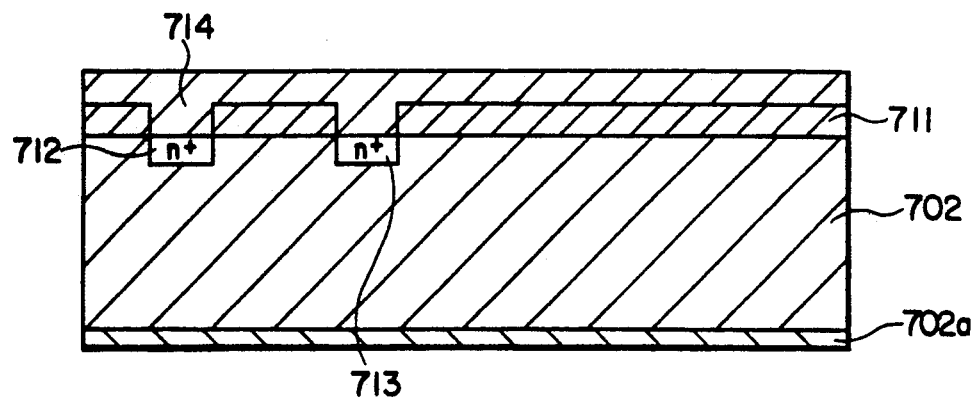
FIGS. 30A to 30D are explanatory diagrams for explaining the manufacturing element shown in FIG. 29.
Figure 30B:
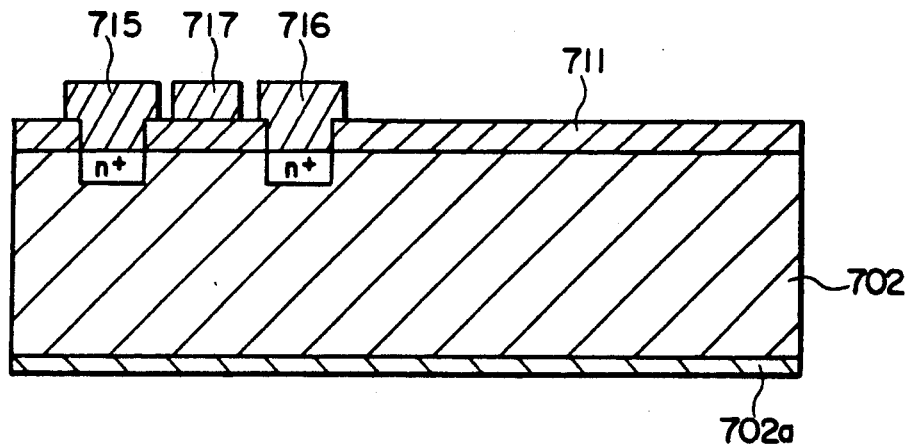

Subsequently, after the SiO$_2$ film 711 has been patterned, as represented in FIG. 30A, one pair of n+ layers 712 and 713 are formed on an upper portion of the C-Si substrate 702 by way of the ion implantation, or diffusion method. At the same time, an internal electrode layer 714 made of Al, Cr, or ITO is formed which passes through, or penetrates the SiO$_2$ film 711 to be contact with one pair of n+ layers 712 and 713. Then, this internal electrode layer 714 is patterned to fabricate, as shown in FIG. 30B, a source electrode 715, a drain electrode 716, which are in contact with one pair of n+ layers 712 and 713, and also a gate electrode 717 on the above-explained SiO$_2$ film 711.

Figure 30C:
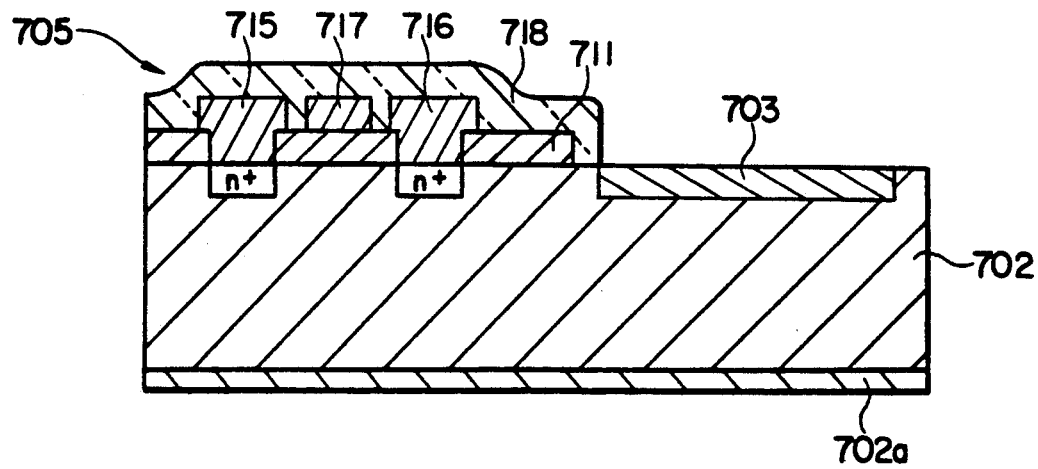

Subsequently, as represented in FIG. 30C, an SiO$_2$ film (otherwise, Si$_3$N$_4$ film) 718 functioning as an insulating layer is patterned in such a manner that this film covers the source electrode 715, the drain electrode 716 and the gate electrode 717, by way of the plasma CVD or the sputtering process.

Then, porous silicon 703 is formed at a region adjacent to a region where the above-explained switching modulation element 705 above the C-Si substrate 702 is formed. This porous silicon 703 may be formed in such a way that, for instance, p-type C-Si having plane orientation of (1111) and (100), and resistivity of 0.1 to 40 Ωcm is employed as the p-type C-Si substrate 702, and dipped into a water solution of ethyl alcohol and hydrogen fluoride (water solution of 48%)=0.1:1 to 5:1 under current density of 5 to 50 mA/cm$^2$ and electrochemical anodization time from 1 to 5 minutes. Furthermore, the resultant porous silicon is processed by the photochemical etching, or dipped into a KOH solution for several seconds to several minutes to remove impurities existing on the surfaces of this porous silicon 703.

Figure 30D:
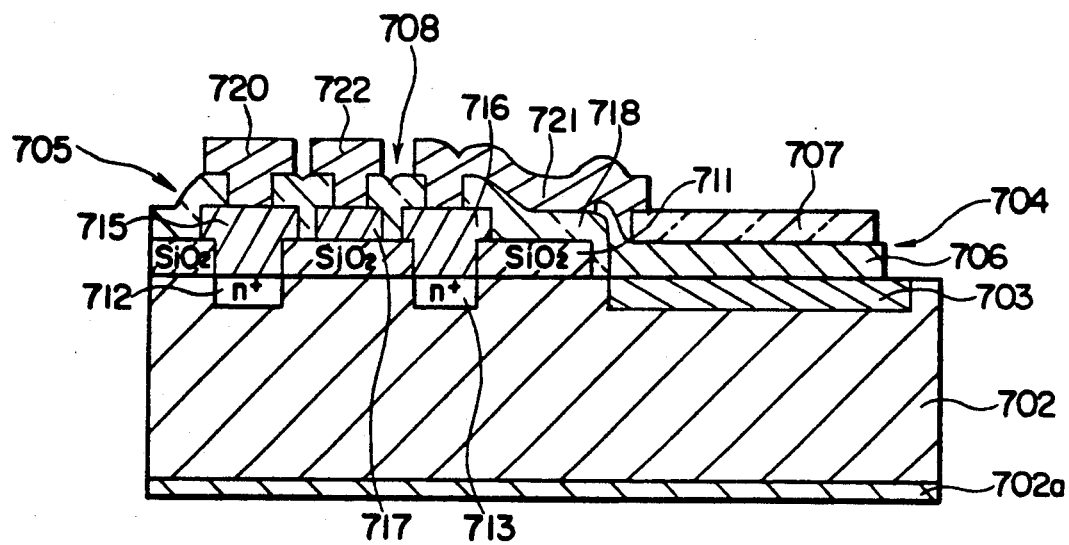

Next, as shown in FIG. 30D, both films of the n-type μC-SiC 706 and the ITO 707 are formed on the porous silicon 703, and thereafter are patterned to fabricate the optical transmission unit 704.

Furthermore, the above-explained SiO$_2$ film 718 is again patterned. After holes have been made in the upper surfaces to the source electrode 715, the drain electrode 716, and the gate electrode 717, as represented in FIG. 30D, a film of a metal electrode 720 in contact with the source electrode 715 is formed on the SiO$_2$ film 718. Similarly, a film of a metal electrode 721 in contact with the drain electrode 716 is formed on the SiO$_2$ film 718, and also a film of a metal electrode 722 in contact with the gate electrode 717 is formed thereon. The metal electrode 721 in contact with the drain electrode 716 is also made in contact with the ITO 707.

Figure 29:
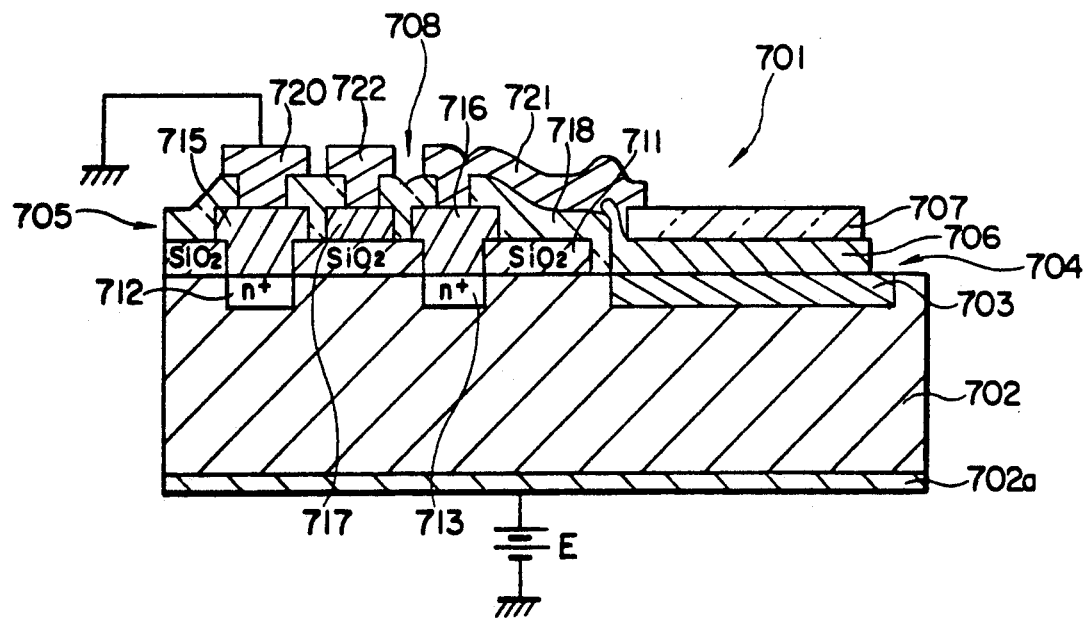
FIG. 29 is a sectional view of a light transmitting element, according to one embodiment, with employment of the light emitting element of the present invention.
Figure 31:
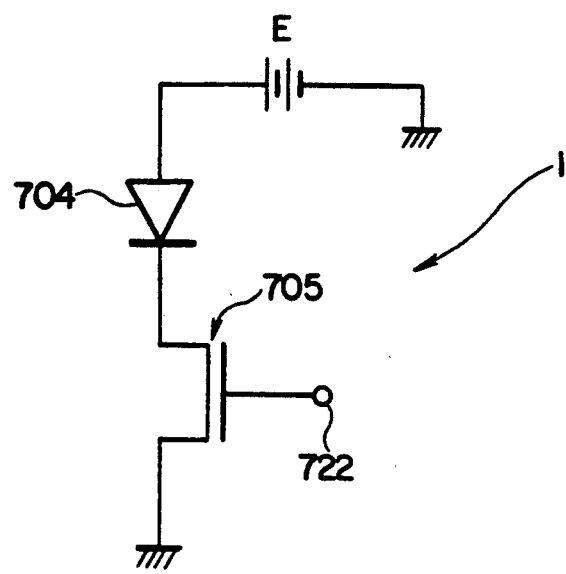
FIG. 31 is an equivalent circuit diagram of the light emitting element shown in FIG. 29.

In addition, the anode of the power supply unit (DC source) E is connected to the Al layer 702a of the C-Si substrate 702, and also the metal electrode 720 in contact with the above-explained source electrode 715 is grounded, so that the optical transmission element 701 shown in FIG. 29 can be obtained. An equivalent circuit of this optical transmission element 701 is indicated in FIG. 31.

In accordance with the optical transmission element according to this preferred embodiment, when a signal having a level higher than the level at which the FET can be turned ON, is inputted to an input of this transmission element, this optical transmission element emits light.

The optical transmission element 701 according to this preferred embodiment is arranged by fabricating on one sheet of the C-Si substrate 702, the optical transmission unit 704 having the pn junction employing the porous silicon 703, and the switching modulation element 705 for modulating the optical signal transmitted from this optical transmission unit 704 in response to the input electric signal. The C-Si substrate 702 owns various merits, namely low cost and high physical reliability, as compared with the substrate with employment of the compound semiconductor such as GaAs. Accordingly, both the optical transmission unit 704 having the pn junction structure with employing the porous silicon 703, and the switching modulation element 705 for modulating the optical output from this optical transmission unit 704 may be readily assembled by way of the conventional semiconductor manufacturing process. As a consequence, the optical transmission element 701 of this preferred embodiment can be manufactured at low cost with high reliability.

Since the porous silicon 703 is employed as the optical transmission unit 704, the simple and superior optical transmitting function can be achieved.

Furthermore, since both the switching modulation element 705 and the optical transmission unit 704 have been formed on the C-Si substrate 702 in a monolithic form, the optical transmission unit 704 and the switching modulation element 705 may be mounted as pixels on a single wafer at high density, so that high integration of such pixels can be achieved.

Figure 32:
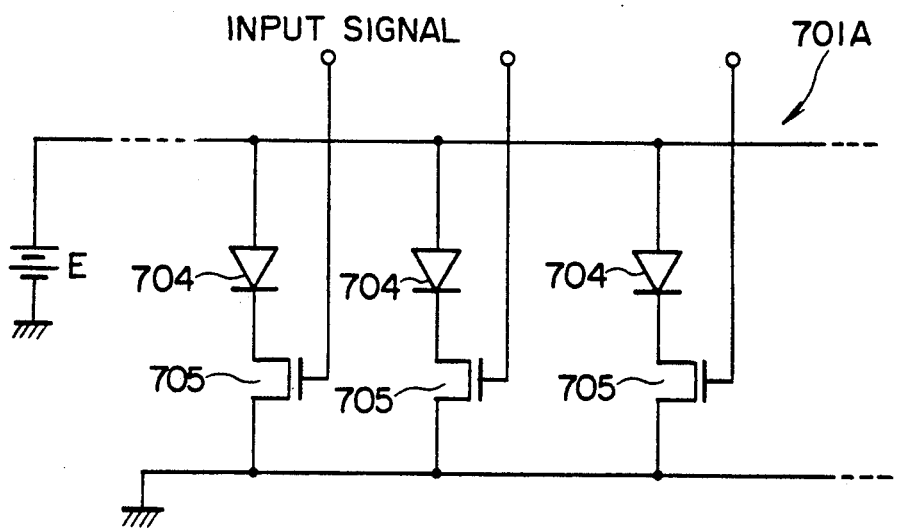
FIG. 32 is an equivalent circuit diagram of a light transmitting apparatus arranged by employing a plurality of light transmitting elements indicated in FIG. 29.
Figure 33:
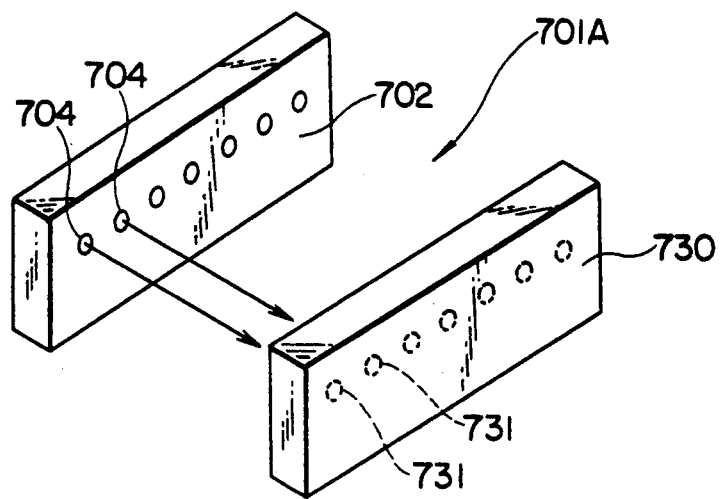
FIG. 33 schematically shows a perspective view of a arrangement of the light transmitting apparatus shown in FIG. 32.
Figure 34:
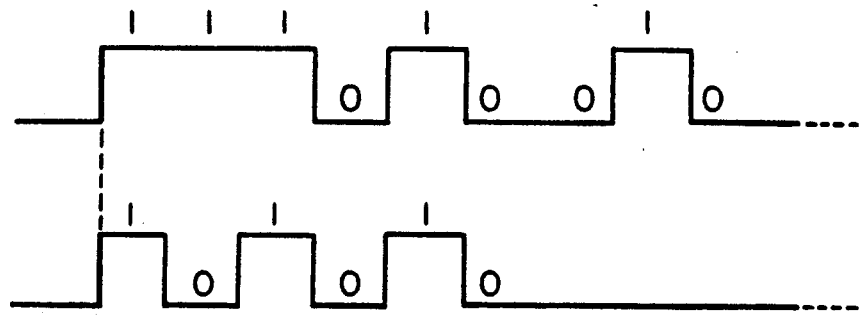
FIG. 34 represents a waveform of a light signal transmitted from the light transmitting apparatus of FIG. 29.

Referring now to FIGS. 32 to 34, a more practical optical transmission element 701A arranged by using a large number of above-explained optical transmission elements 701 in a matrix form will now be described.

The optical transmission element 701A shown in FIGS. 32 and 33 is so arranged that the respective optical transmission units 704 of the plural optical transmission elements 701 are aligned on one sheet of C-Si substrate 702.

Then, as shown in FIG. 34, an input signal is applied to the respective switching modulation elements 705 with regard to the respective optical transmission units 704 as a voltage signal such as 1, 1, 1, 0, 1, 0. 0.1, - - -, and 1, 0, 1, 0, 1, 0, - - -, ("1" denotes a voltage higher than a threshold value at which FET 705 is turned ON, and "0" represents other voltages). As a result, an optical multiplex transmission can be achieved in which the optical signals modulated by the respective optical transmission units 704 are transmitted in a parallel form to the respective light receiving elements 731.

Figure 35:
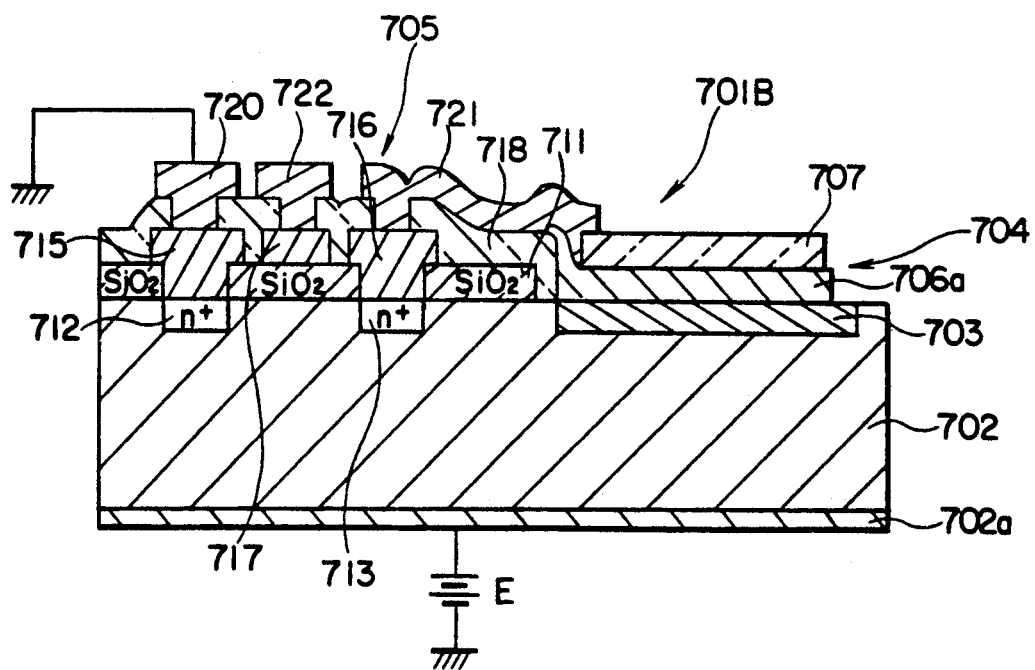
FIG. 35 is a sectional view of a light emitting element, according to another embodiment, with employment of the light emitting element of the present invention.

FIG. 35 shows another optical transmission element 710B according t another preferred embodiment of the present invention. This optical transmission element 710B employs n-type a-SiC 706a instead of n-type μC-SiC of the optical transmission element 701. In case of this optical transmission element 701B, since the 706a n-type a-SiC can be manufactured by the normal plasma CVD, the manufacturing cost can be lowered. To the contrary, n-type μC-SiC 706 must be manufactured by way of the ECR PCVD method. However, when the n-type a-SiC is used, it involves a problem that the brightness of emitted light is lowered.

Figure 36:
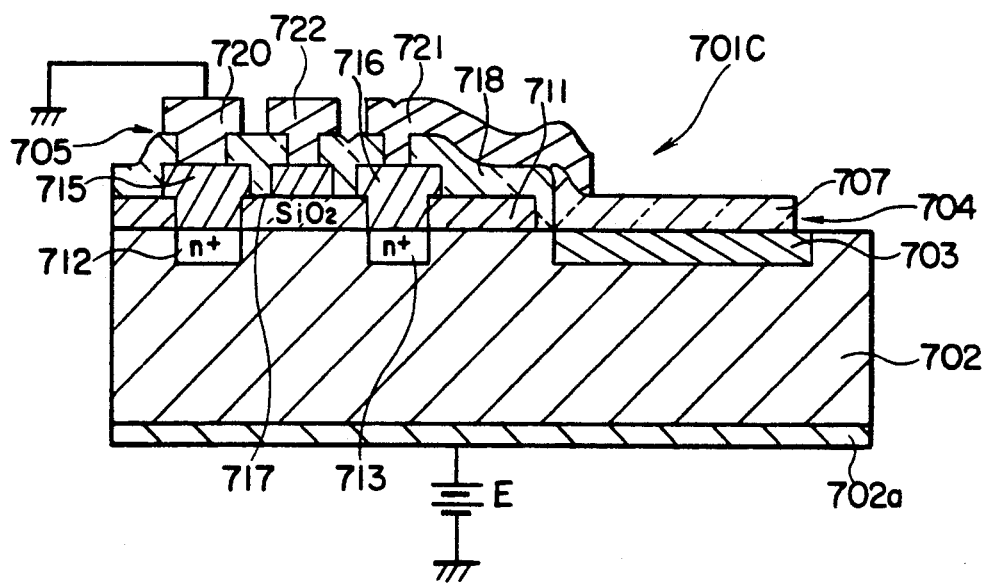
FIG. 36 is a sectional view of a light emitting element, according to a further embodiment, with employment of the light emitting element of the present invention.

FIG. 36 represents another optical transmission element 701C according to a further preferred embodiment, in which only an ITO 707 is fabricated on the porous silicon 703. However, when the ITO is used, it involves a problem that the brightness of the emitted light is lowered.

Then, a photocoupling circuit employing the light emitting element according to the present invention will now be described. This photocoupling circuit element is suitable for such an element to perform an optical communication capable of responding to a demand of multiprocessor architecture in a computer.

Conventionally, the three-dimensional photocoupling circuit element capable of performing a data communication among circuit elements such as memories by utilizing an optical signal in order to respond to a demand of multiprocessor architecture in a computer, has been proposed ("Parallel Process System realized by 3-Dimensional Shared Memory" in Electronics, October 1991.

This conventional 3-dimensional photocoupling circuit element is structured in such a manner that the light emitting diode made of the compound semiconductor with employment of GaAs is assembled in one wafer, and also the light receiving element is assembled into another wafer, while the light emitting element is positioned opposite to the light receiving element.

However, in case of the above-explained conventional photocoupling circuit element, the light emitting element must be fabricated by employing at least such an expensive compound semiconductor as GaAs. A photocoupling circuit element according to the present invention is arranged by employing a light emitting element with use of porous silicon.

Referring now to drawings, a photocoupling circuit element according to a preferred embodiment of the present invention will be described. A photocoupling circuit element 801 shown in FIG. 37 is so constructed that both of a C-Si substrate 804 for assembling a light transmission element 802 constructed of a pn junction with porous silicon 803, for transmitting an optical signal, and also a substrate 805 for assembling a light receiving element 806 to receive an optical signal transmitted from the optical transmission element 802 are employed, while the light transmission element 802 is positioned opposite to the light receiving element 806.

The optical transmission element 802 is fabricated by porous silicon 803 formed on one plane (upper surface) of the p-type C-Si substrate 804 and n-type μC-SiC 807 formed on this porous silicon 803. On this n-type μC-SiC 807, a film of lower ITO (indium tin oxide) 808 is fabricated, and a film of an SiO$_2$ film 809 functioning as a transparent insulating film is fabricated over the lower ITO 808 and the C-Si substrate 804.

The light receiving element 806 is made of the n-type μC-SiC 810 formed at the lower surface of the other substrate 805 of C-Si. A film of upper ITO 811 is formed on lower surface of the n-type μC-SiC 810 and the C-Si substrate 805, and also an SiO film 812 functioning as a transparent insulating film is formed over the lower surfaces of this upper ITO 811 and the substrate 805.

Figure 37:
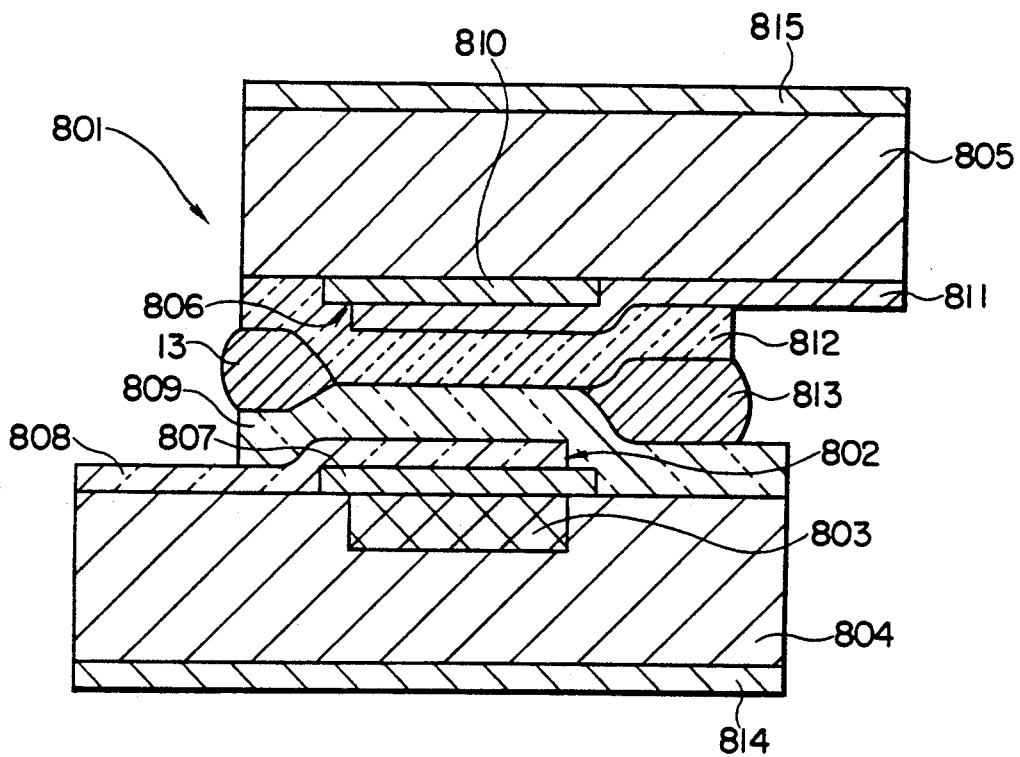
FIG. 37 is a sectional view of a photocoupling circuit element, according to one embodiment, with employment of the light emitting element of the present invention.

As illustrated in FIG. 37, the optical transmission element 802 is joined via the SiO$_2$ films 809 and 812 to the light receiving element 806, and also the SiO$_2$ films 809 and 812 are joined to each other by transparent adhersive agent 813 in an integral form. It should be noted in FIG. 37 that reference numeral 814 indicates an Al layer formed on the other surface of the C-Si substrate 804, and reference numeral 815 denotes an Al layer formed on the other surface of the C-Si substrate 805.

Figure 38A:
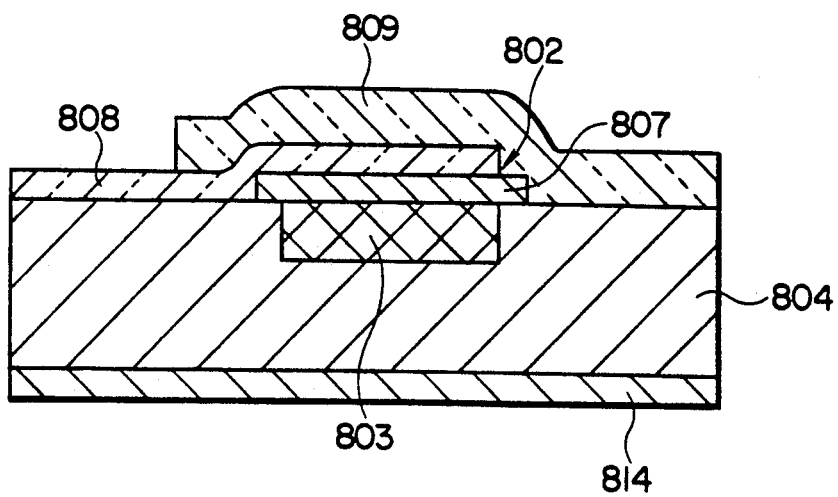
FIGS. 38A to 38C are explanatory diagrams for explanating the manufacturing stages of the photocoupling circuit element shown in FIG. 37.

Referring now to FIGS. 38A to 48C, a manufacturing step of the photocoupling circuit element 801 will be explained. As shown in FIG. 38A, a p-type C-Si substrate 804 making an ohmic contact by vapor-depositing the Al layer 814 is prepared, and porous silicon 803 is formed on the upper surface of this C-Si substrate 804. This porous silicon 803 may be formed in such a way that, for instance, p-type C-Si having plane orientation of (1111) and (100), and resistivity of 0.1 to 40 Ωcm is employed as the p-type C-Si substrate 804, and dipped into a water solution of ethyl alcohol and hydrogen fluoride (water solution of 48%)=0.1:1 to 5:1 under current density of 5 to 50 mA/cm$^2$ and electrochemical anodization time from 1 to 5 minutes. Furthermore, the resultant porous silicon is processed by the photochemical etching, or dipped into a KOH solution for several seconds to several minutes to remove impurities existing on the surfaces of this porous silicon 803.

Next, as shown in FIG. 38A, the n-type μC-SiC film 807 is formed on the porous silicon 803, and thereafter is patterned. Furthermore, a lower ITO film 808 is formed on this n-type μC-SiC 807 and the C-Si substrate 804, which will then be patterned. Then, an SiO$_2$ film 809 functioning as a transparent insulating film is formed by the plasma CVD or the sputtering process over the surface of the lower ITO 808 and C-Si substrate 804, which will then be patterned, so that the light transmission element 802 has been manufactured.

On the other hand, the light receiving element 206 is manufactured in accordance with the below-mentioned manufacturing stages.

Figure 38B:
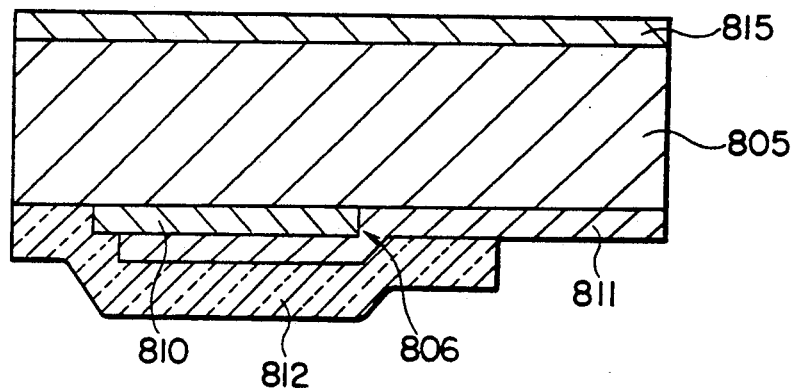

First, as indicated in FIG. 38B, n-type μC-SiC film 810 is formed on a lower surface of the substrate 805 made of the C-Si on which the Al layer 815 has been formed, and thereafter is patterned. Subsequently, a upper ITO film 811 is formed on the lower surfaces of this n-type μC-SiC 810 and the substrate 805, which will then be patterned. Furthermore, an SiO$_2$ film 812 functioning as a transparent insulating film is fabricated over the lower surfaces of the upper ITO 811 and the C-Si substrate 805 by way of the plasma CVD or the sputtering process, which will then be patterned, so that the light receiving element 806 has been manufactured.

Figure 38C:
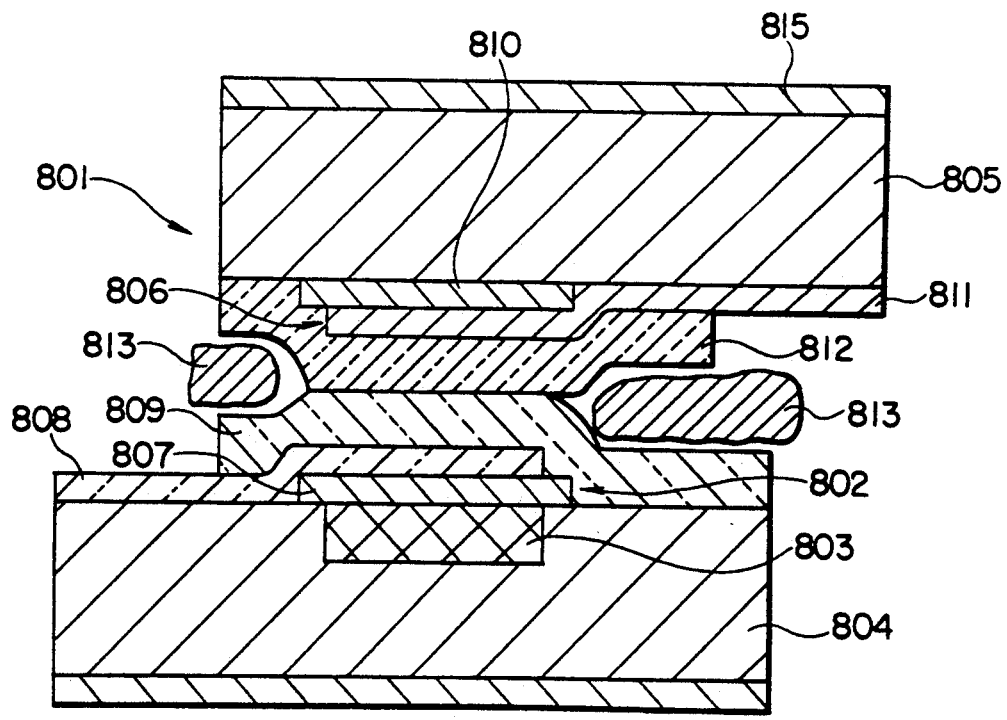
Figure 39:
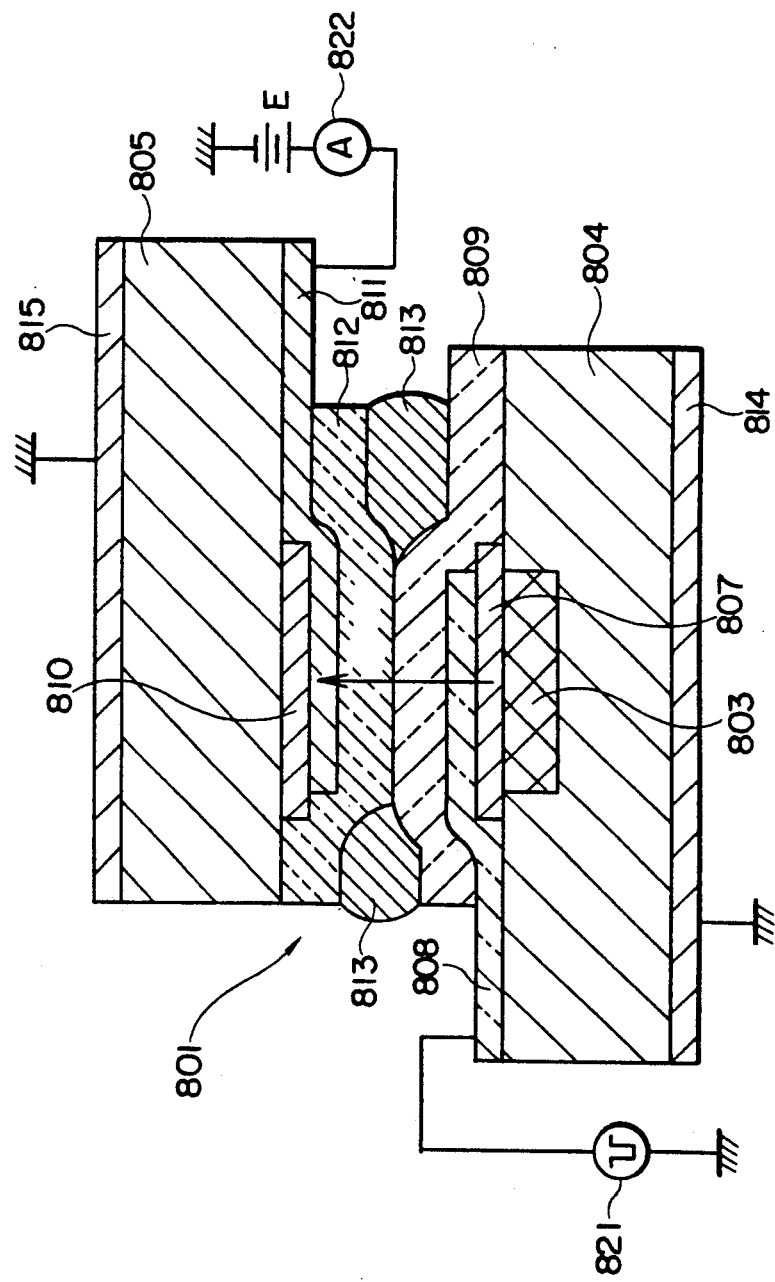
FIG. 39 is a circuit diagram used when a light emission experiment of the photocoupling circuit element shown in FIG. 37 is performed.

After the light transmission element 802 and the light receiving element 806 have been fabricated in the above-explained manner, as illustrated in FIG. 38C, the SiO$_2$ film 809 of the light transmission element 802 is stacked on the SiO$_2$ film 812 of the light receiving element 806, and a transparent adhersive agent 813 is filled with edge regions of these films, so that the photocoupling circuit element 801 as shown in FIG. 37 can be obtained.

Figure 40:
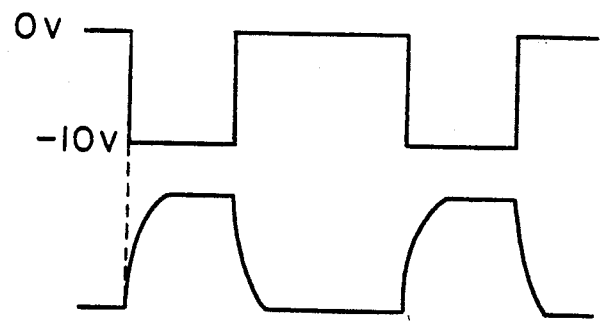
FIG. 40 represents waveforms of a pulse signal and a detection current appearing in the light emitting experiment effected by the circuit diagram shown in FIG. 39.

FIG. 37 represents such an arrangement to test light emission of the photocoupling circuit element 801. In this arrangement, a pulse oscillator 821 is connected to the Al ITO layer 808 of the light transmission element 802, and also the Al layer 814 of the light transmission element 802 and the Al layer 815 of the light receiving element 806 are grounded. Furthermore, an ammeter 822 and a DC power supply E are connected to the upper ITO 811 of the light receiving element 806. In such a circuit arrangement, as illustrated in FIG. 40, when a pulse voltage having an amplitude of −10 V is applied by the pulse oscillator 821 to the light transmission element 802, light is transmitted from this light transmission element 802 to the light receiving element 806. As a result, it could be recognized that a current having a waveform as shown in FIG. 40 is flown through the ammeter 822 connected to the light receiving element 806.

In accordance with the photocoupling circuit element 801 with the above-described arrangement, since the manufacturing cost of the C-Si substrate 804 and 805 is low and the physical reliability thereof is high, as compared with those of the substrate with employment of the compound semiconductor, the light transmission element 802 having the pn junction structure with employment of the porous silicon 803 may be easily assembled. As a result, the photocoupling circuit element 801 owns such advantages as low cost and high reliability.

Also, since the porous silicon 803 is used as the light transmission element 802, simple and superior transmission functions can be achieved.

Figure 41:
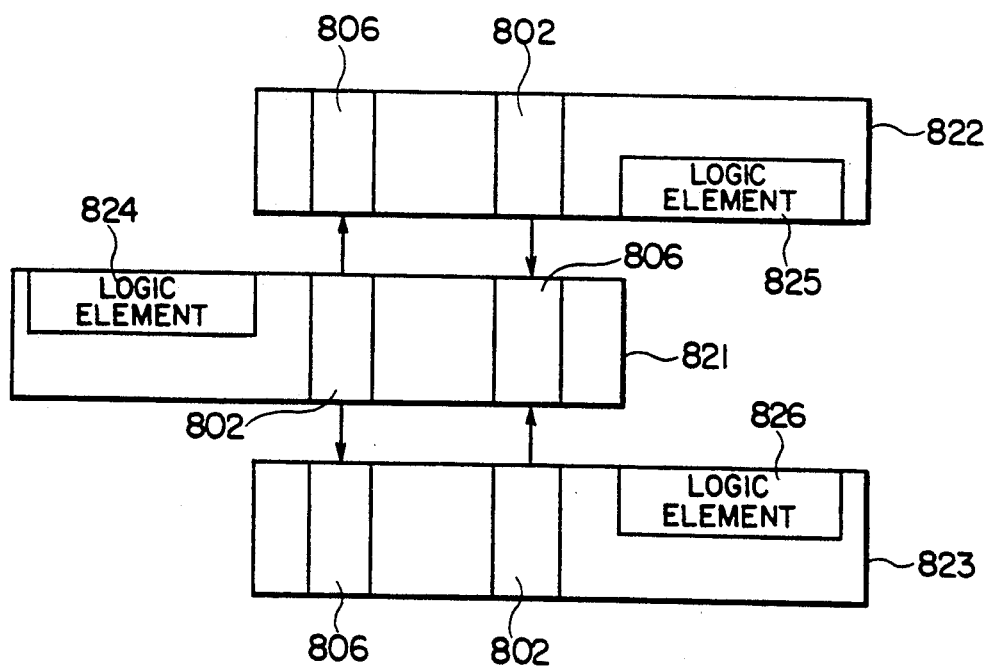
FIG. 41 schematically represents a structure of a light signal transfer apparatus arranged by employing a plurality of photocoupling circuit elements shown in FIG. 37.

FIG. 41 schematically represents an application example of the above-described photocoupling circuit element 801. If the above-described light transmission elements 802 and light receiving elements 806 with the above-explained circuit arrangements would be assembled into substrates 821, 822 and 823 made of C-Si in such a manner that the light transmission elements are positioned opposite to the light receiving elements and also logic elements 824, 825 and 826 such as memories and CPU would be assembled into the respective substrates 821, 822 and 823, then the respective substrates 821, 822 and 823 would be arranged in a parallel form so as to transmit the light (optical) signals derived from the respective light transmission elements 802 to the respective light receiving elements 806. As a consequence, the signal transfer could be performed from the respective light transmission elements 802 to the respective light receiving elements 806 in parallel with the operations of the respective logic elements 824, 825 and 826, which can respond to the demand of the multiprocessor architecture.

As previously explained in detail, according to the preferred embodiments, since the photocoupling circuit elements own the above-described arrangements, the superior optical transmission function with the low cost can be realized and also the demand for the multiprocessor architecture can be satisfied.

A description will now be made of a photocoupling element with employment of the light emitting element according to the present invention. This photocoupling element includes a light emitting element formed by sandwiching porous silicon with a p-type semiconductor and a n-type semiconductor, a light receiving element, and an optical transmission means for transmitting optical information transmitted by the light emitting element to the light receiving element. These light emitting element, light receiving element and optical transmission means are fabricated on a substrate in a monolithic state.

Figure 42:
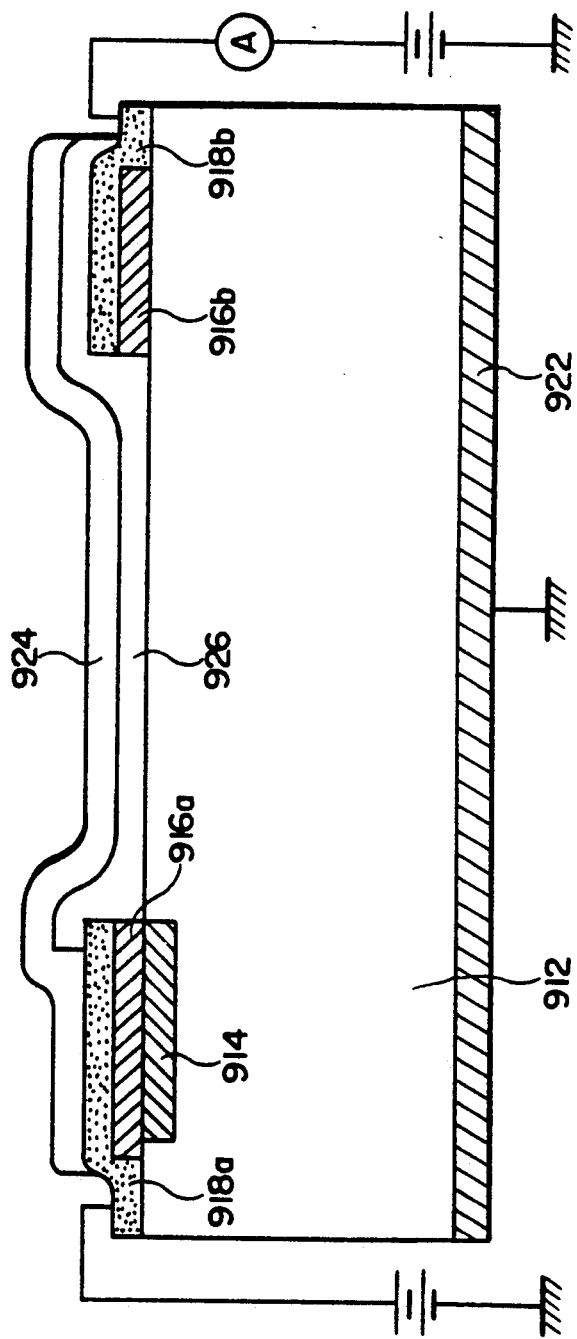
FIG. 42 is a sectional view of a photocoupling element with employment of the light emitting element of the present invention.

Referring now to drawings, a photocoupling element according to one preferred embodiment will be explained. FIG. 42 schematically shows a structure of the photocoupling element of this preferred embodiment.

The photocoupling element shown in FIG. 42 is comprised of a light emitting element and a light receiving element formed on a substrate in a monolithic form, and an optical waveguide path functioning as the optical transmission means for transmitting light emitted from the light emitting element to the light receiving element. The light emitting element is so fabricated that a porous silicon layer 914 is formed on a surface of a p-type C-Si substrate 912 and an n-type $\mu$C-SiC 916a is furthermore formed on this porous silicon layer 914. The light receiving element is fabricated by forming an n-type $\mu$C-SiC layer 916b on a surface of the p-type C-Si substrate 912. Transparent electrodes 918a and 918b are formed by ITO (indium tin oxide) films on the n-type $\mu$C-SiC 916a and 916b, whereas an electrode 922 is made of an Al layer on a rear surface of the p-type C-Si substrate 912. The optical waveguide path is formed by a barium borosilicate glass 924 over the transparent electrodes 918a, 918b, and between the light emitting element and the light receiving element.

Then, a method for manufacturing the photocoupling element shown in FIG. 42 will now be explained.

First, aluminum (Al) is vapor-deposited on a rear surface of the p-type single crystal silicon substrate 912 (crystal plane (100) and resistivity 0.1 to 40 cm) to make an ohmic contact, so that the electrode 922 is fabricated.

Thereafter, in a similar manner to that of the opto-optical converting element shown in FIG. 20, the porous silicon layer 914 is fabricated on the surface of the p-type C-Si substrate 912 by the electrochemical anodization method. Subsequently, the n-type $\mu$C-SiC 916a and 916b are formed by the ECR PCVD method.

Thus, the fabricated n-type $\mu$C-SiC is removed except for an upper portion of the porous silicon layer 914 and a portion for forming the light receiving element, so that the n-type $\mu$C-SiC 916a and 916b can be obtained and the light emitting element an the light receiving element can be fabricated.

Next, after the ITO film is deposited by employing the electron beam vapor deposition apparatus, the transparent electrodes 918a and 918b are formed. Next, after a qualtz glass 926 with a thickness of approximately 3 $\mu$m has been formed by using the sputtering apparatus, a patterning operation is carried out in order to expose a portion of the transparent electrodes 918a and 918b as shown in FIG. 42. Then, furthermore, the barium borosilicate glass 924 having a thickness of approximately 1 $\mu$m is formed by employing the sputtering apparatus to fabricate the optical waveguide path. It should be noted that both ends of the barium borosilicate glass 924 must be patterned so as to expose a portion of the transparent electrodes 918a and 918b, and also in order that the light emitted from the light emitting element can be effectively conducted into the optical waveguide path and also the light can be effectively incident upon the light emitting element. Finally, the electrode 922 is grounded and the transparent electrodes 918a and 918b are connected to the power supply, so that the photocoupling element shown in FIG. 42 can be obtained.

An operation of the photocoupling element according to this preferred embodiment will now be described.

Upon input of an electric signal, the light emitting element emits light, since electrons and holes are recombined with each other at the porous silicon layer 914, and then this light 914, and then this light is conducted to the optical waveguide path. A refractive index "$n_2$" of the barium borosilicate glass 924 for forming the optical waveguide is 1.58. Since this refractive index is greater than the refractive index "$n_1$" (=1.459) of the qualtz glass 926 and the refractive index "n" (=1) of air, the total reflection of this light can occur within the optical waveguide path and thus this light can be transmitted to the light receiving element. Then, when the light transmitted through the optical waveguide path is entered into the n-type μC-SiC layer 916b from the upper part of the light receiving element, pairs of electrons and holes are generated by the light incident upon the light receiving element and a current flows, so that a transfer of the electric signal is performed.

In accordance with this preferred embodiment, the light emitting element is constructed by sandwiching the porous silicon layer with the p-type C-Si and the n-type μC-SiC film. As a consequence, the electrons and the holes can be easily entered into the porous silicon layer functioning as the light emitting layer, and the light emitting element with the better pn junction structure can be obtained. Accordingly, the photocoupling coupling element can have a simple structure at low cost by forming this light emitting element and the light receiving element made by silicon on the substrate in a monolithic form, as compared with those of the conventional photocoupling element manufactured by employing the compound semiconductors. In addition thereto, such a photocoupling element with high integration and high reliability can be obtained. Thus, the photocoupling element of this preferred embodiment is suitable to be utilized as an element with high reliability and a highspeed signal transfer characteristic for a computer.

Subsequently, a description will now be made of a plane type display apparatus with employment of the light emitting element according to the present invention, which is utilized in a television, a display monitor, and a view finder and so on.

Conventionally, as the plane type display device, a liquid crystal display, an electroluminescence display, a plasma display, an LED display and the like have been practically utilized.

However, the liquid crystal display has such a problem that the liquid crystal display is not of the self-emission type display, but requires a back light source, a viewing angle thereof is narrow, and high precision pixel below than 50 μm per one pixel cannot be achieved. Both of the electroluminescence display and the plasma display own a problem that since drive voltages thereof are very high, e.g., above 100 V, specific power supply units are required. To the contrary, although the LED display is of the self-emission type display, since this LED display is manufactured by the compound semiconductors of GaAs or InP group at the present stage, there are drawbacks of high cost as compared with that of the silicon material group, and also reliability thereof is low. Also, there is another problem that the drive circuit can be hardly fabricated with the LED display in the monolithic form. In other words, although a large LED screen may be constructed by arranging LEDs one by one, there is no such a large LED screen in which a large number of pixels have been assembled on a single wafer.

A display device according to one preferred embodiment of the present invention will now be described in detail.

Figure 43:
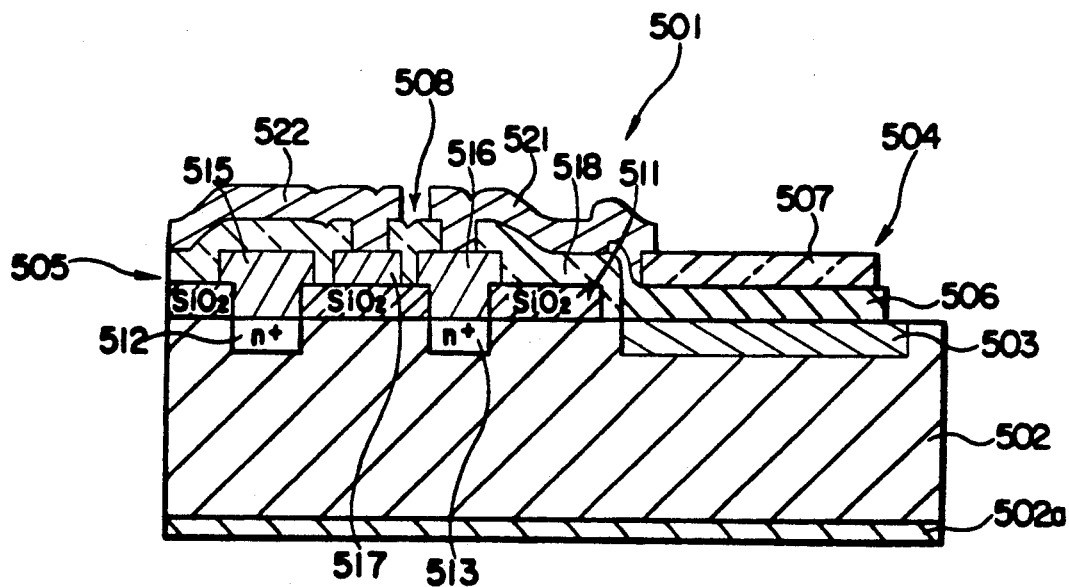
FIG. 43 is a sectional view of a structure of a display device with employment of the light emitting element according to the present invention.

A display device 501 shown in FIG. 43 is arranged in such a way that a light emitting element 504 having a pn junction structure with employment of porous silicon 503 and a switch element 505 for selecting this light emitting element 504 are formed on a p-type C-Si substrate 502. The light emitting element 504 comprises porous silicon 503 formed on this C-Si substrate 502, n-type μC-SiC 506 formed on this porous silicon 503, and an indium tin oxide (ITO) 507 formed on this n-type μC-SiC 506. The switch element 505 is constructed of a transistor 508 which has been formed on the C-Si substrate 502.

Figure 44:
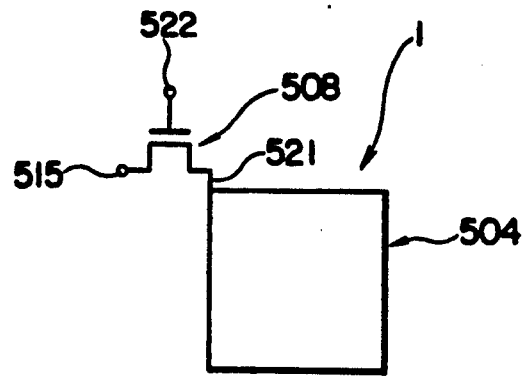
FIG. 44 is an equivalent circuit diagram of the display apparatus shown in FIG. 43.

This display device may be manufactured in a manner similar to that of the light transmission element 701 shown in FIG. 29, which has been explained with reference to FIGS. 30A to 30D. An equivalent circuit of this display device is shown in FIG. 44.

The display device 501 according to this preferred embodiment is arranged in such a manner that both of the light emitting element 504 with the pn junction structure with employment of the porous silicon 503 and the switch element 505 for selecting this light emitting element 504 are formed on one sheet of the C-Si substrate 502. The C-Si has such advantages that the manufacturing cost thereof is low, and the physical reliability thereof is high, as compared with those of the substrate with employment of the compound semiconductor. As a result, both of the light emitting element 504 having the pn junction structures with employment of the porous silicon 503, and also the switch element 505 for selecting this light emitting element 504 can be readily assembled in accordance with the conventional semiconductor manufacturing process. As a consequence, the display apparatus 501 according to this preferred embodiment can be made at low cost with having high reliability.

Also, since the porous silicon is employed as the light emitting element, simple and superior display functions can be achieved.

In addition, since the drive circuit may be formed together with the display device on the C-Si substrate in the monolithic state, both of the display device and the drive circuit may be mounted on a single wafer at high package density.

Figure 45:
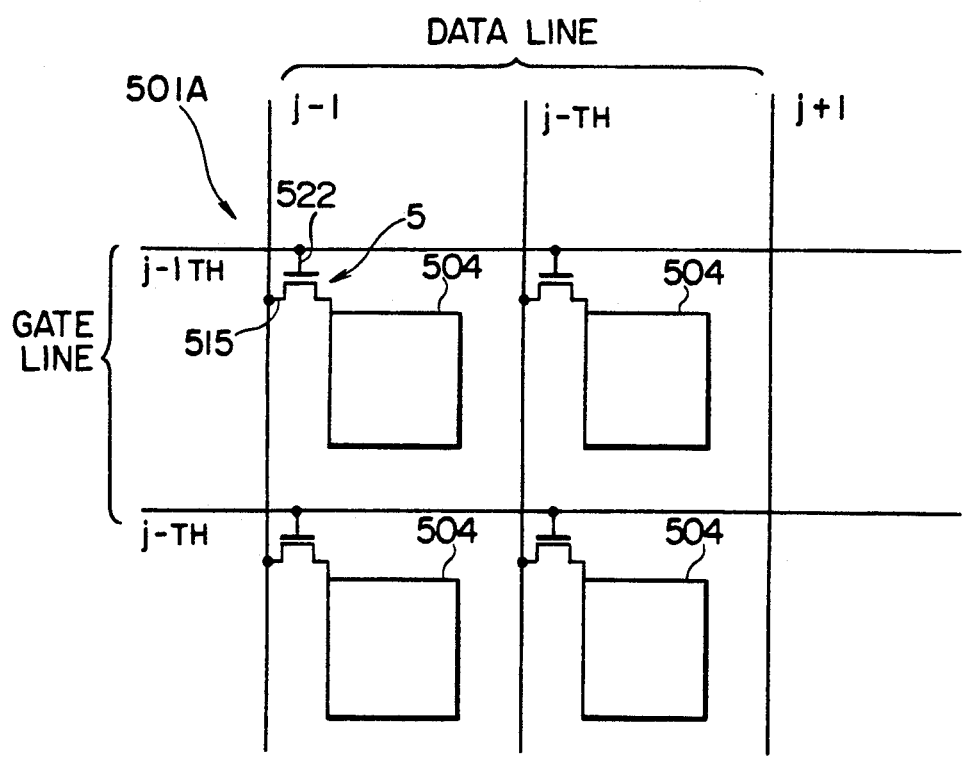
FIG. 45 is a equivalent circuit diagram of a display apparatus in which a plurality of display devices shown in FIG. 43 are arranged in a matrix form.
Figure 46:
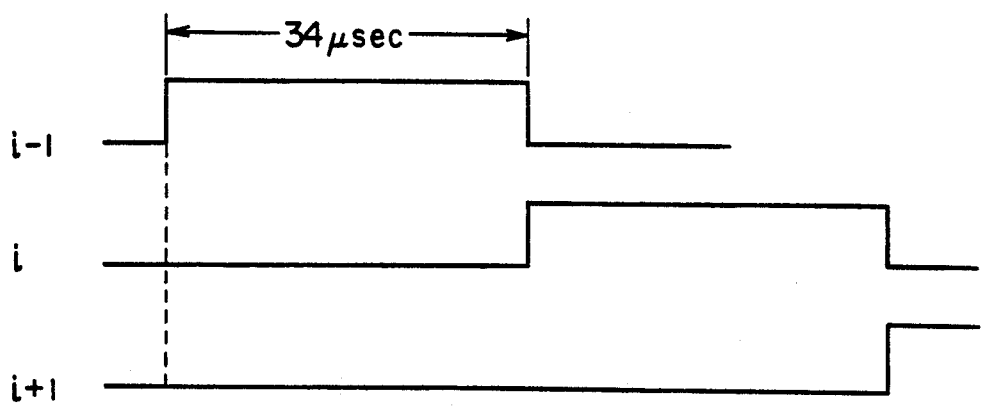
FIG. 46 shows a waveform chart for indicating drive pulses of the display apparatus shown in FIG. 45.

Referring now to FIGS. 45 and 46, a more practically arranged display apparatus 501A will be explained in which a large quantity of above-described display device 501 are arranged in a matrix form. The display apparatus 501A equivalently displayed in FIG. 45 is so arranged that each of the light emitting elements 504 employed in the display device 501 is used as a unit pixel, and a matrix is formed by 480 columns X 480 lines.

Then, each of source electrodes 515 of the selecting element 505 for selecting the respective light emitting elements 504, is connected to each of data lines, - - -, j−1, j, j+1, - - -, arranged along the line direction, whereas each of gate electrodes 522 is connected to each of gate lines, — - - -, i−1, i, i+1, - - -, arranged along the column direction.

Assuming now that 60 sheets of images are displayed per 1 minute on the display apparatus 501A having such an arrangement, a pulse of 34 μsec (namely, 1/60×1/480) is sequentially supplied to the gate line, - - -, i−1, i, i+1, - - -, by a drive circuit (not shown) such as a shift register. Also, as to data, the data are required to be supplied to the respective pixels 1, 2, - - -, j−1, j, j+1, - - -, during 34 μsec. As a consequence, a pulse having 71 nsec (=34 μsec/480) may be sequentially sent to the data lines, - - -, j−1, j, j+1, - - -. In this case, it is preferable that 1-line data are stored in a memory (not shown) and then 1-line data are entirely sent.

Figure 47:
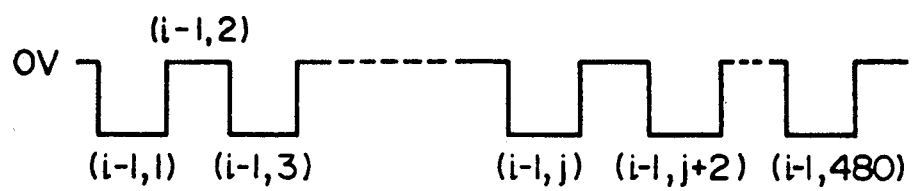
FIG. 47 schematically represents a light emission control of the display apparatus shown in FIG. 45.

A light emission control of the respective light emitting elements 504 is performed as follows:

For instance, if the (i, j) light element 504 is turned ON at this matrix circuit, it is so controlled that the gate pulse is supplied to the gate line (i) and simultaneously the data pulse is supplied to the data line (j). When the gate pulse is supplied to the gate line (i−1) and the data is supplied to the data lines 1, 3, - - -, j, j+2, - - -, as illustrated in FIG. 47, the respective light emitting elements 504 at the locations of (i−1, 1), (i−1, 3), - - -, (i−1, j), (i−1, j+2), - - -, are turned ON (light emission), but the respective light emitting elements 504, for example (i−1, 2), (i−1, 4), - - -, (i−1, j+1), - - - are not turned ON.

Figure 48:
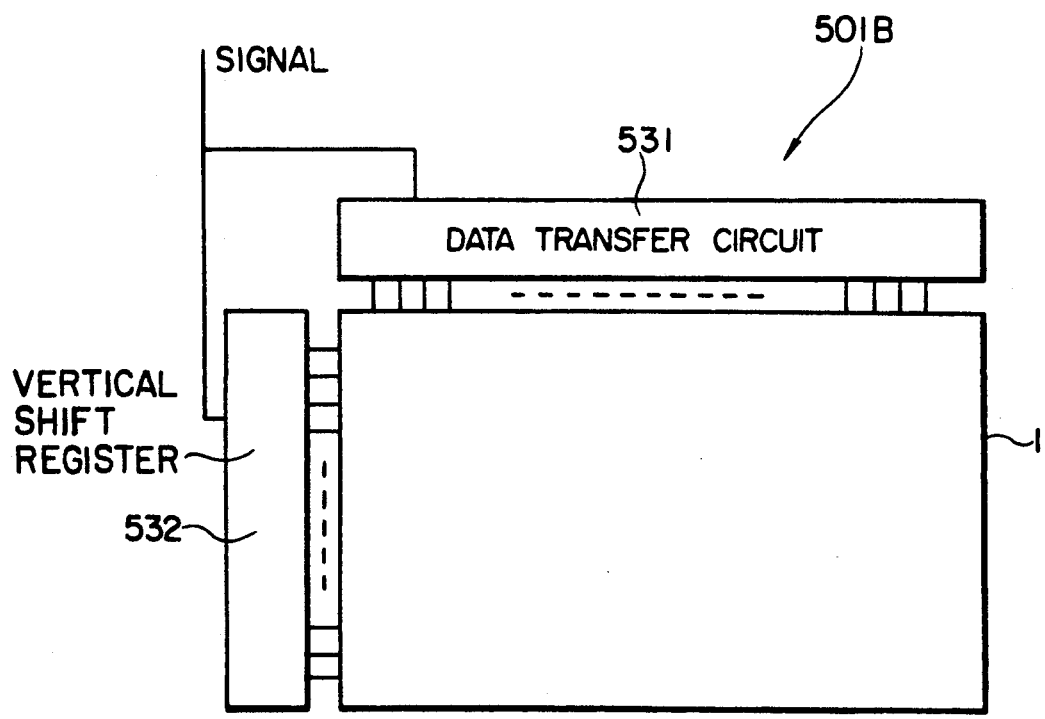
FIG. 48 schematically shows an arrangement of one modification for the display apparatus shown in FIG. 45.

In FIG. 48, there is shown a display apparatus 501B in which a vertical shift register 532 used for the gate lines, - - -, i−1, i, i+1, - - -, of the display apparatus 501A with the above-explained arrangement, and also a data transfer circuit 531 used for the data lines, - - -, j−1, j, j+1, - - -, have been assembled.

Figure 49:
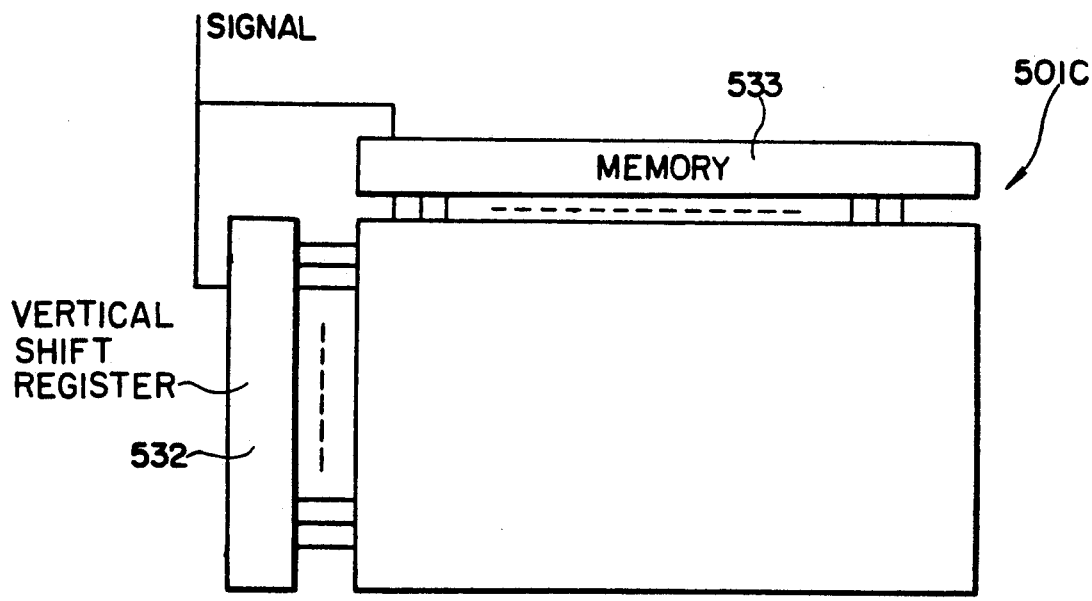
FIG. 49 schematically indicates an arrangement of another modification for the display apparatus indicated in FIG. 45.

FIG. 49 indicates a display apparatus 501C in which both of the vertical shift register 532 used for the gate lines, - - -, i−1, i, i+1, - - -, of the display apparatus 501A with the previously explained arrangement, and also a memory 533 used for the data lines, - - -, j−1, j, j+1, - - -, have been assembled.

In such a case of the display apparatuses 501B and 501C, although the drive circuits (namely, vertical shift register 531, data transfer circuit 532 and memory 533) may be provided outside these display apparatuses with the wire bonding connection, not provided on a single wafer, there is such a merit that when these drive circuits would be assembled on a single wafer in a monolithic state, a degree of component integration can be increased.

Figure 50:
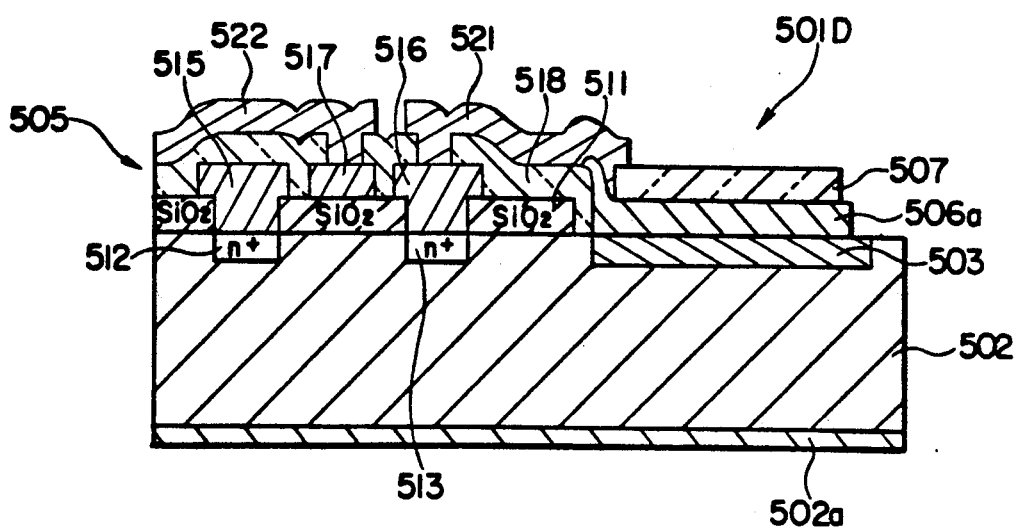
FIG. 50 is a sectional view for showing a modification of the display device shown in FIG. 43.

FIG. 50 represents a display device according to another preferred embodiment of the present invention. The display apparatus 501D shown in this drawing employs n-type a-SiC 506a instead of the above-explained n-type μC-SiC 506 employed in the display device 501. In case of this display apparatus 501D, since the n-type a-SiC 506a can be formed by the normal phase CVD, there is a merit in the manufacturing cost thereof, although the formation of the n-type μC-SiC 506 requires ECR PCVD. However, when using the n-α-SiC, it involves a drawback that the brightness of the emitted light is lowered.

Figure 51:
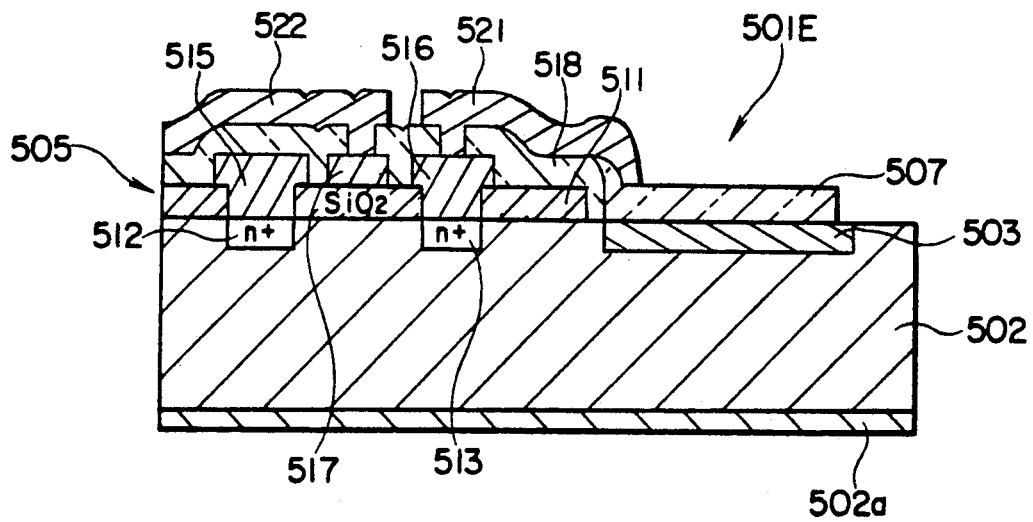
FIG. 51 is a sectional view for indicating another modification of the display device shown in FIG. 43.

FIG. 51 shows another display apparatus 501E according to a further preferred embodiment of the present invention, in which only ITO 507 is merely fabricated on the porous silicon 503. However, when using the ITO, it involves a drawback that the brightness of the emitted light is lowered.

Hereinbefore, various embodiments of opto-optical converting element, optical transmission element, photocoupling circuit element and display device according to the invention have been described. However, it should be understood that any of the embodiments of the present invention is not limited to those of the above-explained preferred embodiments, but may be varied without departing from the technical spirit and scope of the present invention. For instance, the n-type μC-SiC has been employed as the n-type semiconductor for constituting the light emitting element in the above-described preferred embodiments. For example, instead of the n-type μC-SiC, n-type a-SiC may be employed to realize, in principle, a light emitting element. In this case, to form the a-SiC, since the normal plasma CVD method may be employed, there is such a merit of an easy manufacturing method. However, there is a drawback of lowering electroluminescence intensity. That is because the band gap and the conductivity of the a-SiC are $10^{-5}$ S/cm at the band gap of 2.0 eV, namely both of the band gap and the conductivity of this a-SiC represent lower values than those of the μC-SiC.

Also, in the above-described preferred embodiments, for instance, an Au layer or an ITO film may be directly formed instead of the μC-SiC. In this case, similarly, although the structure of this opto-optical converting element can be made very simple, there is a drawback that electroluminescence intensity becomes low.

Furthermore, the respective semiconductors for constituting the respective elements may be fabricated by employing semiconductors having opposite conductivity types to those of the first-mentioned semiconductors in the respective preferred embodiments. In this case, there are two attending points in order to fabricate the above-mentioned elements. That is to say, to fabricate such a porous silicon layer into which the electrons can be injected effectively from the n-type C-Si substrate, the porous silicon layer must be formed on the n-type C-Si substrate, while irradiating light thereto. In case that, for example, a p-type μC-SiC is employed as the p-type semiconductor for constituting the light emitting element, although deposition conditions of the p-type μC-SiC, capable of injecting the electrons into the porous silicon layer, are substantially identical to those of the n-type μC-SiC, $B_2H_6$ impurity gas must be employed as the impurity gas instead of $PH_3$ impurity gas.

We claim:

1. A charge injection type light emitting element comprising:
   a pn junction constructed of porous silicon and a semiconductor having a conductivity type different from that of said porous silicon.

2. A charge injection type light emitting element as claimed in claim 1, wherein at least a portion of hydrogen adhered to surfaces of a plurality of holes in said porous silicon, is substituted by heavy hydrogen.

3. A charge injection type light emitting element as claimed in claim 1, wherein said porous silicon is formed on a single crystal silicon substrate.

4. A charge injection type light emitting element as claimed in claim 1, wherein a band gap of said semiconductor is higher than, or equal to 2.0 eV.

5. A charge injection type light emitting element as claimed in claim 1, wherein said semiconductor is an amorphous silicon carbide film containing microcrystal (μC-SiC).

6. A charge injection type light emitting element as claimed in claim 1, wherein said semiconductor is an amorphous silicon carbide (a-SiC).

7. A charge injection type light emitting element as claimed in claim 1, wherein said semiconductor is poly crystal diamond.

8. A charge injection type light emitting element as claimed in claim 1, wherein said semiconductor is poly crystal silicon carbide (SiC).

9. A charge injection type light emitting element as claimed in claim 1, wherein said semiconductor is an organic semiconductor.

10. A charge injection type light emitting element as claimed in claim 1, wherein an epitaxial layer is formed on single crystal silicon whose resistivity is 0.0001 to 40 Ωcm, a conductivity type of said epitaxial layer being the same conductivity type as that of said single crystal silicon and resistivity of said epitaxial layer being higher than that of said single crystal silicon, and also said pn junction is formed on said epitaxial layer.

11. A charge injection type light emitting element as claimed in claim 1, wherein said porous silicon is light-annealed by irradiating light with energy higher than the band gap of said porous silicon formed by an electrochemical anodization.

12. A charge injection type light emitting element as claimed in claimed 1, wherein said porous silicon is fabricated by way of electrochemical anodization and thermally annealed.

13. A light emitting element characterized by sandwiching porous silicon with a p-type semiconductor and an n-type semiconductor.

14. A light emitting element as claimed in claim 13, wherein at least a portion of hydrogen adhered to surfaces of a plurality of holes in said porous silicon, is substituted by heavy hydrogen.

15. A light emitting element as claimed in claim 13, wherein one semiconductor is single crystal silicon, and the other semiconductor is an amorphous silicon carbide film containing micro crystal ($\mu$C-SiC).

16. A light emitting element as claimed in claim 13, wherein said semiconductor is amorphous silicon carbide (a-SiC).

17. A light emitting element as claimed in claim 13, wherein band gaps of said p-type semiconductor and said n-type semiconductor are higher than, or equal to 2.2 eV.

18. A light emitting element as claimed in claim 13, wherein both said p-type semiconductor and said n-type semiconductor are amorphous silicon carbide containing micro crystal ($\mu$C-SiC).

19. A light emitting element as claimed in claim 13, wherein both said p-type semiconductor and said n-type semiconductor are amorphous silicon carbide (a-SiC).

20. A photocoupling element including a light emitting element, a light receiving element, and optical transmission means for transmitting optical information transmitted by said light emitting element to said light receiving element on a substrate in a monolithic state, said light emitting element comprising:
a pn junction constructed of porous silicon and a semiconductor having a conductivity type different from that of said porous silicon.

21. A photocoupling element comprising: a light emitting element, a light receiving element, optical transmission means for transmitting optical information transmitted by said light emitting element to said light receiving element, which are formed on a substrate in a monolithic state, said light emitting element sandwiching porous silicon with a p-type semiconductor and an n-type semiconductor.

22. A photocoupling circuit element comprising: a light emitting element made in junction with a light receiving element in such a manner that said light emitting element is positioned opposite to said light receiving element, said light emitting element comprising:
a pn junction constructed of porous silicon and a semiconductor having a conductivity type different from that of said porous silicon.

23. A photocoupling circuit element comprising: a light emitting element made in junction with a light receiving element in such a manner that said light emitting element is positioned opposite to said light receiving element, said light emitting element sandwiching porous silicon with a p-type semiconductor and an n-type semiconductor.

24. A light transmission element comprising: a light emitting element and a switching modulation element for modulating an optical signal transmitted from said light emitting element in response to an input electric signal, said light emitting element and said modulation element being fabricated on a single crystal silicon substrate, said light emitting element comprising:
a pn junction constructed of porous silicon and a semiconductor having a conductivity type different from that of said porous silicon.

25. A light transmission element comprising: a light emitting element and a switching modulation element for modulating an optical signal transmitted from said light emitting element in response to an input electric signal, said light emitting element and said modulation element being fabricated on a single crystal silicon substrate, said light emitting element sandwiching porous silicon with a p-type semiconductor and an n-type semiconductor.

26. A light transmission element comprising of a light emitting element and a switching modulation element for modulating an optical signal transmitted from said light emitting element in response to an input electric signal, said light emitting element and said modulation element being fabricated on a single crystal silicon substrate in a monolithic state, said light emitting element comprising:
a pn junction constructed of porous silicon and a semiconductor having a conductivity type different from that of said porous silicon.

27. A light transmission element comprising of a light emitting element and a switching modulation element for modulating an optical signal transmitted from said light emitting element in response to an input electric signal, said light emitting element and said modulation element being fabricated on a single crystal silicon substrate in a monolithic state, said light emitting element sandwiching porous silicon with a p-type semiconductor and an n-type semiconductor.

28. An opto-optical converting element comprising: a light emitting element and a light receiving element integrated in a vertical direction, said light emitting element comprising:
a pn junction constructed of porous silicon and a semiconductor having a conductivity type different from that of said porous silicon.

29. An opto-optical converting element comprising: a light emitting element and a light receiving element integrated in a vertical direction, said light emitting element sandwiching porous silicon with a p-type semiconductor and an n-type semiconductor.

30. An opto-optical converting element as claimed in claim 28, wherein said light receiving element is a photodiode fabricated by employing single crystal silicon.

31. An opto-optical converting element as claimed in claim 29, wherein said light receiving element is a photodiode fabricated by employing single crystal silicon.

32. An opto-optical converting element as claimed in claim 28, wherein said light receiving element is a phototransistor formed by employing single crystal silicon.

33. An opto-optical converting element as claimed in claim 29, wherein said light receiving element is a phototransistor formed by employing single crystal silicon.

34. A display device comprising one picture element arranged by a light emitting element and a switch element for selecting the light emitting element, said light emitting element and said switch element being formed on the same single crystal silicon substrate, said light emitting element comprising:

a pn junction constructed of porous silicon and a semiconductor having a conductivity type different from that of said porous silicon.

35. A display device comprising: one picture element arranged by a light emitting element and a switch element for selecting the light emitting element, said light emitting element and said switch element being formed on the same single crystal silicon substrate, said light emitting element sandwiching porous silicon with a p-type semiconductor and an n-type semiconductor.

36. A display apparatus as claimed in claim 34, wherein both a drive circuit for driving said display device and said display device are formed on said single crystal silicon substrate in a monolithic state.

37. A display apparatus as claimed in claim 35, wherein both a drive circuit for driving said display device and said display device are formed on said single crystal silicon substrate in a monolithic state.

38. An optical apparatus comprising:

a semiconductor substrate;

a porous silicon layer formed on said substrate, having a first conductivity type;

a light emitting element containing a semiconductor layer having a second conductivity type different from said first conductivity type, and functioning as a light emitting element for emitting a light output in response to an input electric signal and for forming a pn junction with said porous silicon layer; and a semiconductor element formed on said substrate and operationally coupled to one of said input electric signal and an optical output signal.

* * * * *